(12) United States Patent
Far

(10) Patent No.: US 10,177,713 B1
(45) Date of Patent: Jan. 8, 2019

(54) ULTRA LOW POWER HIGH-PERFORMANCE AMPLIFIER

(71) Applicant: Ali Tasdighi Far, Saratoga, CA (US)

(72) Inventor: Ali Tasdighi Far, Saratoga, CA (US)

(*) Notice: Subject to any disclaimer, the term of this patent is extended or adjusted under 35 U.S.C. 154(b) by 0 days.

(21) Appl. No.: 15/451,334

(22) Filed: Mar. 6, 2017

Related U.S. Application Data

(60) Provisional application No. 62/304,373, filed on Mar. 7, 2016, provisional application No. 62/320,512, filed on Apr. 9, 2016, provisional application No. 62/415,496, filed on Oct. 13, 2016.

(51) Int. Cl.

| | |
|---|---|
| *H03F 3/04* | (2006.01) |
| *H03F 1/02* | (2006.01) |
| *H03F 3/45* | (2006.01) |
| *H03F 1/56* | (2006.01) |
| *H03F 3/30* | (2006.01) |
| *H03F 3/26* | (2006.01) |

(52) U.S. Cl.
CPC ............ *H03F 1/0244* (2013.01); *H03F 1/56* (2013.01); *H03F 3/26* (2013.01); *H03F 3/301* (2013.01); *H03F 3/45273* (2013.01); *H03F 3/45475* (2013.01); *H03F 3/45928* (2013.01); *H03F 2203/45426* (2013.01)

(58) Field of Classification Search
CPC .................................................... H03F 3/04
USPC .................................. 330/288; 323/315, 316
See application file for complete search history.

(56) References Cited

U.S. PATENT DOCUMENTS

| | | |
|---|---|---|
| 4,677,369 A | 6/1987 | Bowers et al. |
| 5,283,579 A | 2/1994 | Tasdighi et al. |
| 5,294,927 A | 3/1994 | Levinson et al. |
| 5,640,084 A | 6/1997 | Tero et al. |
| 5,668,710 A | 9/1997 | Caliboso et al. |
| 5,734,260 A | 3/1998 | Tasdighi et al. |
| 5,734,292 A | 3/1998 | Tasdighi et al. |
| 5,814,995 A | 9/1998 | Tasdighi |
| 5,923,208 A | 7/1999 | Tasdighi et al. |
| 6,005,374 A | 12/1999 | Tasdighi |
| 6,054,823 A | 4/2000 | Collings et al. |
| 6,122,284 A | 9/2000 | Tasdighi et al. |
| 6,281,743 B1 | 8/2001 | Doyle |
| 6,366,071 B1 | 4/2002 | Yu |
| 6,384,683 B1 * | 5/2002 | Lin .................... H03F 3/3028 330/255 |

(Continued)

OTHER PUBLICATIONS

Sansen, Willy M., "A CMOS Temperature-Compensated Current Reference", IEEE Journal of Solid-State Circuits, Jun. 1988,p. 821, vol. 23.

(Continued)

*Primary Examiner* — Henry Choe
(74) *Attorney, Agent, or Firm* — Roark IP

(57) ABSTRACT

Methods, circuits, and apparatuses that provide Buffer Amplifier, containing Amplifiers and Buffer Drivers, one or more of the following: ultra low power Buffer Amplifier, capable of having high gain, low noise, high speed, near rail-to-rail input-output voltage span, high sink-source current drive capability for an external load, and able to operate at low power supply voltages. Methods, circuits, and apparatuses that provide regulated cascode (RGC) current mirrors (CM) capable of operating at low power supply and having wide input-output voltage spans.

1 Claim, 32 Drawing Sheets

(56) References Cited

U.S. PATENT DOCUMENTS

| | | | |
|---|---|---|---|
| 6,489,831 | B1 | 12/2002 | Matranga |
| 6,657,480 | B2 | 12/2003 | Ochi |
| 6,885,178 | B2 | 4/2005 | Marinca |
| 7,211,993 | B2 | 5/2007 | Marinca |
| 7,612,606 | B2 | 11/2009 | Marinca |
| 2002/0093325 | A1 | 7/2002 | Ju |
| 2004/0124822 | A1 | 7/2004 | Marinca |
| 2005/0264345 | A1 | 12/2005 | Ker |
| 2005/0285666 | A1 | 12/2005 | Garlapati |
| 2006/0224662 | A1 | 9/2006 | Haiplik |
| 2007/0052473 | A1 | 3/2007 | McLeod |
| 2007/0076483 | A1 | 4/2007 | Colman |
| 2007/0132506 | A1 | 6/2007 | Fujisawa |
| 2007/0200620 | A1* | 8/2007 | Iriguchi .............. H03F 3/45183 330/9 |
| 2008/0018316 | A1 | 1/2008 | Chang |
| 2008/0278137 | A1 | 11/2008 | Harvey |
| 2009/0243711 | A1 | 10/2009 | Marinca |
| 2010/0164467 | A1 | 7/2010 | Jo |
| 2010/0225384 | A1 | 9/2010 | Hirose |
| 2010/0237926 | A1 | 9/2010 | Kikuta |
| 2011/0025666 | A1 | 2/2011 | Baek |
| 2011/0068767 | A1 | 3/2011 | Carper |
| 2011/0102049 | A1 | 5/2011 | Conte |
| 2011/0205193 | A1* | 8/2011 | Nishimura ............ H03F 3/3023 345/204 |
| 2012/0176186 | A1 | 7/2012 | Chen |
| 2015/0160680 | A1 | 6/2015 | Marinca |

OTHER PUBLICATIONS

De La Plaza, Alejandro,"Nanoampere Supply Independent Low-Voltage Current Reference", Faible Tension Faible Communication, May 2011,p. 9.

Fayomi, Christian, "Sub 1V CMOS bandage reference design techniques a survey", Analog Integrated Cir Sig Process, Feb 2010, p. 141.

Vittoz, Eric, "A Low-Voltage CMOS Bandgap Reference", IEEE Journal of Solid-State Circuits, Jun. 1979, vol. SC-14, No. 3, Feb. 2010, p. 141.

Galeano, Edgar,"A Very Low Power Area Efficient CMOS Only Bandgap Reference", Integrated Circuits and Sys Design, Aug. 2012, p. 1.

Osaki, Yuji, "A 95-nA, 523 ppm/C, .6-uW CMOS Current Reference Circuit w/ Subthreshold MOS Resistor Ladder", ASPDAC '11, Jan. 2011, p. 113.

Ueno, Ken, "A 1-uW 600-ppm/C Current Ref Circuit Consisting of Subthreshold CMOS Circuits", IEEE Transaction on Circuits, Sep. 2010, p. 681.

De Vita, "A 109 nW, 44 ppm/C CMOS Current Reference with Low Sensitivity to Process Variations", Circuits and Systems, Feb. 2007, p. 3804.

Ledesma, F., "Comparison of New and Conventional Low Voltage Current Mirrors",Circuits and Systems, Aug. 2003, p. 49-52.

Hihose, Tetsuya, "A Nano-Ampere Current Reference Circuit and Its Temperature Dependence," Proceedings of the EECIRC, Oct. 2010, p. 114.

Camarcho-Galeano, Edgar, "A 2-nW 1.1V Self-Biased Current Reference in CMOS Technology", On Circuits and Systems, Feb. 2005,p. 62.

Camarcho-Galeano, Edgar,"Temperature Performance of Sub-1V Ultra-Low Power Current Sources", Circuits and Systems, May 2008, p. 2230.

Osaki,"Nano-Ampere CMOS Current Reference with Little Temp. Dependence Using Small Offset Voltage", Proc. at 53rd IEEE Intl, Aug. 2010, p. 668.

Gallegos, S.,"A 128.7nW Neural Amplifier and Gm-C Filter for EEG, Using gm/ID Methodology..", Circuits and Systems, Aug. 2014, p. 876.

Cordova, David,"A Low-Voltage Current Reference with High Immunity to EMI", Integrated Circuits and Systems Design, Sep. 2014, p. 1-6.

Annema, Anne-Johan,"Low-Power Bandgap Heferences featuring DTMOST's", IEEE Journal of Solid-State Circuits, Jul. 1999, p. 949.

Buck, Ame, "A CMOS Bandgap Reference without Resistors", Solid-State Circuits Conference, Dec. 2000, p. 442-443.

Chouhan, Shailesh, "A moditied CMOS Nano-Power Resistorless Current Reference Circuit", Microelectronics and Electronics, Jun. 2014,p. 1.

Guiges, Fabrice, "Sub-1V Oguey's Current Reference Without Resistance", Circuits and Systems, Dec. 2006, pp. 288-291.

Guistolisi,G.,"A Low-Voltage Low Power Voltage Reference Based on Subthreshold MOSFETS", Journal of Solid-State Circuits, Jan. 2003, p. 151.

Hirose, T., "A CMOS Bandgap and Sub-Bandgap Voltage Reference Circuits for Nanowatt Power LSIs", IEEE Asian Solid-State, Nov. 2010, p. 77.

Kussener, F, "50 nA, 1V Nanowatt Resistor-Free Compact CMOS Current References", Electronics, Circuits and Systems, Dec. 2010, p. 1212.

Oguey, H., "CMOS Current Reference Without Reference", IEEE Journal of Solid-State Circuits, Jul. 1997, p. 1132, vol. 32.

Serra-Graelis, F.,"Sub-1V CMOS Proportional-to-Absolute Temp. References", Journal of Solid-State Circuits, Jan. 2003, p. 84.

Ueno,Ken,"A 300 nW,15 ppm/C,20 ppm/V CMOS Voltage Ref Circuit . . . ", Journal of Solid-State Circuits, Jun. 2009, p. 2097.

VanPetegham, Peter, "On a New CMOS Resistor Implementation for Linear Analog IC Signal Processing Applications," IEEE, Jun. 1998, p. 163-166.

Vittoz, Eric, "CMOS Analog ICs Based on Weak Inversion Operation", Journal of Solid-State Circuits, Jun. 1977, p. 224.

Wilson,G., "Novel Voltage-Controlled Grounded Resistor", Electronic Letters, Dec. 1989, pp. 1725-1726.

Huang, Zhangcai, "A CMOS Sub-1-V Nanopower Current and Voltage Ref with Leakage Compensation", Circuits and Systems, Jul. 2010, p. 4069.

Columbo, Dalton, "A CMOS 25.3 ppm/C Bandgap Voltage Ref using Self-Cascode Composite Transistor", Circuits and Systems, Apr. 2012, p. 1.

Colombo, Dalton, "A CMOS 25.3 ppm/C Banagap Voltage Ref Using Self-Cascade Composite Transistor", Circuits and Systems, Dec. 2012, p. 1.

* cited by examiner

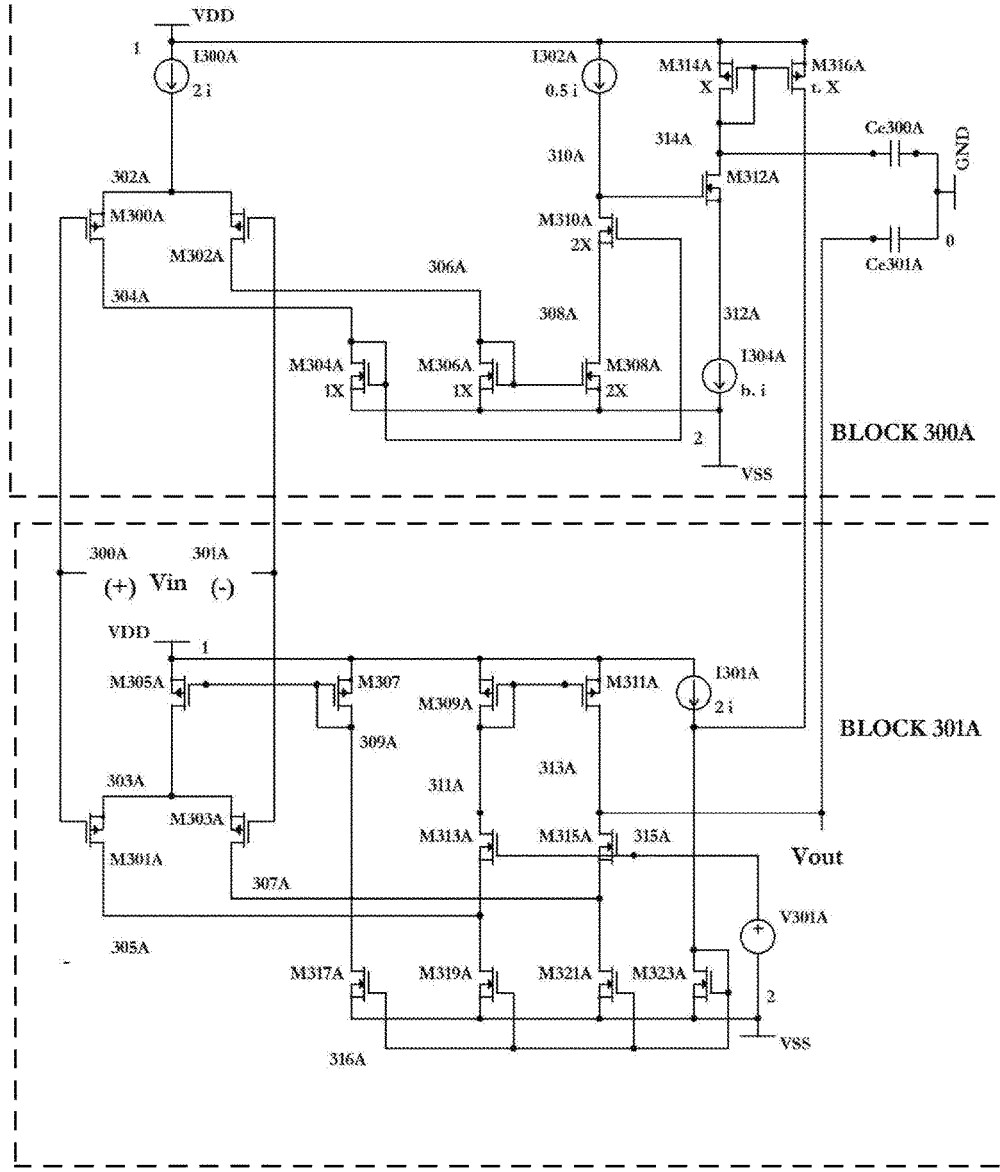

ULTRA LOW POWER HIGH-PERFORMANCE AMPLIFIER

CROSS-REFERENCE TO RELATED PATENT APPLICATIONS

This application claims the priority benefit of U.S. Provisional Patent Application Ser. No. 62/304,373, filed Mar. 7, 2016 and entitled "Class AB amplifier low power and fast"; and U.S. Provisional Patent Application Ser. No. 62/320,512 filed Apr. 9, 2016 and entitled "Class AB amplifier high gain"; and U.S. Provisional Patent Application Ser. No. 62/415,496 filed Oct. 13, 2016 and entitled "Class AB Amplifier Low Noise"; Each of the above applications are herein specifically incorporated by reference in their entirety.

FIELD OF DISCLOSURE

This disclosure related to improvements in current mirrors, current sources, amplifiers, and output buffer drives for use in integrated circuits (ICs).

BACKGROUND

Operating ICs under ultra low currents and low power supplies, in complementary metal-oxide semiconductor (CMOS) technology, pose serious challenges in the design of integrated circuits. Low operating currents cause lower speeds and lower gain and higher noise in an IC. Also, rail-to-rail operations for ICs becomes a necessity given that signal-to-noise requirements at low power supplies demand input and output terminals of ICs to get as close as possible to the power supplies.

SUMMARY OF THE DISCLOSURE

An aspect of the present disclosure is to make small and low cost current sources, current mirrors, amplifiers, buffers drivers, and buffer amplifiers that can operate with one or more of the following characteristics: (a) wide input-output voltage span, (b) low power supply voltage, (c) low power consumption, (d) low noise, (e) fast dynamic response, (f) symmetric design to minimize systematic errors, (g) use simple design that generally improves performance to specifications over operating and process variation, and/or (h) make the IC rugged for long term manufacturing using standard CMOS fabrication process that is inexpensive, and readily available at multiple fabrication factories, thus easing process node portability.

Another aspect of the disclosure includes a current mirror with high impedance, wide input-output span, and low drain voltage ($V_{DD}$VDD). Another aspect of this disclosure is to make current sources and current mirrors with high output impedance, wide input-output voltage range, and operating with low power supply voltage. This is accomplished by a method of making a 'current source' or a 'current mirror' comprising regulated cascode current mirror (RGC-CM) coupled with diode connected self cascode (DCSC). This may also be accomplished by another method of making a 'current source' or a 'current mirror' comprising RGC-CM couple with inverting current mirror amplifier (ICMA). Moreover, this goal is met by another method of making a 'current source' or a 'current mirror' comprising RGC-CM coupled with a composite amplifier (CSGA) that contains common source amplifier (CSA) and common gate amplifier (CGA) with the gate of CGA connected to source of CSA.

Another aspect of the disclosure further includes an amplifier using the disclosed current mirrors discussed above to make amplifiers with high gain and wide input-output range, and operating with low power supply voltage. This is accomplished by a method of making an 'amplifier' comprising plurality of the disclosed RGC-CM couple with DCSC. This may also be accomplished by another method of making an 'amplifier' comprising plurality of the disclosed RGC-CM coupled with ICMA. Moreover, this goal is also met by method of making an 'amplifier' utilizing plurality of the disclosed RGC-CM coupled with a composite amplifier (CSGA).

Another aspect of the disclosure further includes a floating current source with low $V_{DD}$VDD that also operates fast. Another aspect of this disclosure is to emulate the function of a floating current sources (FCS) that equalizes upper and lower current sources and is capable of operating with low power supply voltages. This may be accomplished by a method utilizing cascoded PMOSFETs (e.g., one PMOSFET on top and second PMOSFET in the middle), and cascoded NMOSFETs (e.g., one NMOSFET on top and second NMOSFET in the middle). The middle PMOSFET and the middle NMOSFET drain and source currents are criss-crossed and fed to one another. A lower regulating circuit holds the VGS of the middle NMOSFET constant by regulating the gate voltage of the lower NMOSFET. An upper regulating circuit holds the VGS of the middle PMOSFET constant by regulating the gate voltage of the upper PMOSFET. As a result the net sum of current in the upper PMOSFET and lower NMOSFET is equalized.

A further aspect of this disclosure is an amplifier using the disclosed FCS so that the amplifier's upper and lower current sources are equalized in order to improve amplifier's performance. Some of such improvements are in reducing the amplifier's offsets due to current asymmetries when the amplifier's input has a wide common mode span, while enabling the amplifier to operate with low power supply voltage.

A further aspect of this disclosure is reducing an amplifier's output noise, when the amplifier consumes low currents, operates at low $V_{DD}$VDD, while the amplifier has wide input-output voltage span, and it is fast. Another aspect of this disclosure is to reduce an amplifier's noise by narrow banding it. When the amplifier's inputs are imbalanced in response to a large transient input signal, to make up for lost speed due to narrow-banding the amplifiers, the operating current of the amplifiers is dynamically and rapidly boosted to $I_{Peak} = h \times I_Q$ (in the current boost-on phase) where $I_Q$ is the steady state operating current of the amplifier set at low current levels to save power consumption. After the amplifier's inputs approach steady state and are near balance (not precisely equal, just roughly in balance), the amplifier's operating current is dynamically and slowly decreased (current boost-off phase) back to $I_Q$ levels. The amplifier dynamic response is improved by enhancing both the Slew Rate (SR) and the settling time ($\tau_S$) of the amplifier. In summary, to rejovinate the (narrow banded) amplifier's SR while its' inputs are imbalanced due to receiving a large-signal transient, the amplifiers' operating current receive a very fast $I_{Peak}$ pulse during the current boost-on phase. Moreover, to rejovinate the (narrow banded) amplifier's $\tau_S$ when the amplifier's inputs approach balance and amplifiers enters the boost-off phase, instead of shutting off $I_{peak}$ very fast, the amplifier's operating current starts decaying slowly (following a time constant that tracks the amplifier's AC response) from $I_{peak}$ towards $I_Q$. Accordingly, when the amplifier operating current is at $I_Q$ equilibrium or steady state, the amplifier's noise is reduced since it is narrow banded.

Another aspect of the disclosure herein is a buffer driver that operates with low $V_{DD}$VDD, has wide input output voltage span, and is fast by operating chiefly in current mode. A further aspect of this disclosure is an amplifier using the disclosed buffer driver that can operate with low $V_{DD}$, have near rail-to-rail input-outputs spans, and mostly operate in current mode which improve speed at low currents. This is accomplished by a method of making an 'amplifier' comprising plurality of minimum current selectors (MCS) or loser take all (LTA) which, directly or indirectly, monitor the sink-source currents of the buffer driver's output field effect transistors (FETs). Concurrently, a non-inverting current mirror amplifier (NICMA) or inverting current mirror amplifier (ICM) or inverting current feedback amplifiers (ICFA) would regulate the minimum stand-by currents for either the inactive sink output transistor or the inactive source output transistors. Also, in order to lower the current consumption associated with monitoring the sink source output transistor currents, a complementary non-inverting current mirror (CNICM) is utilized to (rectify) curb the sink-source signals before they are fed to the MCS or LTA.

Aspects of the embodiments disclosed herein further include that they can often be fabricated in standard digital CMOS; and embodiments have small size (e.g., for low cost and high volume applications); and the embodiments typically operate MOSFETs in subthreshold so they can operate at ultra low currents and low power supply voltages needed in particular to emerging wireless and battery less applications.

Aspects of the embodiments disclosed herein further include a method of operating an ultra low power Buffer Amplifier (BA), containing an Amplifier coupled with a Buffer Driver (BD), comprising: increasing gain and widening the input-output voltage span of the Amplifier utilizing a plurality of regulated cascode (RGC) current mirrors (RGC-CM) where each RGC-CM is made of at least one of the following three circuits: 1) a diode connected self cascode (DCSC) coupled with a common source amplifier (CSA); 2) a current mirror amplifier (CMA), inverting or non-inverting type, that contains a common source amplifier (CSA); and 3) a CSA coupled with one common gate amplifier (CGA) wherein the common gate terminal of the CGA is connected to the common source terminal of the CSA; lowering the minimum operating power supply and reducing offset of the Amplifier by utilizing a current equalizer circuit that emulates the function of a floating current source (FCS) having at least two complementary cascoded current sources made of field effect transistors (FETs), wherein middle cascoded FET's gate to source voltages (VGS) are held constant by regulating the VGS of the lower FETs, whose currents are equalized and mirrored into the Amplifier's bias network, where the lower FET's source terminals are connected to the power supplies; lowering output noise of the Amplifier, by narrow banding the Amplifier's high gain node, while concurrently rejuvenating the narrow banded Amplifier's speed by utilizing one of the following circuits: 1) minimum current select (MCS); and 2) loser take all (LTA) circuits to generate dynamically boosted operating current when the Amplifier's inputs are intermittently imbalanced; and lowering the minimum operating power supply, having near rail-to-rail input output voltage span, having high-speed, providing large sink-source current for output load, while regulating the operating current in the inactive sink-source transistor of the Buffer Amplifier (BA) by utilizing a Buffer Driver (BD) that contains at least one of the following circuits: 1) MCS; 2) LTA; 3) current mirror amplification (CMA); and 4) complementary current mirror that enable the Buffer Driver (BD) to chiefly operate and process signals in current mode.

Aspects of the embodiments disclosed herein further include a method of reducing output noise in an amplifier comprising: narrow banding the amplifier to keep the amplifier's static current consumption low; rejuvenating the dynamic response of the narrow banded amplifier by dynamically boosting the amplifier's operating current when the amplifier's inputs receive a large transient signal that cause an imbalance at the amplifier's inputs; and returning back to the steady state conditions when the amplifiers inputs are substantially equalized and shutting off the dynamic boosting of the amplifier's operating current when the amplifier's current consumption returns to low levels and the amplifier's output noise is reduced. The method further comprising: connecting a first capacitor to the high impedance or high gain node of the amplifier to narrow band the amplifier; and wherein the first capacitor can be an active or a passive capacitor that is intrinsic or extrinsic at the high impedance or high gain node of the amplifier. The method further comprising: rejuvenating the dynamic response of the narrow banded amplifier by speeding up the amplifier's slew rate and settling time upon detecting an imbalance at the amplifier's inputs by utilizing one of a: 1) a loser take all (LTA) circuit; and 2) minimum current selector (MCS) circuit; applying the output of the LTA circuit or MCS circuit to generate a 'boost on' or 'boost off' signal; using the 'boost on' signal to boost the operating current of the amplifier; and using the 'boost off' signal to return the amplifier's operating current back to the low static current at steady state condition and attaining lower output noise for the amplifier at steady state conditions. The method further comprising: using the 'boost on' signal to rapidly boost the operating current of the amplifier to increase the amplifier's slew rate (SR); using the 'boost off' signal to generate a slow declining current, with a slow decay to zero to speed up the settling time ($\tau_s$) of the amplifier; improving the dynamic response of the amplifier by optimizing both its SR and $\tau_s$; and using the 'boost off' signal to return the amplifier's operating current back to the low static current at steady state condition and attaining low output noise for the amplifier during steady state conditions.

Aspects of the embodiments disclosed herein further include a buffer driver circuit comprising: first output driver field effect transistors (FETs) having the function of sinking and sourcing currents for an external load; at least one of a minimum current selector (MCS) signal or at least one loser take call (LTA) signal having the function of monitoring and processing the sink-source currents of the first output driver FETs; at least one of a group consisting of a: 1) current mirror amplifier (CMA); 2) an inverting CMA (ICMA); and 3) non-inverting CMA (NICMA) having the function of receiving the MCS or LTA signals, and utilizing the MCS or LTA signals for regulating and controlling the current in the inactive sink-source FET; a first buffer driver that utilizes at least one MCS or LTA signals and at least one of the CMA, ICMA and NICMA; and wherein the buffer driver has the function of sinking and sourcing current for external loads and regulating a minimum operating current in the inactive sinking or sourcing FET. The circuit further comprising: one of the group consisting of: 1) a first complementary non-inverting current mirror (CNICM); and 2) a first complementary inverting current mirror (CICM) having a function of monitoring the sink-source output driver FETs current and generating rectified sink-source signals; and providing the rectified sink-source signals to the minimum current selector (MCS) or loser take call (LTA) circuits to process the sink-source output driver FETs signals. The circuit capable of being used in a first amplifier further comprising: wherein the first amplifier utilizes the first buffer driver circuit in order for the first amplifier to be coupled with the buffer driver to be capable of sinking and sourcing current for external loads and regulating a minimum operating current in the inactive sinking or sourcing FET.

Aspects of the embodiments disclosed herein further include a method of operating at least one regulated cascode (RGC) current mirror (RGC-CM) comprising: supplying voltage to the at least one RGC-CM from a positive supply voltage ($V_{DD}$) and a negative supply voltage ($V_{SS}$); increasing the output resistance of the at least one RGC-CM by a first auxiliary amplifier; and widening the voltage span of the input-output terminals of the at least one RGC-CM by generating a direct current (DC) voltage shift from at least one diode connected self cascode (DCSC) coupled to the first auxiliary amplifier. The method further comprising: utilizing a first amplifier that contains a plurality of RGC-CMs, wherein each of the plurality of RGC-CMs are utilized in the first amplifier to function as current mirrors; delivering power to the first amplifier by a positive supply voltage ($V_{DD}$) and a negative supply voltage ($V_{SS}$); increasing the gain of the first amplifier by utilizing the plurality of RGC-CMs; and widening the input-output span of the first amplifier by utilizing the plurality of RGC-CMs.

Aspects of the embodiments disclosed herein further include at least one regulated cascode (RGC) current mirror (RGC-CM) circuit comprising: cascoded transistors having a first transistor placed in series at a first node with a second transistor wherein the output of the RGC-CM is the drain terminal of the second transistor; a first diode connected self cascode (DCSC) having a diode connected third transistor in series with a fourth transistor, wherein the gate terminals of the third transistor and the fourth transistor are connected together and wherein the source of the third transistor is connected to the drain of the fourth transistor at the second node, wherein the source of the fourth transistor is connected to the first node; and a first auxiliary amplifier (AA) whose input is connected to the second node, and wherein the output of the first AA is connected to the gate terminal of the second transistor. The circuit utilized in a first amplifier further comprising: a plurality of the at least one regulated cascode (RGC) current mirrors (RGC-CMs); wherein each of the plurality of RGC-CMs function as current mirrors; wherein the gain of the first amplifier is increased by utilizing the plurality RGC-CMs; and wherein the input-output span of the first amplifier is widened by utilizing the plurality of RGC-CMs.

Aspects of the embodiments disclosed herein further include a method to operate a regulated cascode (RGC) current mirror (RGC-CM) comprising: providing power to the RGC-CM by a positive supply voltage ($V_{DD}$) and a negative supply voltage ($V_{SS}$); operating input and output signals in a current mode by utilizing a first inverting current mode amplifier (ICMA) that includes a first inverting current mirror (ICM); generating amplification through the first ICMA to perform the function of a first auxiliary amplifier (AA); increasing the output resistance of the RGC-CM by utilizing the first ICMA; and widening the input-output terminal spans of the RGC-CM by utilizing the first ICMA. The method of comprising: utilizing a first amplifier having a plurality of regulated cascode (RGC) current mirrors (RGC-CMs) wherein each of the plurality of RGC-CMs are utilized in the first amplifier function as current mirrors.

A regulated cascode (RGC) current mirror (RGC-CM) circuit comprising: cascoded transistors having a first transistor placed in series at a first node with a second transistor wherein the output of the RGC-CM is the drain terminal of the second transistor; a first current mirror (CM) with a diode connected third transistor and a fourth transistor; a first current mirror amplifier (CMA) having the first current mirror, and a third transistor whose source terminal, which is the input of CMA, is connected to the first node and its drain terminal is connected to the gate and drain terminals of the third transistor; wherein the output of CMA, which is the drain terminal of the fourth transistor, is connected to the gate terminal of second transistor; and wherein the CMA functions as the auxiliary amplifier for the RGC-CM in order to increase the output resistance of the RGC-CM. The circuit used in a first amplifier further comprising: wherein each of the plurality of RGC-CMs that are utilized in the first amplifier function as current mirrors; wherein the gain of the first amplifier is increased by utilizing the plurality RGC-CMs; and wherein the input-output span of the first amplifier is widened by utilizing the plurality of RGC-CM.

Aspects of the embodiments disclosed herein further include a regulated cascode (RGC) current mirror (RGC-CM) circuit comprising: cascoded transistors having a first transistor placed in series at a first node with a second transistor wherein the output of the RGC-CM is the drain terminal of the second transistor; a first common source amplifier (CSA); a first common gate amplifier (GGA); wherein the inputs of the first CSA are connected to the source terminal of the first transistor and the first node; wherein the output of the first CSA is connected to the input of the first CGA; wherein the common gate terminal of the first CGA is connected to the common source terminal of the first CSA; and wherein the first CGA's output terminal is connected to the gate of the second transistor. The circuit used in a first amplifier further comprising: a plurality of regulated cascode (RGC) current mirrors (RGC-CMs); and wherein each of the plurality of RGC-CMs that are utilized in the first amplifier function as current mirrors; wherein the gain of the first amplifier is increased by utilizing the plurality RGC-CMs; and wherein the input-output span of the first amplifier is widened by utilizing the plurality of RGC-CM.

Aspects of the embodiments disclosed herein further include a regulated cascode (RGC) current mirror (RGC-CM) circuit comprising: cascoded transistors having a first transistor placed in series at a first node with a second transistor wherein the output of the RGC-CM is the drain terminal of the second transistor; a first common source amplifier (CSA), with a built in offset, having a third transistor and a fourth transistor, whose source terminals are connected to the second node, wherein the gate of the third transistor which is one of the inputs of CSA is connected to the first node, wherein the other terminal of the CSA, which is the gate and drain terminals of the fourth transistor are connected together and are connected to the source terminal of the first transistor; and a first common gate amplifier (CGA), comprising a fifth transistor whose gate terminal is connected to the second node, where the input of the CGA which is the source terminal of is connected to the first node, and the output of the CGA which is the drain terminal of the fifth transistor is connected to the gate terminal of the second transistor. The circuit used in a first amplifier, further comprising: a plurality of regulated cascode (RGC) current mirrors (RGC-CMs), wherein each of the plurality of RGC-CMs that are utilized in the first amplifier function as current mirrors; wherein the gain of the first amplifier is increased by utilizing the plurality RGC-CMs; and wherein the input-output span of the first amplifier is widened by utilizing the plurality of RGC-CMs.

Aspects of the embodiments disclosed herein further include a current equalizing circuit comprising: a positive supply voltage ($V_{DD}$) and a negative supply voltage ($V_{SS}$); a first Positive Metal Oxide Silicon Field Effect Transistor (PMOSFET) and second PMOSFET forming a cascoded current source, wherein the drain of the first PMOSFET is connected to the source of the second PMOSFET at the first node; a first Negative Metal Oxide Silicon Field Effect Transistor (NMOSFET) and second NMOSFET forming a cascoded current source, wherein the drain of the first NMOSFET is connected to the source of the second NMOSFET at the second node; wherein the second PMOSFET drain terminal is connected to the source terminal of and second NMOSFET at the second node; wherein the second NMOSFET drain terminal is connected to the source terminal of and second PMOSFET at the first node; wherein a first regulating circuit keeps the gate-to-source voltage of the second PMOSFET substantially constant by regulating the gate-to-source voltage of the first PMOSFET; wherein a second regulating circuit keeps the gate-to-source voltage of the second NMOSFET substantially constant by regulating the gate-to-source voltage of the first NMOSFET; and wherein the current in the first PMOSFET and first NMOSFET are substantially equalized. The circuit used in a first amplifier further comprising: the first amplifier including the first current equalizing circuit of claim 22.

Aspects of the embodiments disclosed herein further include a current equalizing method comprising: delivering power to the current equalizer by a positive supply voltage ($V_{DD}$) and a negative supply voltage ($V_{SS}$); lowering the minimum operating power supply and reducing offset of the Amplifier (A) by utilizing a current equalizer circuit that emulates the function of a floating current source (FCS) containing two complementary cascode current sources, wherein the cascoded field effect transistors (FETs) gate to source voltages (VGS) are held constant by regulating the VGS of the lower FETs, whose currents are equalized and mirrored into the amplifier's bias network, and whose source terminals are connected to the power supplies.

BRIEF DESCRIPTION OF THE DRAWINGS

FIG. 3A is a schematic circuit diagram of the embodiment illustrating an amplifier utilizing a first noise reduction and speed boost circuit.

DETAILED DESCRIPTION

Definitions, Acronyms and Abbreviations

Figure 1A:
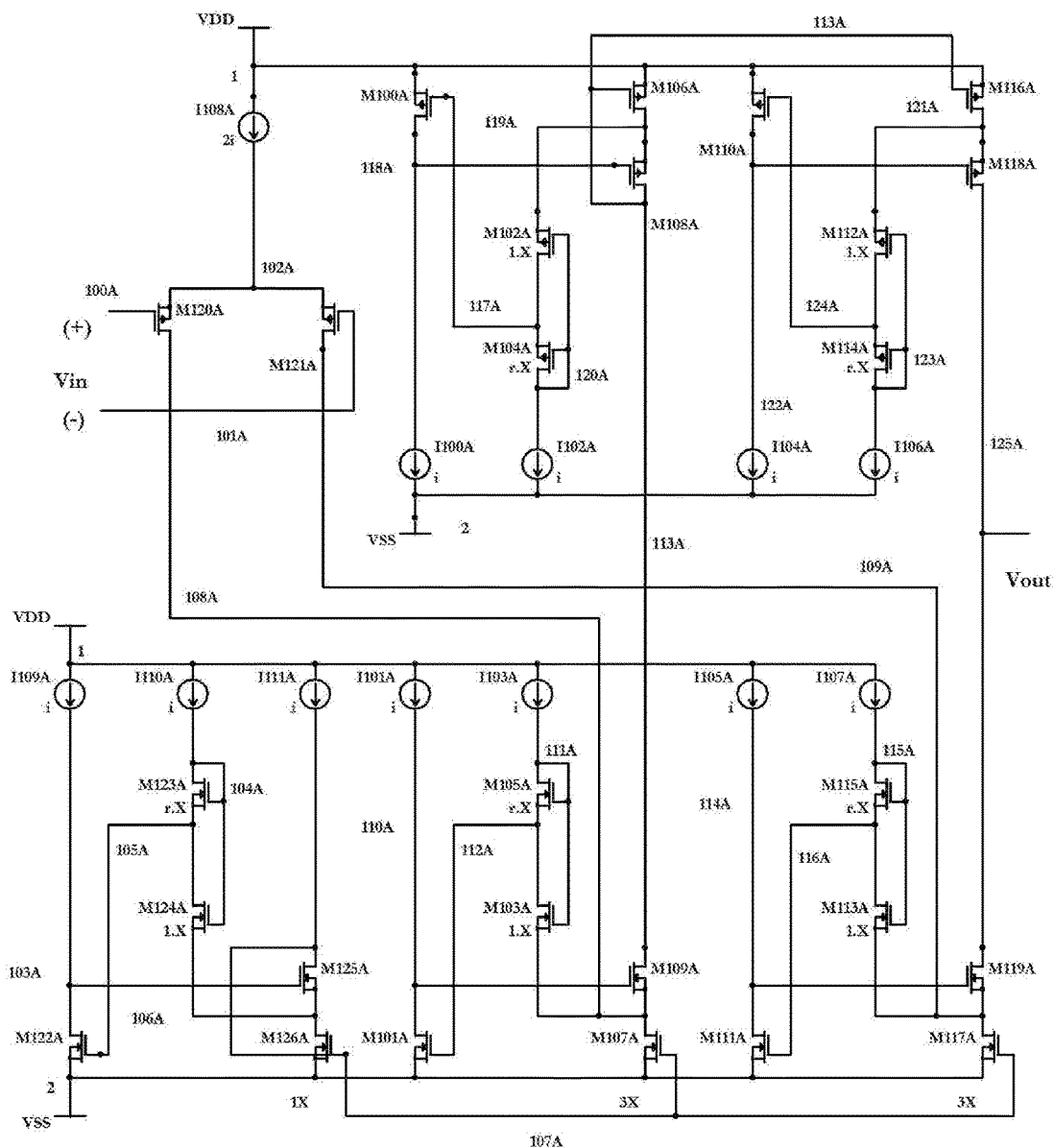
FIG. 1A is a schematic circuit diagram of the embodiment illustrating an amplifier utilizing FIG. 1B.

The following terms, definitions, acronyms, term usages and abbreviations are explained below and used throughout this application:

| TERMS | DESCRIPTION |
|---|---|
| IC or chips | Integrated circuits |
| Amplifier | Has high input and high output impedance and the amplifier amplifies signals applied to it its input, unless otherwise specified |
| buffer driver | Has high input impedance and low output impedance with high current drive capability so the buffer driver can sink and source currents for an external load, unless otherwise specified |
| buffer amplifier | Includes an amplifier coupled with a buffer driver, combination of which can amplify signals applied to the buffer amplifier inputs. Buffer amplifier has high input impedance, and low output impedance with high output current drive capability so it can sink and source currents for an external load, unless otherwise specified |
| $V_{DD}$ or positive rail | Positive power supply voltage |
| $V_{SS}$ or negative rail | Negative power supply voltage |
| Rail-to-rail input and output | Input and output terminals spanning (substantially near) to $V_{DD}$ and $V_{SS}$ |
| GND | ground voltage, which can be the same as $V_{SS}$ |
| $V_{IN}$ | Input voltage containing the negative terminal $V_{IN-}$ and the positive terminal $V_{IN-}$ |
| $VIN_{CM}$ | Common mode input voltage |
| $V_{OUT}$ | output voltage |
| Bias current or reference current or current source | Used interchangeably |
| $I_{DD}$ | Current flowing through $V_{DD}$ or current consumption |
| FET | Field Effect Transistors |
| JFET | Junction Field Effect Transistors |
| BJT | Bipolar Junction Transistors |
| CMOS | Complementary Metal Oxide Semiconductor (may be operated in subthreshold or normal regions) |
| BiCMOS | BJT and CMOS transistors fabricated on the same wafer |
| MOSFET | Metal Oxide Semiconductor Field Effect Transistors (may be operated in subthreshold or normal regions) |
| MOSFET's linear or triode or resistive regions of operations | Used interchangeably |
| Subthreshold | MOSFET's Subthreshold region of operation |
| CMOS, PMOS, and NMOS or CMOSFET. PMOSFET, and NMOSFET, respectively | Used interchangeably |
| Gate, source, and drain or gate terminals, source terrninal, and drain terminals respectively | Used interchangeably |
| W/L of a MOSFET | Width over length ratio (aspect ratio) of MOSFETs |
| W/L of a MOSFET or aspect ratios | Used interchangeably |
| Ohms per square or Ω/square | Resistivity of material per square area |
| Terms applied to the W/L of MOSFETs such as 'predetermined' versus 'programmed' versus 'set' | Used interchangeably |
| C or ° C. | Used interchangeably and shows unit of temperature in Celsius |
| Ω | Ohms, unit of measurement for resistivity |
| A | Ampere |
| V | Volt |
| Mm | Micro-meter or $10^{-6}$ meter (e.g., W = 4 μm or W = 4 × $10^{-6}$ meter |
| N | Nano or $10^{-9}$ (e.g., nA = nano ampere or $10^{-9}$A) |
| P | Pico or $10^{-12}$(e.g., pF = pico Farad or $10^{-12}$F |

-continued

| TERMS | DESCRIPTION |
|---|---|
| M | MOSFET carrier mobility |
| $V_T$ | Thermal voltage |
| $C_{OX}$ | Gate oxide capacitance of a MOSFET |
| $C_e$ | Effective capacitance |
| $Ce_{MXXXX}$ | Effective input gate terminal capacitance of a MOSFET (e.g., $Ce_{M316A}$ is the effective capacitance looking into the gate of FET $M_{316A}$) |
| $Ce_{xxxx}$ | Effective capacitance at node xxxx (e.g., $Ce_{314A}$ is the effective capacitance at node 314A) |
| $V_{TH}$ | Threshold voltage of a MOSFET |
| $V_A$ or $1/\lambda$ | Used interchangeably to show MOSFET early voltage |
| $\beta$ | Beta = $\beta = \mu \times C_{OX}$ to show a MOSFET gain |
| M | To show MOSFET mobility exponent factor used in device equations |
| H | To show MOSFET subthreshold slope factor used in device equations |
| $V_{OFS}$ | Offset voltage between two MOSFETs, mostly referring to a CMOS amplifier's input offset voltage |
| $V_{xxxx}$ | Voltage at node xxxx (e.g., $V_{108A}$ is the voltage at node 108A) |
| $V_{DS}$ or $VDS_{sat}$ or $V_{on}$ | Used interchangeably is the drain terminal voltage to source terminal voltage of a MOSFET, including in the saturation region |
| $V_{GS}$ | Gate terminal voltage to source terminal voltage of a MOSFET |
| $VG_{Mxxx}$ | Voltage at the gate terminal of a MOSFET (e.g., $VG_{M128D}$ is the voltage at the gate terminal of $M_{128D}$) |
| $VD_{Mxxxx}$ | Voltage at the drain terminal of a MOSFET (e.g., $VD_{M128D}$ is the voltage at the drain terminal of $M_{128D}$) |
| $VS_{Mxxxx}$ | Voltage at the source terminal of a MOSFET (e.g., $VS_{M128D}$ is the voltage at the source terminal of $M_{128D}$) |
| $VGS_{Mxxxx}$ | Gate to source voltage of a MOSFET $M_{xxxx}$ (e.g., $VGS_{M128D}$ is $V_{GS}$ of $M_{128D}$) |
| $VDS_{Mxxxx}$ | Drain to source voltage of a MOSFET $M_{xxxx}$ (e.g., $VDS_{M128D}$ is $V_{DS}$ of $M_{128D}$) |
| $\Delta V_{GS}$ | Difference between the gate to source voltage of two MOSFETs |
| $\Delta v_O$ or $\Delta V_{OUT}$ | Change in an output voltage of a function (e.g., amplifier's output or current mirror's output) |
| $\Delta v_X$ | Small change in a voltage |
| $\Delta i_X$ | Small change in a current |
| $I_{DS}$ or $I_D$ or $ID_{Mxxxx}$ or $I_{Mxxx}$ | Used interchangeably and it is the drain to source current of a MOSFET (e.g., $I_{M117D}$ is $I_{DS}$ of $M_{117D}$) |
| $I_{xxxx}$ | It is a current source (e.g., $I_{107B}$ is the current source #107B) |
| $g_m$ or $gm_{MOSFET}$ | To show transconductance of MOSFET where $g_m \approx I_D/V_T$ for MOSFET operating in subthreshold (ignoring second order effects, such as $\eta$ or $V_{TH}$ or $V_A$ for clarity of description) |
| $r_O$ or $r_{ds}$ | Output resistance of MOSFET or $\propto V_A/I_D$ for MOSFET operating in subthreshold |
| $R_{OUT}$ or $R_O$ | Used interchangeably and shows the output resistance of a function such as that of a current source, current mirror, transconductance amplifier, or an auxiliary amplifier |
| $Ze_{xxxx}$ | Effective impedance or effective resistance at node xxxx (e.g., $Ze_{314A}$ is the effective impedance at node 314A) |
| TC | Temperature coefficient |
| AC response | Small signal frequency output versus input response of a circuit |
| $A_V$ | Main amplifier's open loop gain at DC |
| $F_U$ | Unity gain frequency of amplifier (stated in Hz = Hertz) |
| $P_M$ | Phase margin of amplifier at $F_U$ (stated in ° = degrees) |
| SR | Slew rate of amplifier (stated in V/µS or volts per micro seconds) |
| $t_S$ | Settling time of amplifier's $V_{OUT}$ to 5% of steady state (stated in µS = micro seconds) |
| PSRR | Power supply rejection ratio of amplifier |
| 'a' through 'z' | To show the ratio of MOSFET W/Ls or their aspect ratios used in a circuit design |
| $\sim$ or $\approx$ | Approximately equal |
| << | Significantly less than (e.g., $ID_{M304} << 2i$ Means $ID_{M304}$ is significantly less than $2i$ and $ID_{M304}$ can be zero or substantially close to it |
| $\approx$ | Approximately equal |
| $\propto$ | As a function of or proportional to |
| $\Rightarrow$ or $\rightarrow$ | Implication, results |

-continued

| TERMS | DESCRIPTION |
|---|---|
| SC | MOSFET self-cascode |
| DCSC or DCS$_{xxxx}$ | MOSFET diode connected self cascode or DCSC number xxxx |
| RGC or RGC$_{xxxx}$ | Regulated Cascode or RGC number xxxx |
| CM or CM$_{xxxx}$ | current mirror or CM number xxxx |
| RGC-CM or RGC – CM$_{xxxx}$ | Regulated Cascode current mirror or RGC-CM number xxx |
| RGC-CS | Regulated Cascode current source |
| RGC or RGC-CM or RGC-CS | Used interchangeably, unless otherwise noted |
| A$_{xxxx}$ | Amplifier used in a regulating circuit (e.g., A$_{P200C}$ is an amplifier number P200C with PMOSFET inputs) |
| A$_{AUX}$ or AA | Auxiliary amplifier used for example in regulate cascode current mirror (RGC-CM) |
| MCS or MCS$_{xxxx}$ | Minimum current selector or MCS number xxxx |
| Buffer or Buffer Driver or BUF$_{xxxx}$ | Used interchangeably for buffer driver or BUF number xxxx |
| Min (M$_{Mxxxx}$, ID$_{Myyyy}$) | Selecting minimum of 2 FET currents (e.g. when ID$_{M412D}$ < ID$_{M414D}$ then Min (ID$_{M412D}$, ID$_{M414D}$) = ID$_{M412D}$ |
| LTA or LTA$_{xxxx}$ | Loser take all or LTA number xxxx |
| LTA (ID$_{xxxx}$, ID$_{yyyy}$) | Similar to MCS, the loser of 2 FET currents takes all (e.g. when ID$_{M412D}$ < ID$_{M414D}$ then LTA (ID$_{M412D}$, ID$_{M414D}$) = ID$_{M412D}$ |
| WTA or WTA$_{xxxx}$ | Winner take all |
| LTAA or LTAA$_{xxxx}$ | Loser take all amplifier or LTAA number xxxx |
| ICM or ICM$_{xxxx}$ | Inverting current mirror or ICM number xxxx |
| NICM or NICM$_{xxxx}$ | Non-Inverting current mirror or NICM number xxxx |
| ICMA or ICMA$_{xxxx}$ | Inverting current mirror amplifier or ICMA number xxxx |
| NICMA or NICMA$_{xxxx}$ | Non-Inverting current mirror amplifier or NICMA number xxxx |
| FCTA | Folded cascode transconductance amplifier |
| FCTA, or folded cascode amplifier, or cascode amplifier, or transconductance amplifier | Used interchangeably |
| FCS or FCS$_{xxxx}$ | Floating current source or FCS number xxxx |
| CSA or CSA$_{xxxx}$ | Common source amplifier or CSA number xxx |
| CGA or CSA$_{xxxx}$ | Common gate amplifier or CSA number xxxx |
| KCL | Kirchhoff's Current Law |
| KVL | Kirchhoff's Voltage Law |

Numerous embodiments are described in the present application and are presented for illustrative purposes only and is not intended to be exhaustive. The embodiments were chosen and described to explain principles of operation and their practical applications. The present disclosure is not a literal description of all embodiments of the disclosure(s). The described embodiments also are not, and are not intended to be, limiting in any sense. One of ordinary skill in the art will recognize that the disclosed embodiment(s) may be practiced with various modifications and alterations, such as structural, logical, and electrical modifications. For example, the present disclosure is not a listing of features which must necessarily be present in all embodiments. On the contrary, a variety of components are described to illustrate the wide variety of possible embodiments of the present disclosure(s). Although particular features of the disclosed embodiments may be described with reference to one or more particular embodiments and/or drawings, it should be understood that such features are not limited to usage in the one or more particular embodiments or drawings with reference to which they are described, unless expressly specified otherwise. The scope of the disclosure is to be defined by the claims.

Although process (or method) steps may be described or claimed in a particular sequential order, such processes may be configured to work in different orders. In other words, any sequence or order of steps that may be explicitly described or claimed does not necessarily indicate a requirement that the steps be performed in that order. The steps of processes described herein may be performed in any order possible. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to the embodiment(s). In addition, although a process may be described as including a plurality of steps, that does not imply that all or any of the steps are essential or required. Various other embodiments within the scope of the described disclosure(s) include other processes that omit some or all of the described steps. In addition, although a circuit may be described as including a plurality of components, aspects, steps, qualities, characteristics and/or features, that does not indicate that any or all of the plurality are essential or required. Various other embodiments may include other circuit elements or limitations that omit some or all of the described plurality.

Throughout this disclosure, the body terminal of PMOS-FETs can be either connected to their respective PMOSFET source terminals or to the positive power supply, V$_{DD}$. Similarly here, the body of NMOSFETs can be either connected to their respective NMOSFET source terminal or to the negative power supply, $V_{SS}$. Moreover, the negative supply voltage, $V_{SS}$, can be alternatively connected to the ground (GND) potential. Given that one of these teaching's target application are for ultra low power and portable electronics, the transistors utilized in circuits operate under the subthreshold region, but it is also possible to operate transistors, throughout this disclosures and illustrations, in the normal regions. Throughout this disclosure and its illustrations, current sources or current mirrors may be constructed with single FETs or cascodes one, depending on cost-performance considerations such as die size, output impedance, gain, speed, head room, amongst others. Illustrations in some embodiments utilizing NMOSFET (e.g., in a current mirror or RGC-CM), can be modified to utilize their complementary FET counterparts (i.e., PMOSFETs). Moreover, embodiments utilizing amplifier's with PMOSFET input stages can also be modified to utilize NMOSFET input stages, or complementary input stage (i.e., both PMOSFET and NMOSFET operating in parallel) for rail to rail input dynamic range. Moreover, embodiments can utilize amplifiers, or their variations obvious to one skilled in the art, that use double PMOSFETs coupled with NMOSFET level shifters or double NMOSFETs coupled with PMOSFET level shifters to attain rail-to-rail input operations. The U.S. Provisional Patent Application Ser. No. 62/304,373 utilizes an amplifier's input stage based in complementary input pairs (i.e., both PMOSFET and NMOSFET operating in parallel) for rail to rail input dynamic range. The U.S. Provisional Patent Application Ser. No. 62/320,512 and the U.S. Provisional Patent Application Ser. No. 62/415,496 utilize an amplifier's input stage that are based in double PMOSFETs coupled with NMOSFET level shifters to attain input voltage rail-to-rail operations. For demonstrative clarity and simplicity, the assumption is made that $V_A$, $\beta$, $\eta$, $g_m$, $g_{ds}$, $r_{ds}$, $r_O$, and $I_D$ for PMOSFETs and NMOSFETs are substantially equal unless otherwise specified. In order to demonstrate achievable typical specifications, simulations are performed on some of the circuits illustrating the embodiments. These simulations are not intended to guarantee the embodiment performance to a particular range of specifications. Circuit simulations use the Top-Spice simulator, and are based on approximate device models for a typical standard 0.18 µm CMOS process fabrication. To simulate for sensitivity of design to device model variations (i.e., simulate for design margin), this disclosure provides some worst case simulations (WC) that subject the circuit embodiments to variations in device parameters (e.g., manufacturing process fluctuations in $V_{TH}$ and $C_{OX}$), which can indicate the circuit's design sensitivity to normal manufacturing (wafer lot-to-lot) variations. For example, WC circuit simulations illustrate variations on performance specifications such as slew rate of settling time as a function of varying $V_{TH}$ by ±10% from center value, and independently from varying $C_{OX}$ by ±5% from center value (i.e., 16 process corner combinations).

Note that the teachings in this disclosure are applicable to high voltage or high current or high speed applications, and combinations thereof, as well. The teachings in this disclosure may be applied to other manufacturing fabrication processes that contain transistors, such as fabrication processes with deep sub-micron CMOS, BiCMOS, BJT, and JFET, amongst other device and manufacturing platforms that make devices that can function as transistors.

Current mirrors, current sources, amplifier, and output buffers are building blocks for any integrated circuits (IC), including for higher order functions such as analog to digital converters (ADC), digital to analog converters (DAC), regulators, references, fitters, data acquisition systems (DAS), and other building blocks in any analog and mixed mode ICs, and system on a chip (SOC). It is advantageous for IC building blocks such as current sources, current mirrors, amplifiers, and buffer drivers to: (1) consume low currents, (2) operate with low power supply voltages, especially for portable applications, (3) have near rail-to-rail input-output spans since there is little voltage headroom to waste, especially under low power supply voltages, (4) have high output impedance or high output gain, especially under ultra low operating currents when gain is lower, (5) have high-speeds, especially under low operating currents when speed gets slower, (6) have low noise, especially under low operating currents when noise increases, (7) have their other performance specifications, such as power supply rejection and common mode rejection, amongst others, unimpeded when utilizing circuit arrangements to improve gain, speed, and noise operating under low operating currents, and low power supply voltage conditions, (8) perform to specifications over fabrication process variations, and under different power supply and temperature conditions, (9) be small so they cost less, and be able to integrate multiple building block channels on the same die for better channel-to-channel matching, (10) use standard CMOS fabrication for lower cost, availability, and proven quality.

As the demand for portable, green electronics, and energy harvesting (e.g., self-powered ICs) continues to grow, so does the requirement for circuits with lower power supplies and ultra low current consumptions. Low power electronics also require performance to specifications at low $V_{DD}$ and $V_{SS}$ where there is less available voltage headroom to process signals. Meeting low power consumption and signal-to-noise specifications at low $V_{DD}$ and $V_{SS}$ require ICs with the widest input-output dynamic range possible. Although special fabrication processes can provide special transistors that enable a circuit to operate with lower power supplies and lower current consumption, but such special manufacturing are generally expensive, and may create a high cost barrier for the full market potentials to be realized in a timely manner.

Also, low power (ultra low current and low power supply voltage combined) may be required in some medical or defense applications where it is not safe to frequently replace an implantable or embedded battery operated IC. This factor would require ultra low power so that the ICs draw extremely low current so that the battery life is significantly extended.

Another example is next generation energy harvesting electronics that is wireless and battery less. They can function perpetually without ever needing to be connected to power source and with no need of being recharged. There are sub-categories of energy harvesting ICs that can be designated as self-powered ICs. Energy harvesting is part of green electronics that rely on harvesting or scavenging energy from the environment such as solar, mechanical, thermal, or magnetic, to name a few. These kinds of energies help generate voltage potential that can for example be stored on a super capacitor, which can power ultra low power electronics for signal processing.

Additionally, some biometrics system on a chip may require small die size for applications requiring multi-channel current mirrors or amplifiers for conditioning multiple sensor's outputs simultaneously. For example, multiple sensors implanted in tooth dentures that simultaneously read levels of sugar, salt, acidity, temperature, and other nonvitals, which may require and at a minimum will benefit from small circuit size for better matching between each circuit channels in one die.

Furthermore, to target high volume markets and reduce the risk of low yields for long term production, manufacturing organizations generally have an unfavorable view of circuits that require special processes. Optimal yield and quality generally avoid circuits that require variations to a standard process, or complex circuits whose specifications may depend on multiple device or (manufacturing) process parameters. Generally circuits requiring non-standard fabrication, or complex circuits are harder to optimize for maximal production yields, or they may compromise rugged end-product manufacturing (quality) goals. It is also of note that complex circuits may hinder transient response, in start up and turn off phases, for example. This may be a risky trait, particularly in energy harvesting applications that may subject the IC to less predictable or disorderly power supply on and off patterns in the field.

Besides ultra low power, emerging applications such as energy harvesting that was noted above and bio-metrics, require small circuits to keep the costs down in order to realize their full and highest volume market potentials.

As stated earlier, current mirrors are fundamental building blocks in electronics. Some of performance specifications for a current mirrors are to have high $R_{OUT}$ and wide input-output voltage spans. Also, making current mirrors with simple circuits that are low power and low cost is beneficial to cost-performance-quality tradeoffs, including for high order other building blocks such as amplifiers, where current mirrors are utilized.

Figure 1B:
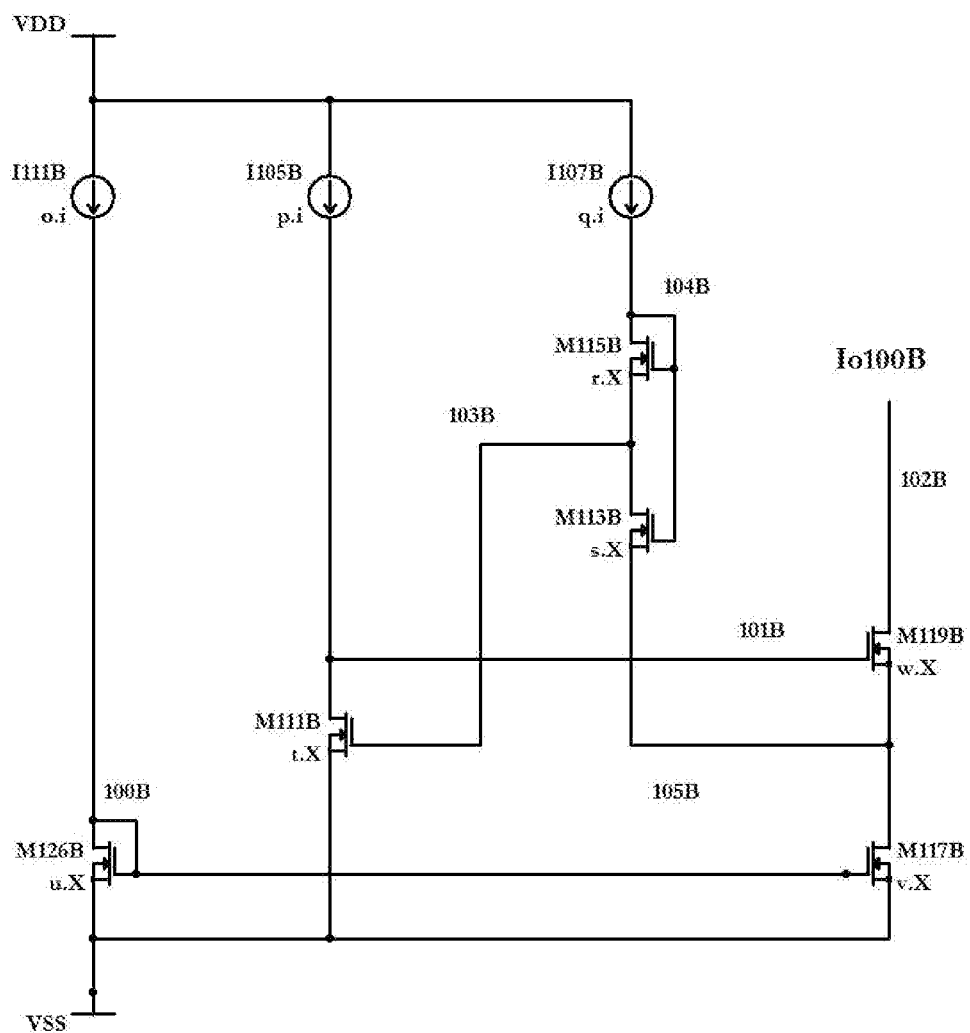
FIG. 1B is a schematic circuit diagram of the embodiment illustrating a current mirror utilizing a regulated cascode current mirror (RGC-CM) coupled with diode connected self cascode (DCSC)
Figure 1C:
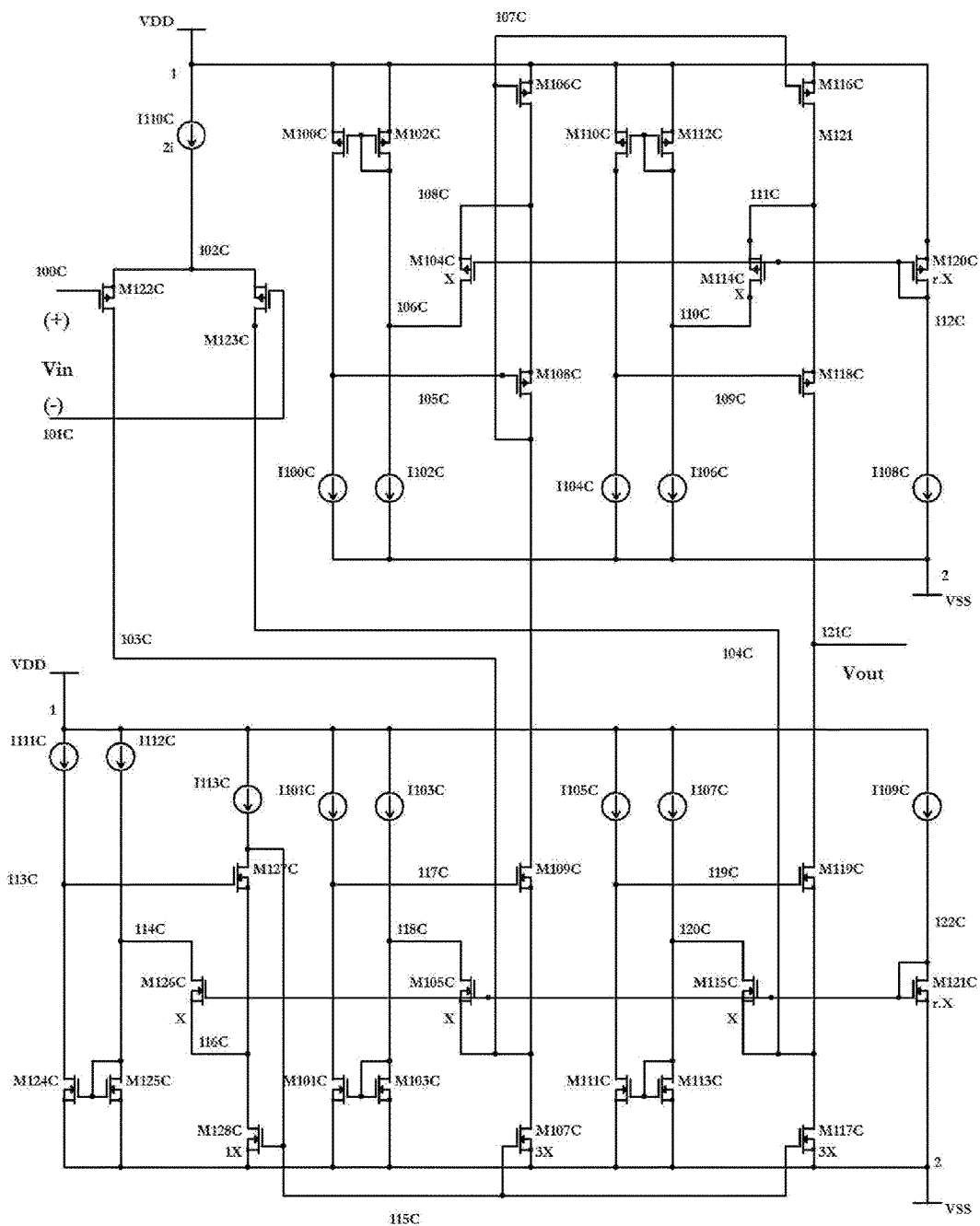
FIG. 1C is a schematic circuit diagram of the embodiment illustrating an amplifier utilizing FIG. 1D.
Figure 1D:
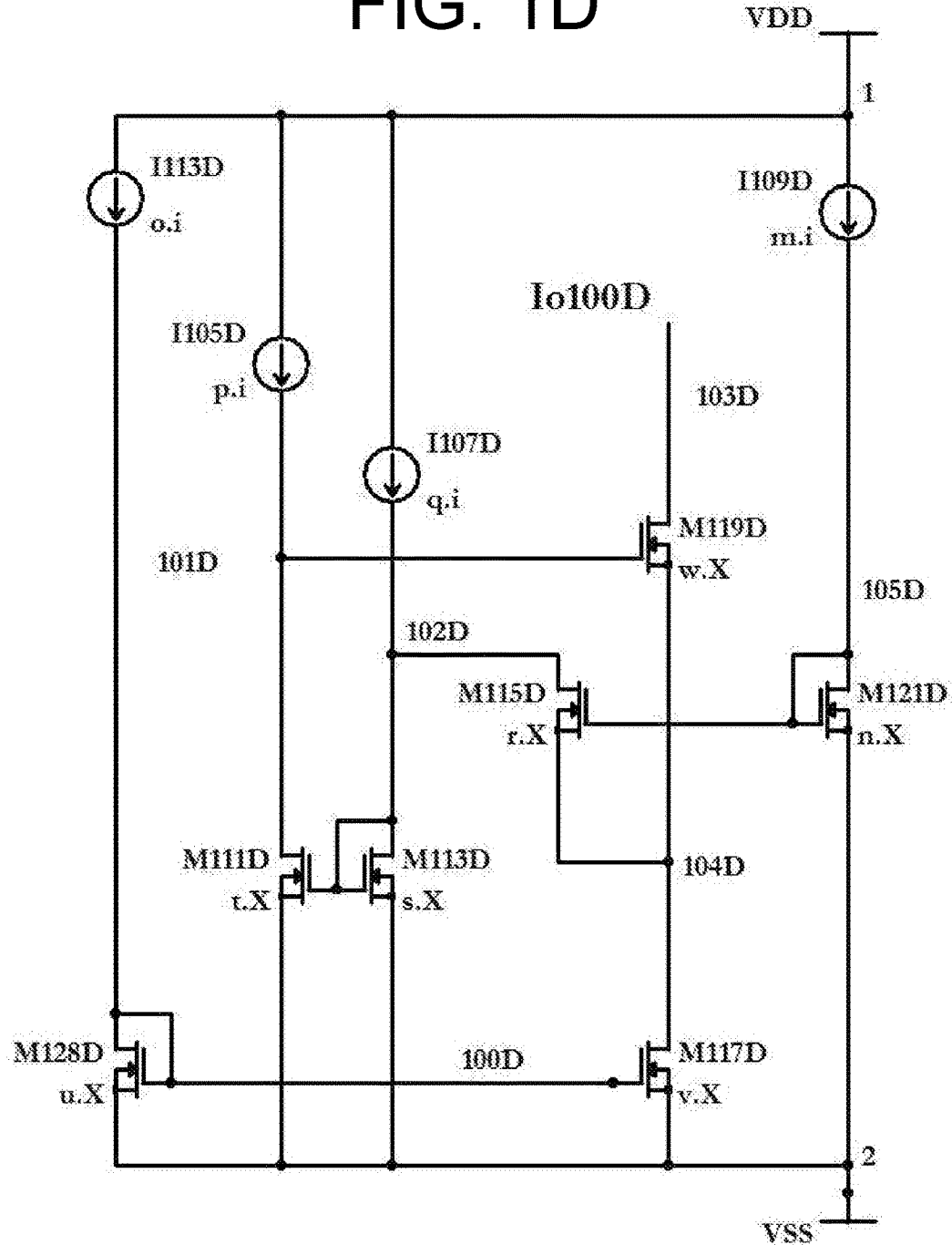
FIG. 1D is a schematic circuit diagram of the embodiment illustrating a current mirror utilizing a RGC-CM coupled with an inverting current mirror amplifier (ICMA).
Figure 1E:
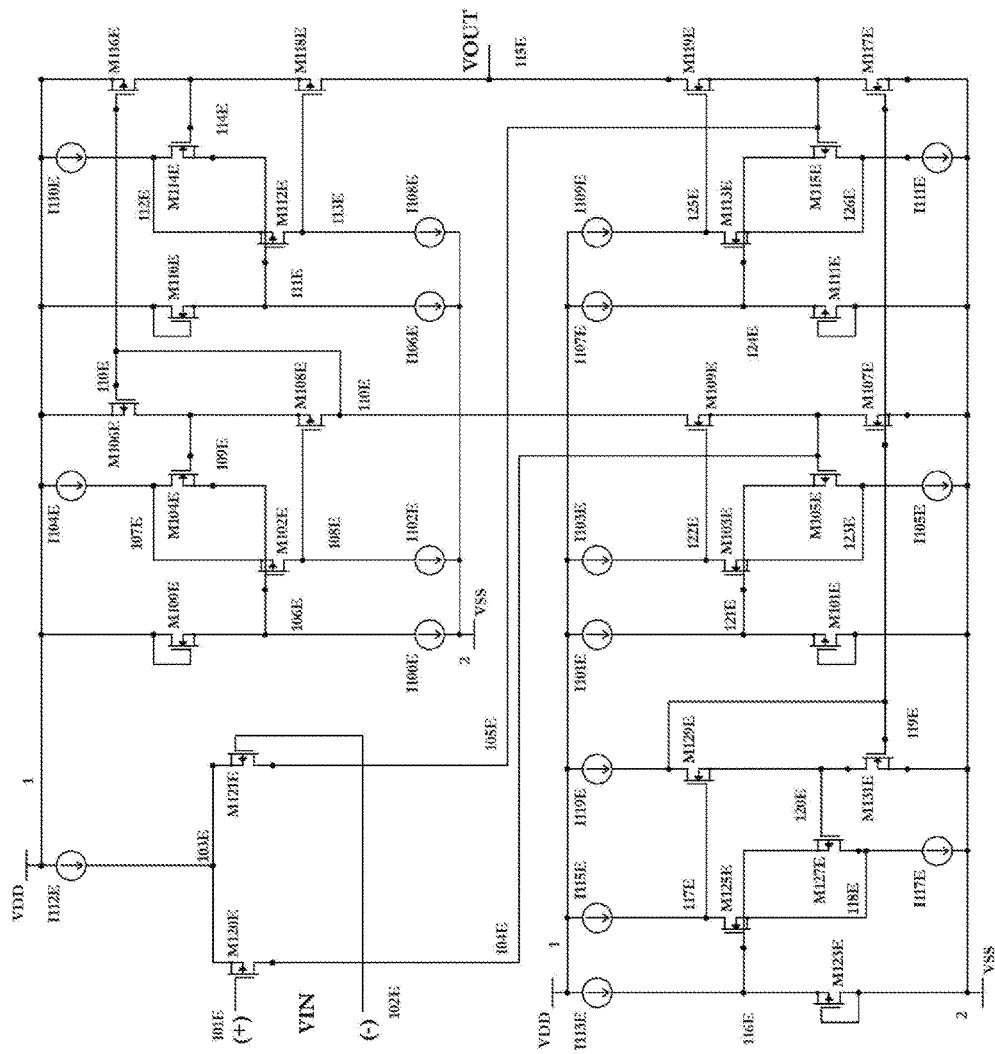
FIG. 1E is a schematic circuit diagram of the embodiment illustrating an amplifier utilizing FIG. 1F.
Figure 1F:
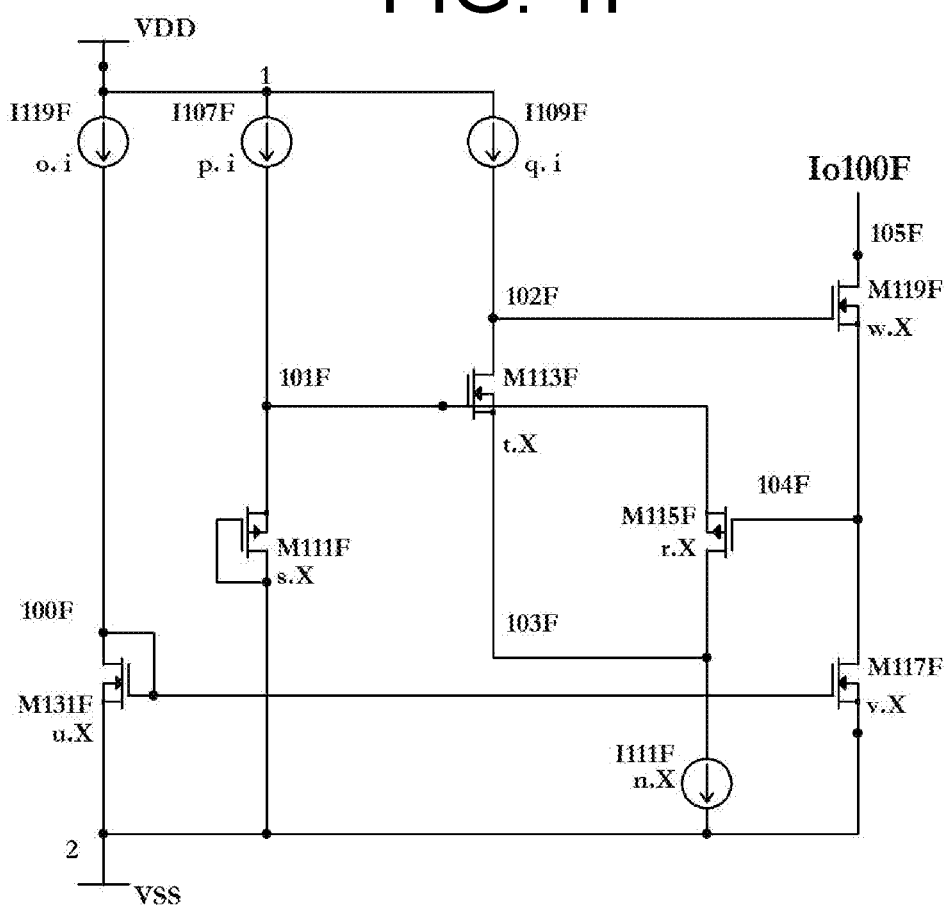
FIG. 1F is a schematic circuit diagram of the embodiment illustrating a current mirror utilizing a RGC-CM coupled with a composite amplifier (CSGA).
Figure 1G:
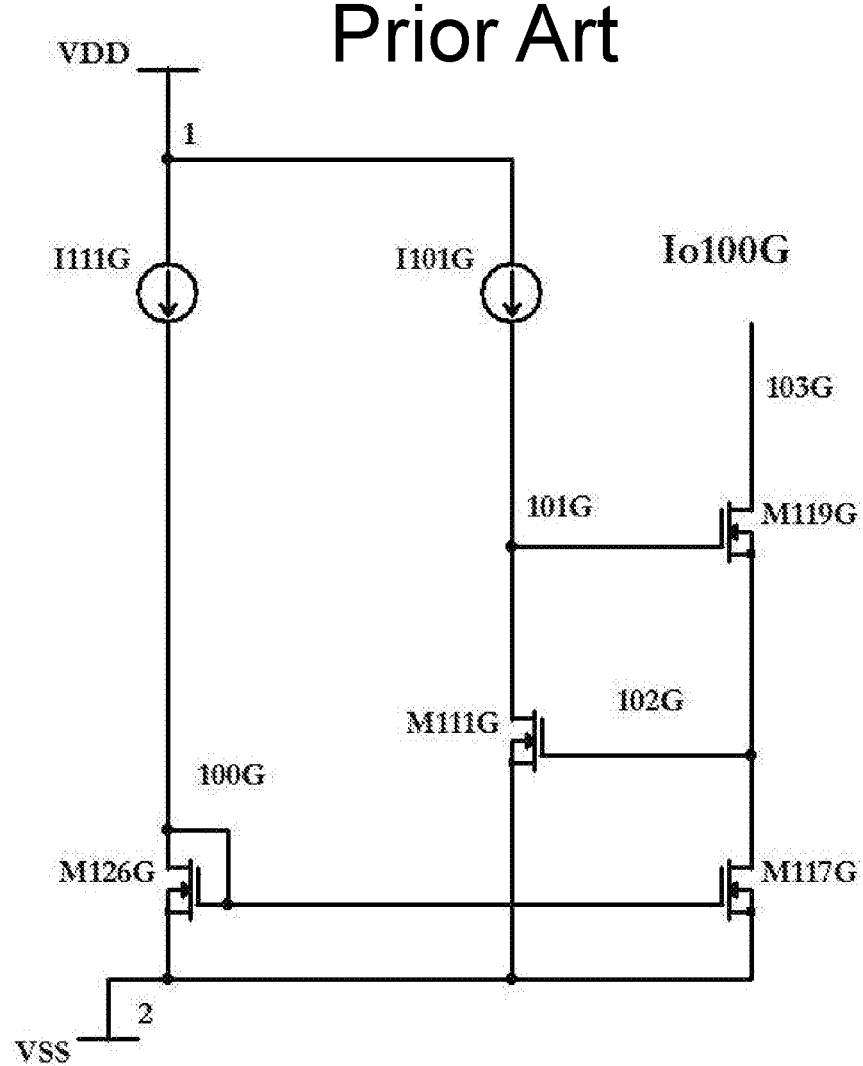
FIG. 1G is a schematic circuit diagram of an embodiment illustrating a prior art RGC-CM.

Utilizing Regulated Cascode (RGC) is a way to increase the $R_{out}$ of a current mirror. FIG. 1G is an illustration of a prior art RGC current mirror (RGC-CM), which is not complex and yet it is low cost and rugged, but its' output-output voltage span is restrictive. As depicted in FIG. 1G, the drain terminal of $M_{119G}$ is the output of the RGC-CM, where $V_{101G} = VGS_{M119G} + VGS_{M111G}$. As such, the minimum $V_{103G} \approx Von_{M119G} + VGS_{M111G}$ which restricts the voltage span of the current mirror's output.

Operating at low or ultra low operating currents, generally causes an amplifier's gain to be lower. Utilizing RGC-CM is a way to increase the gain of amplifiers, in part, by way of increasing the amplifier's $R_{OUT}$ at the amplifier's high-gain node.

Increasing an amplifier's gain, utilizing RGC-CM, without restricting its input and output voltage span, are disclosed in the literature and in the references provided, including in [S. Yan and E. Sanchez-Sinencio, "Low voltage analog circuit design: A tutorial", IEICE Trans. Analog Integrated Circuits and Systems, vol. E83A , no. 2, pp. 179-196, 2000], and [P. E. Allen & D. R. Holberg, CMOS Analog Circuit Design, 2nd Ed, Oxford University press, 2002]. Generally, the available RGC-CMs with a wide input-output voltage span have higher transistor count (i.e., larger die size), consume high power, have unfavorable transient response considering current consumption, or are complex (e.g., performance depends on different types of FETs, or performance depends on multiple device parameters) which are generally unfavorable for rugged manufacturing in terms of cost-performance-quality traits.

As noted earlier, low voltage electronics require rail-to-rail input-output operations. A folded cascode transconductance amplifier (FCTA), is a suitable amplifier topology for rail to rail operations. From a high level perspective, FCTA contains a common source amplifier (CSA) at its inputs. Then the differential current outputs of this CSA feed the differential current input of a common gate amplifier (CGA) whose differential output currents are fed onto a differential input to single output current mirror, that sum at the FCTA high impedance output node to make an output voltage ($V_{OUT}$). The regulated cascode current mirror (RGC-CM) is generally used in the CGA and current mirror sections of an amplifier to improve their $R_{OUT}$, which increase's the amplifier's gain. Moreover, its beneficial for the RGC-CM to have wide input-output voltage span in order not to restrict the amplifier's input-output voltage span, in which it is utilized. Operating the inputs of a FCTA rail to rail is generally accomplished by running pairs PMOSFET and NMOSFET (complementary) CSAs in parallel as inputs. Near the rails, either PMOS CSA runs out of headroom while the NMOS CSA takes control and keeps feeding the next CGA gain stage, or vice versa.

Figure 2A:
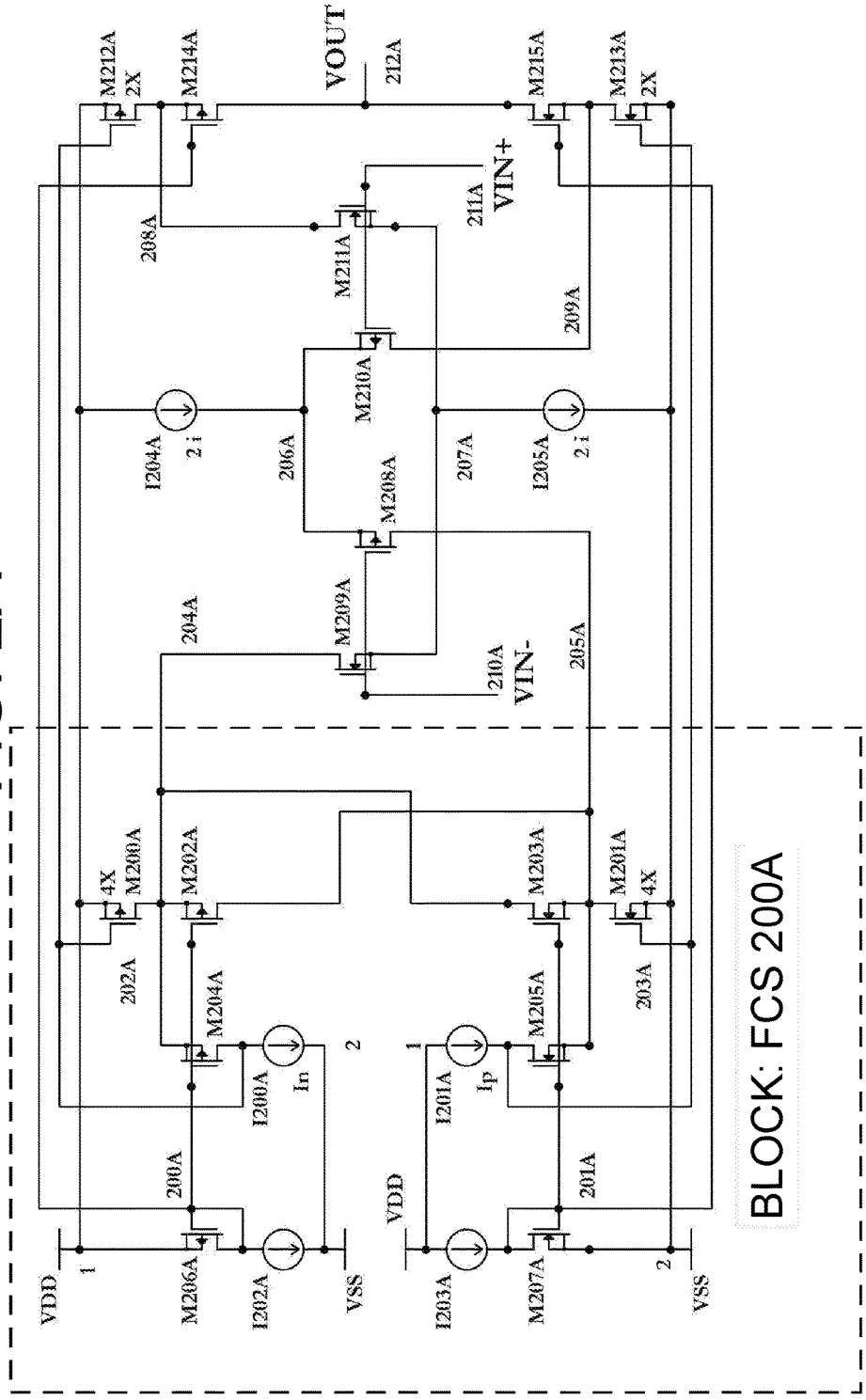
FIG. 2A is a schematic circuit diagram of the embodiment illustrating an amplifier utilizing the first floating current source (FCS200A) embodiment
Figure 2B:
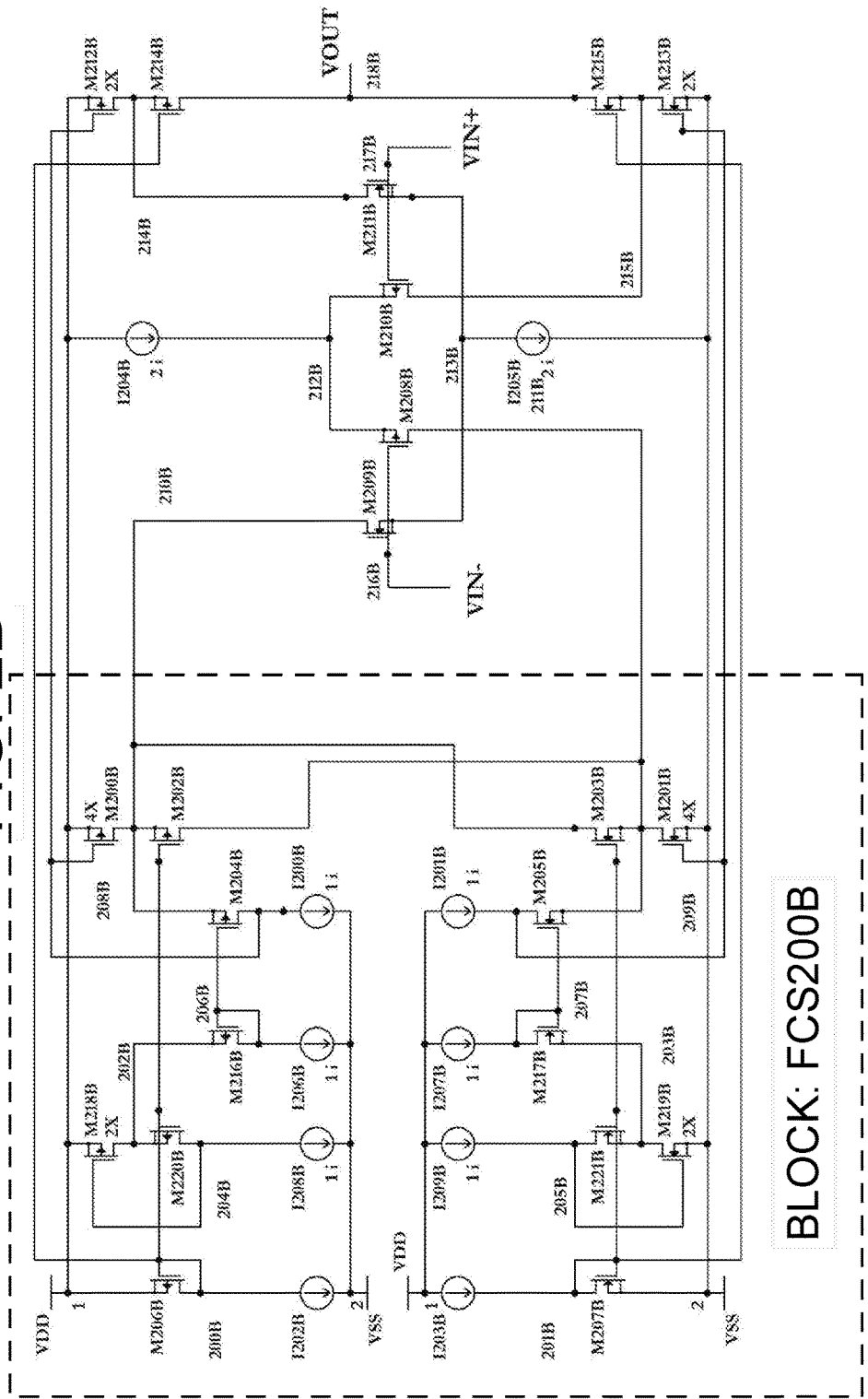
FIG. 2B is a schematic circuit diagram of the embodiment illustrating an amplifier utilizing the second floating current source (FCS200B) embodiment
Figure 2C:
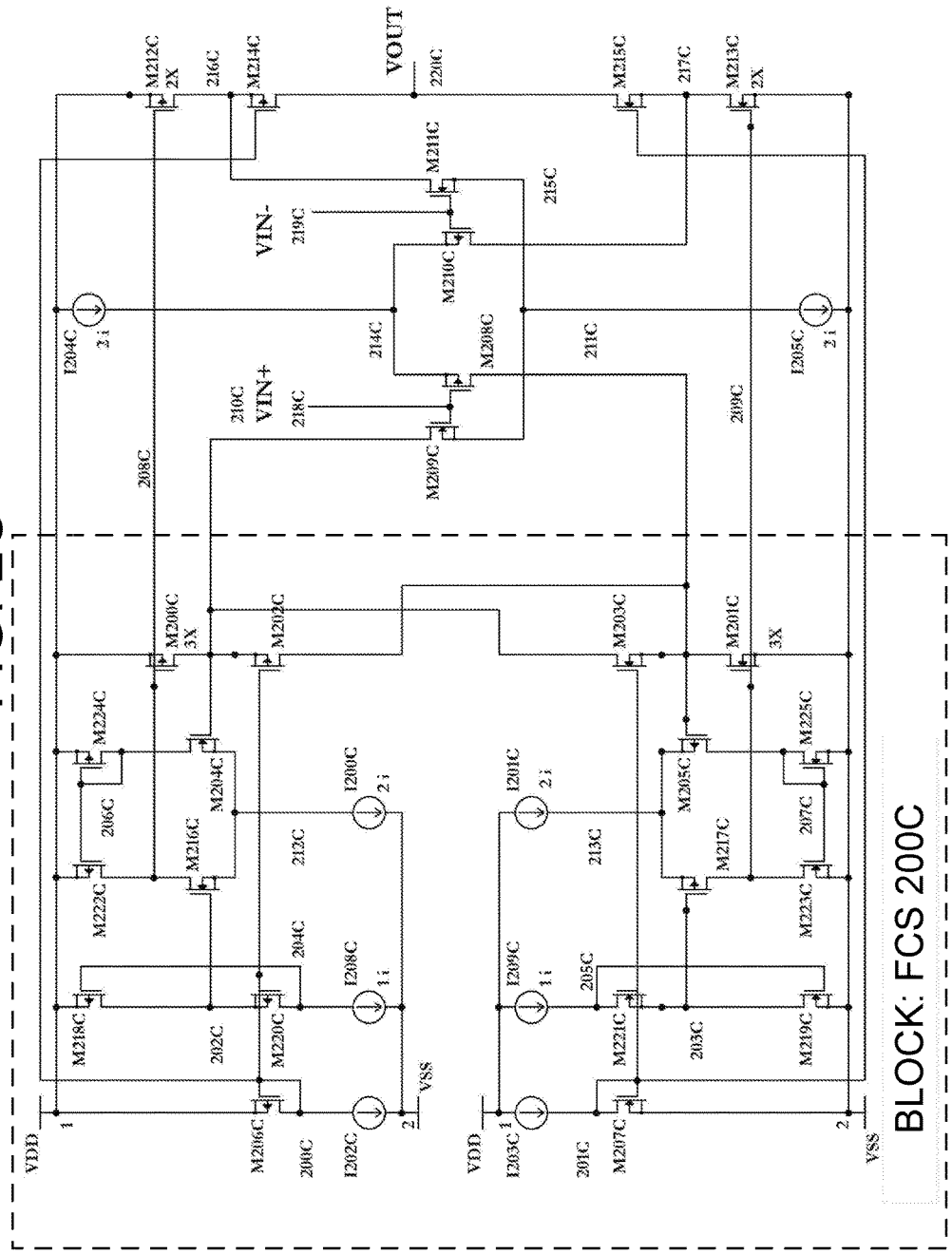
FIG. 2C is a schematic circuit diagram of the embodiment illustrating an amplifier utilizing the third floating current source (FCS200C) embodiment
Figure 2D:
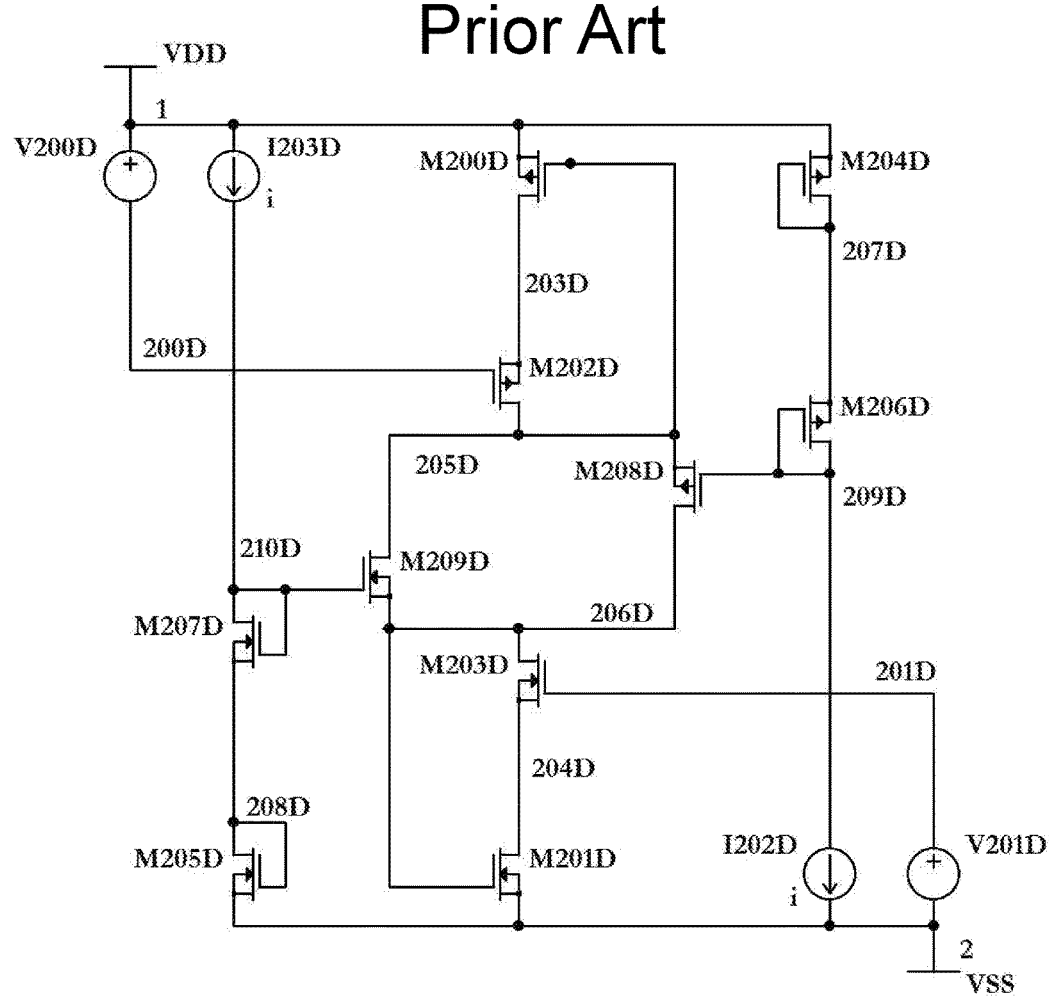
FIG. 2D is a schematic circuit diagram of a prior art floating current source (FCS) embodiment

Given the wide common mode range in an amplifier is especially beneficial for near rail-to-rail input-output voltage spans, utilizing a floating current source (FCS) or emulating its equivalent function, is generally a way to reduce the errors generated in upper and lower current source in the CGA and current mirror (summing node) gain stage. However, in order to operate the amplifier with lowest $V_{DD}$ (besides operating the amplifier inputs-outputs rail-to-rail), all of the amplifier's elements, including the FCS need to operate with lowest $V_{DD}$. FIG. 2D is an illustration of a prior art FCS, which is low power and fast, but its minimum $V_{DD} \geq 2V_{GS} + V_{IDS}$ would limit the amplifier for low power supply voltage applications.

Generally an amplifier's high gain stage is coupled with a buffer driver, which makes a buffer amplifier that would be able to drive external loads. In order to operate the buffer amplifier with ultra low currents and in low power supply environment, the buffer driver contained in it, must also consume ultra low currents and be capable of operating to specification with low power supplies. As noted earlier, operating in low or ultra low currents, slows down the speed. Hence, it would be advantageous to have a buffer driver that is fast, inherently, at low currents and can operate with low power supply voltage and have near rail-to-rail input-output voltage spans. Running fast and operating with low currents at low power supplies, still requires a buffer driver with high sink-source current drive capability to handle current requirements of different external loads. For example, some emerging portable applications use resistive sensors to measure environmental toxicity. The resistivity of such toxicity sensors can drop significantly when they are activated to make a measurement. Hence, it would be advantageous to have a buffer driver that can handle external low resistive loads when the sensor is activated, but return to low currents consumptions seamlessly, when the resistive sensor is no longer activated.

As mentioned earlier, next generation energy harvesting, and wireless and batteryless electronics are emerging applications, that require ultra low power ICs. All else equal, operating analog ICs at ultra low currents present additional challenges such as high noise besides low gain, and slow dynamic response (e.g., as noted earlier and generally, the lower the current, the higher the noise, the lower the gain, and the lower the speed). Hence, it would be advantageous to have a low noise amplifier noise that consumers low operating currents, and one that can be fast and operate with low power supply voltage.

Figure 3B:
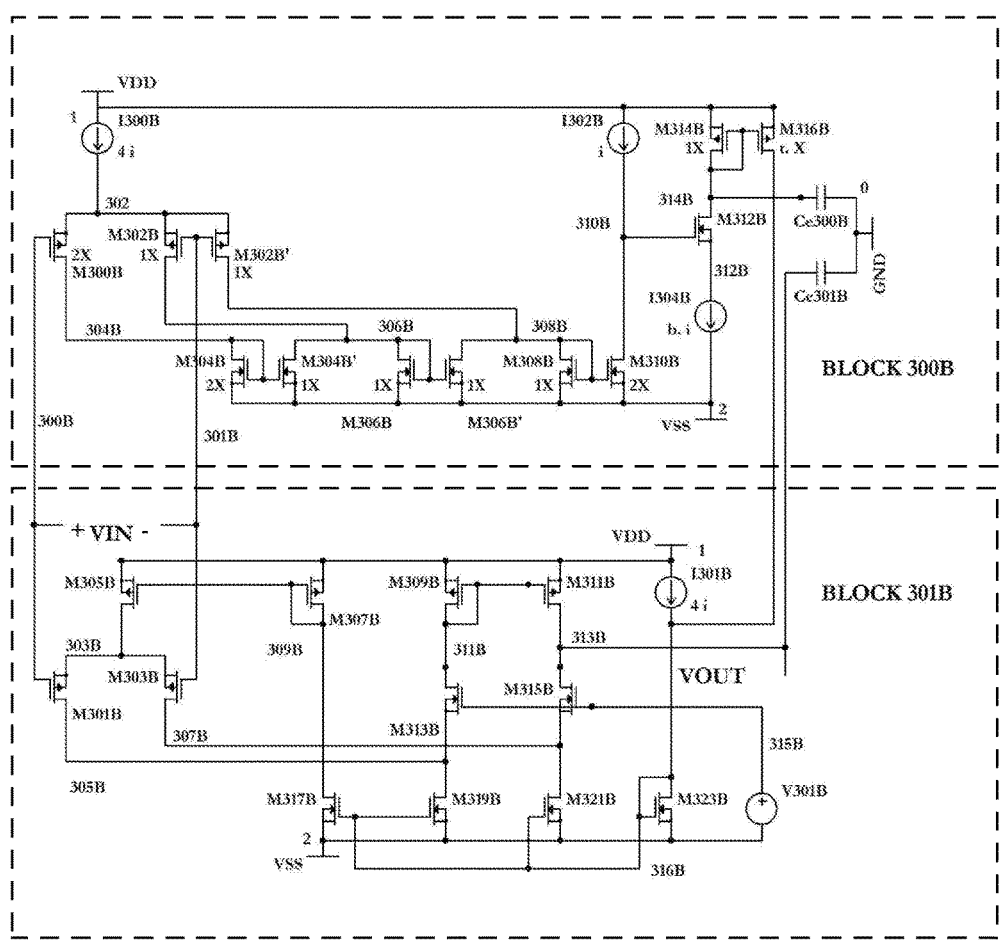
FIG. 3B is a schematic circuit diagram of the embodiment illustrating an amplifier utilizing a second noise reduction and speed boost circuit.
Figure 3C:
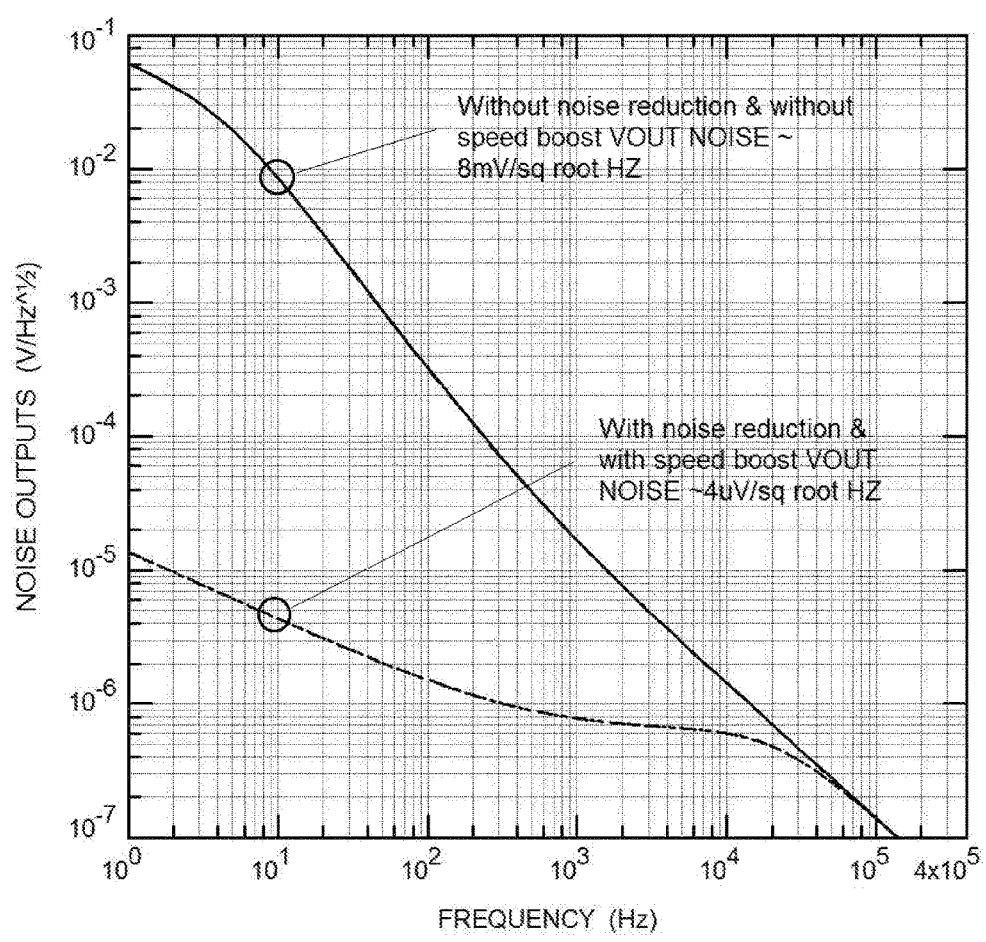
FIG. 3C is a circuit simulation showing output noise of the amplifier illustrated in FIG. 3A with and without the noise reduction & speed boost.
Figure 3D:
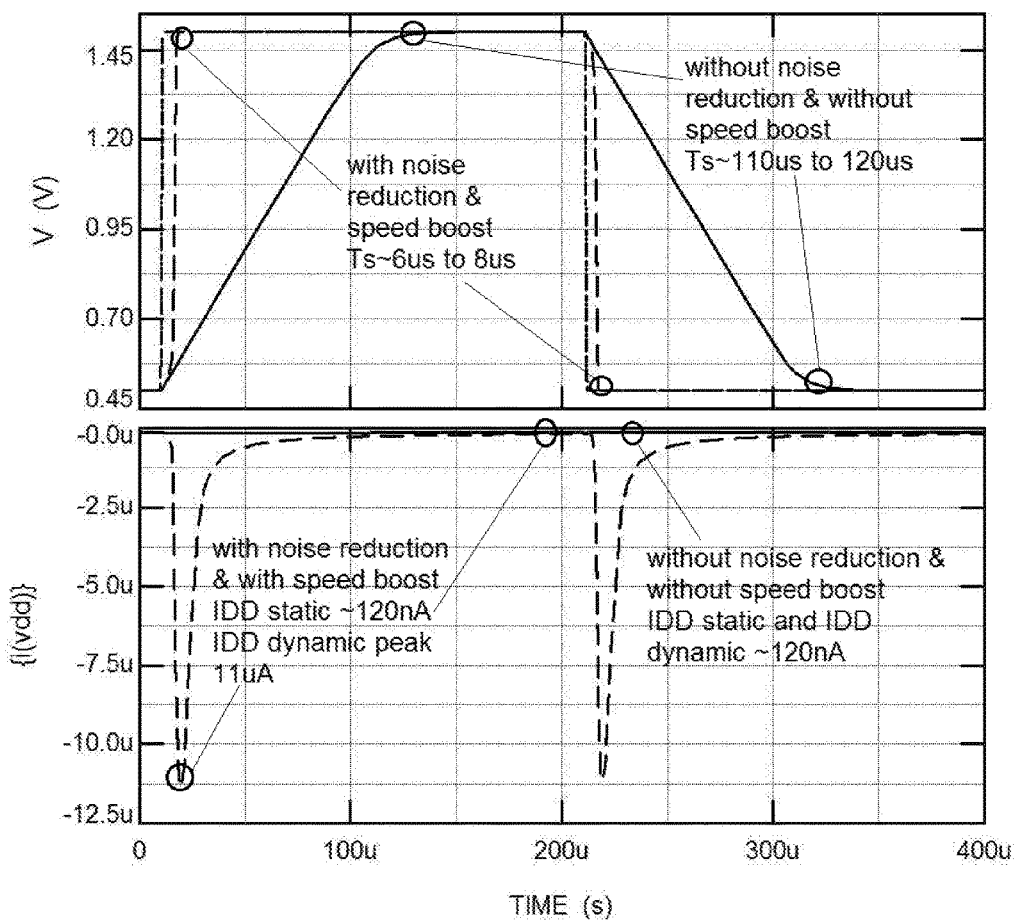
FIG. 3D is a circuit simulation showing transient response, current consumption of the amplifier illustrated in FIG. 3A, with and without the noise reduction & speed boost.
Figure 4A:
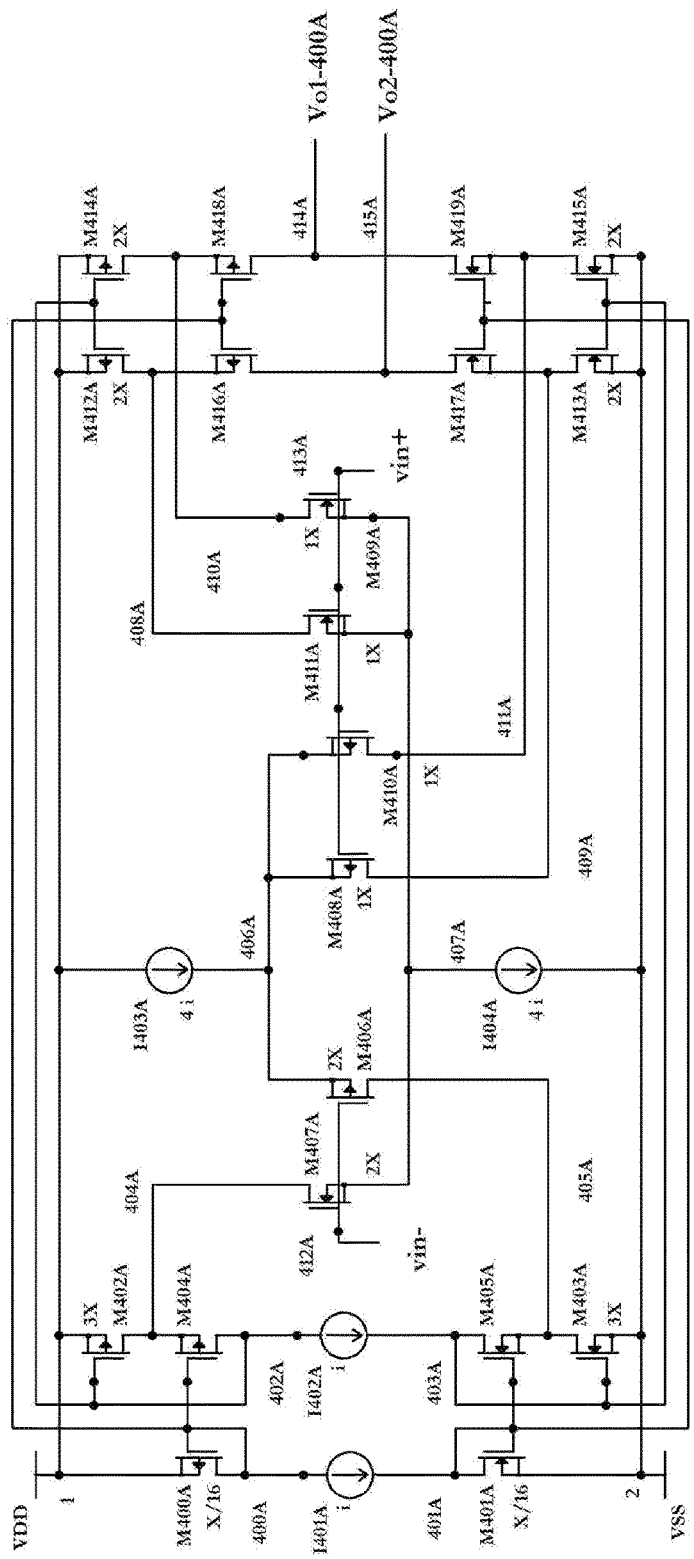
FIG. 4A is a schematic circuit diagram of a prior amplifier's gain stage with near rail-to-rail input and output voltage span, without a buffer driver.
Figure 4B:
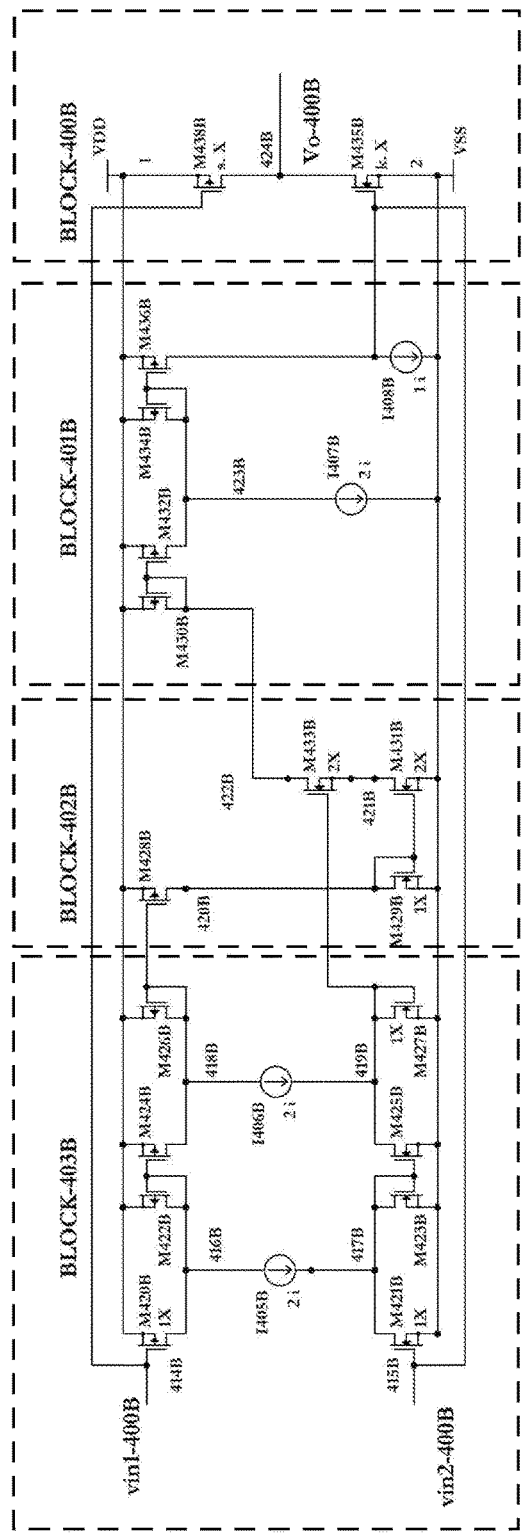
FIG. 4B is a schematic circuit diagram of the embodiment illustrating a buffer driver utilizing complementary non-inverting current mirror (CNICM), minimum current selector (MCS), and inverting current mirror amplifier (ICMA).
Figure 4C:
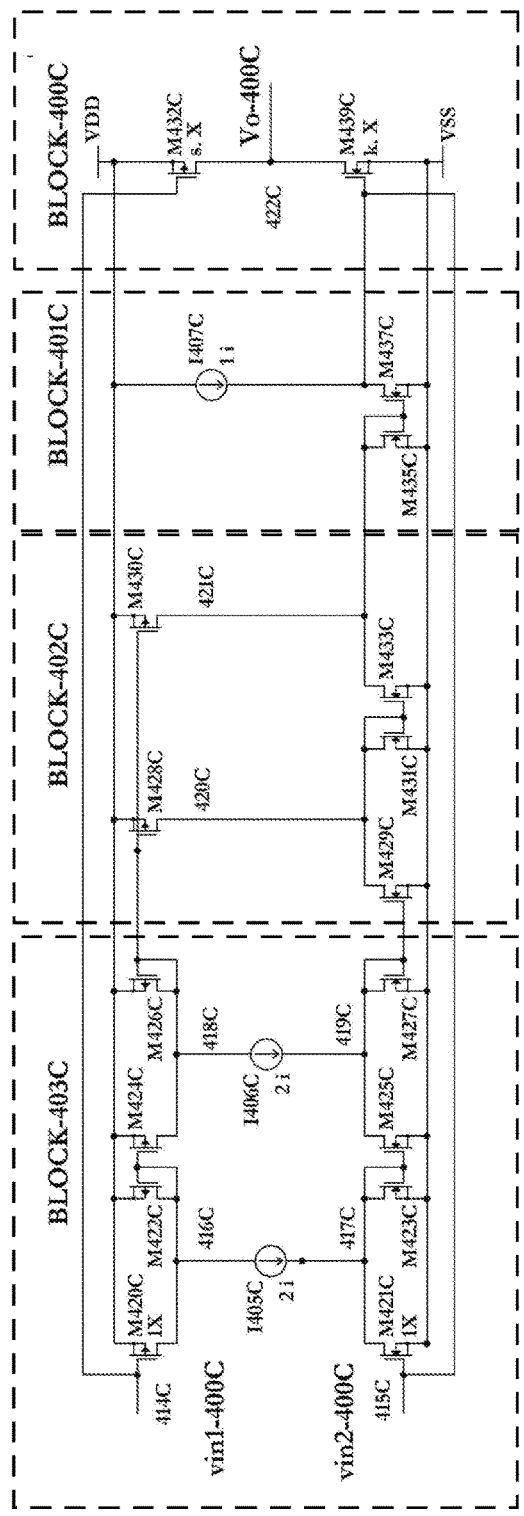
FIG. 4C is a schematic circuit diagram of the embodiment illustrating a buffer driver utilizing complementary non-inverting current mirror (CNICM), loser take all (LTA), and non-inverting current mirror amplifier (NICMA).
Figure 4D:
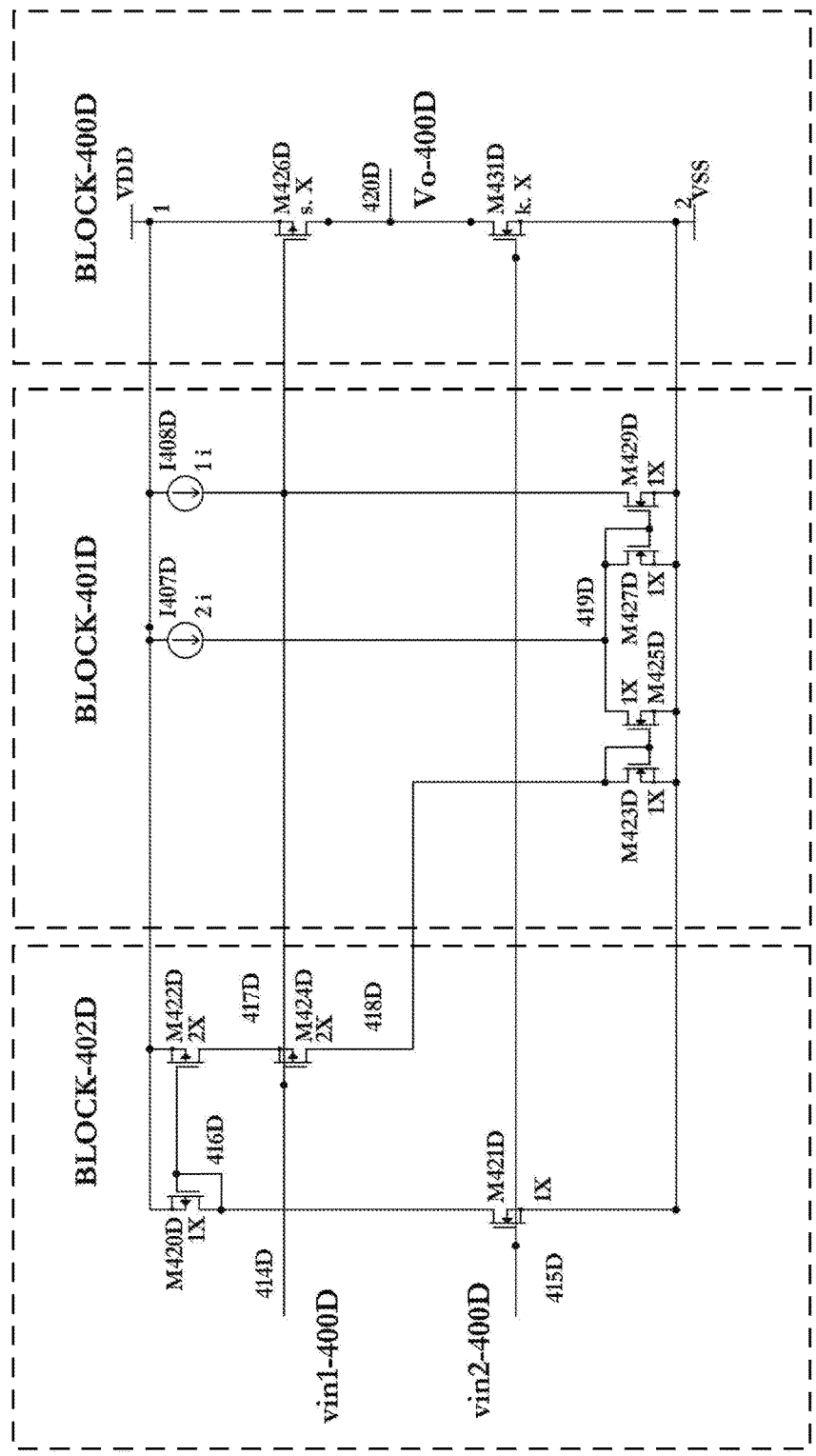
FIG. 4D is a schematic circuit diagram of the embodiment illustrating a buffer driver utilizing minimum current selector (MCS), and inverting current mirror amplifier (ICMA).
Figure 4E:
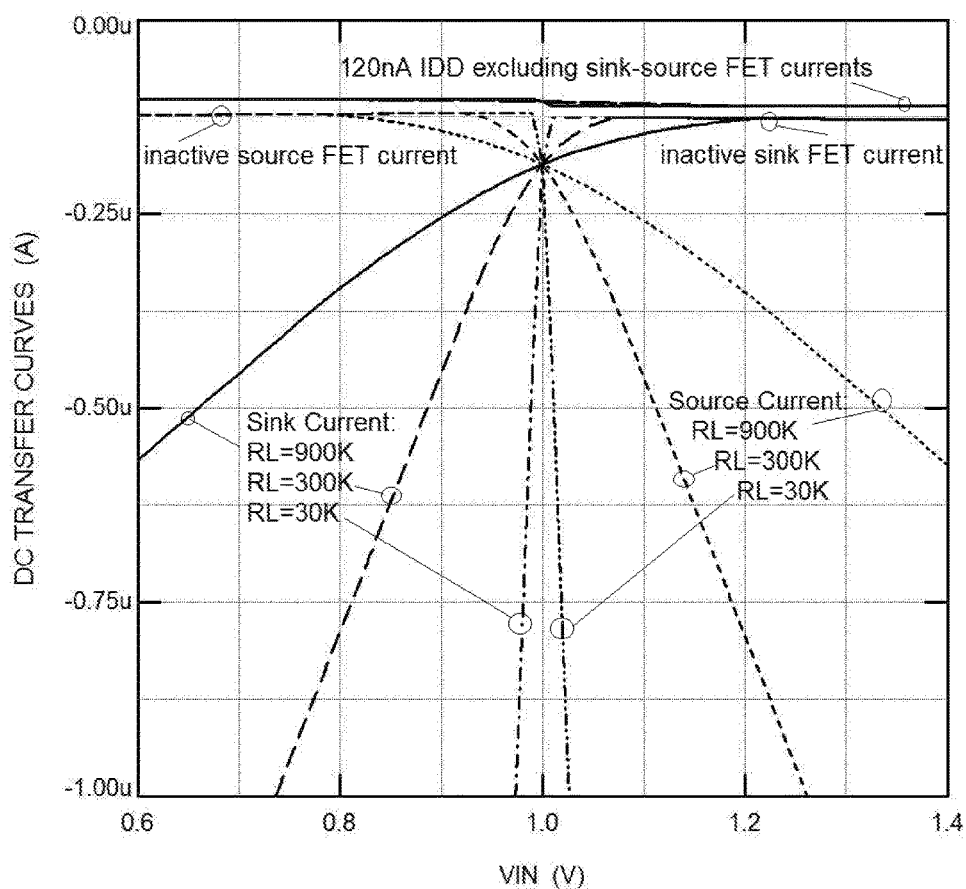
FIG. 4E is a circuit simulation showing the sink-source output FET currents and $I_{DD}$ as a function of external resistive load for an amplifier containing the gain stage of FIG. 4A coupled with buffer driver illustrated in FIG. 4B.
Figure 4F:
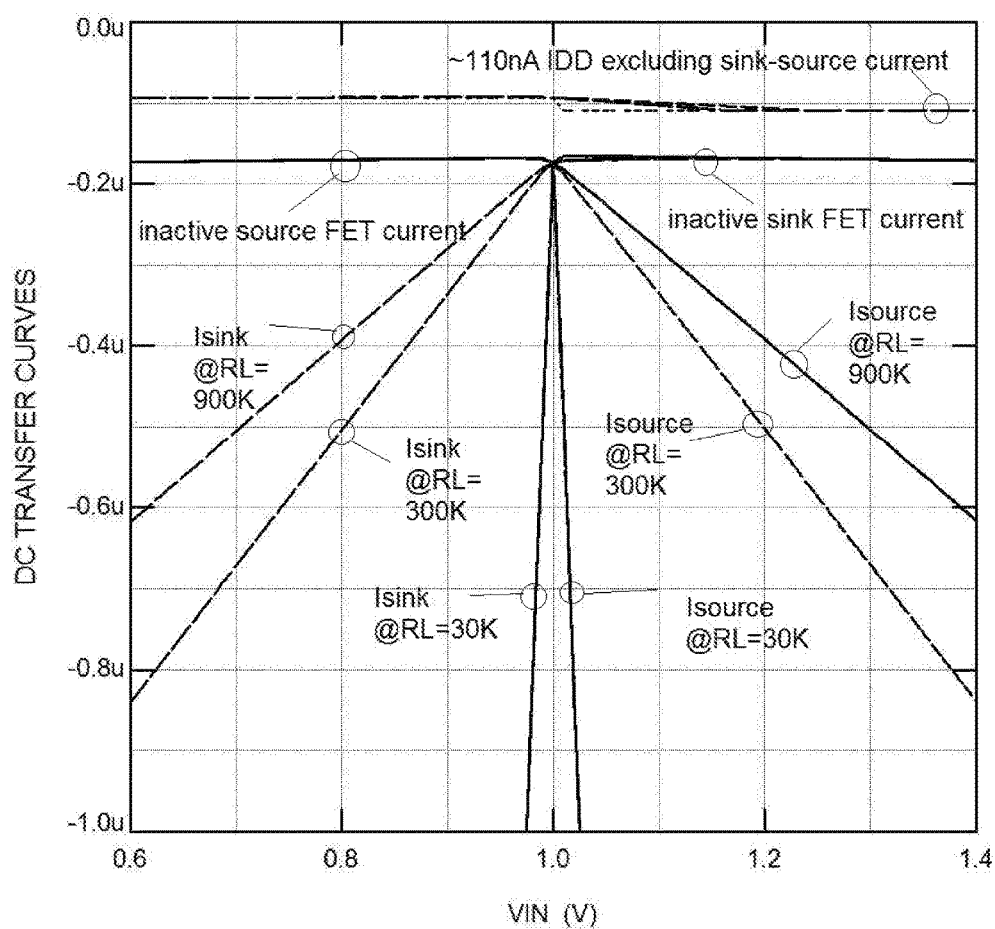
FIG. 4F is a circuit simulation showing sink-source output FET currents and $I_{DD}$ as a function of external resistive load for an amplifier containing the gain stage of FIG. 4A coupled with buffer driver illustrated in FIG. 4C.
Figure 4G:
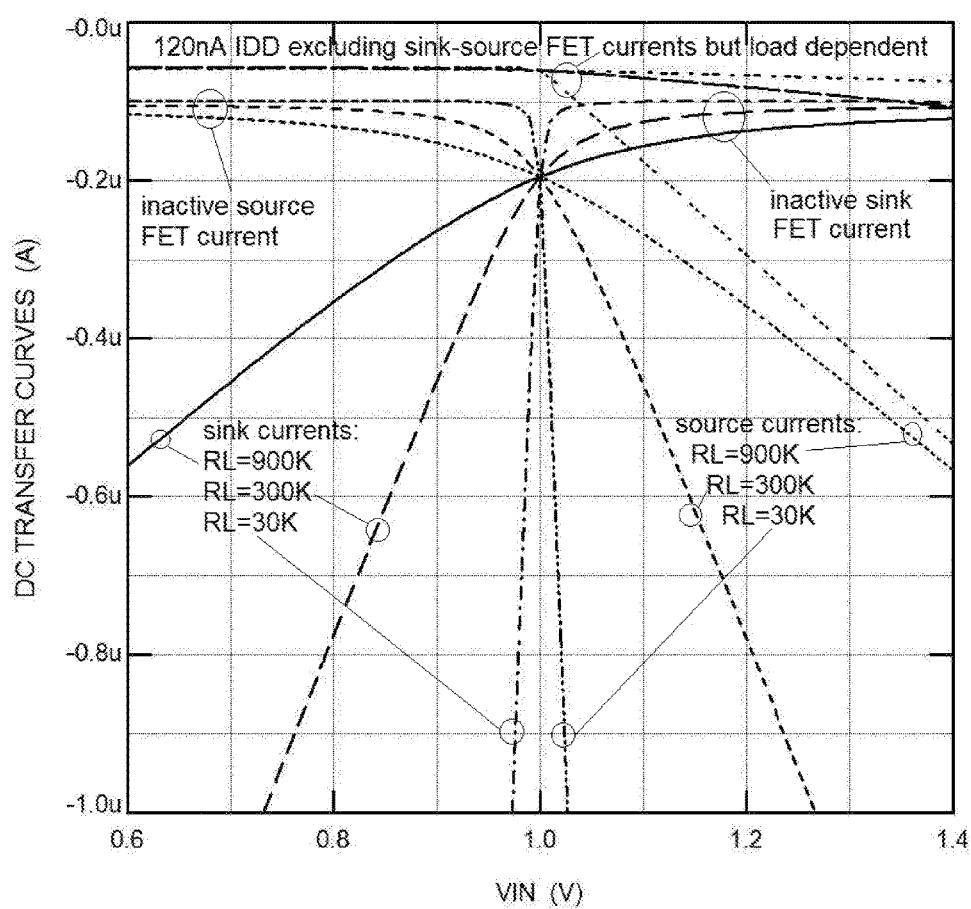
FIG. 4G is a circuit simulation showing sink-source output FET currents and $I_{DD}$ as a function of external resistive load for amplifier containing the gain stage of FIG. 4A coupled with buffer driver illustrated in FIG. 4D.

Therefore, in summary here are a list of advantages of these teachings. One, is to make current mirrors that are simple, small, low cost, low power, have high $R_{OUT}$, and wider input-output voltage span, whose embodiments are illustrated in FIG. 1B, FIG. 1D, and FIG. 1F. Two, as just stated, low current reduce an amplifier's gain, generally. Hence, another benefit of this teaching is to improve amplifiers gain and input-output voltage span, while keeping its power consumption low, by utilizing the disclosed RGC-CMs in amplifiers. The amplifier of FIG. 1A utilizes the RGC-CM coupled with DCSC (illustrated in FIG. 1B). The amplifier of FIG. 1C utilizes the RGC-CM coupled with ICMA (illustrated in FIG. 1D). The amplifier of FIG. 1E utilizes the RGC-CM coupled with composite amplifier, CSGA (illustrated in FIG. 1F). As a result of utilizing the disclosed RGC-CMs in the amplifiers, the amplifier's performance is improved, some aspects of which are illustrated in simulations FIG. 1I to FIG. 1M. Three, it would be advantageous to improve floating current sources (FCS), or emulate the function of FCS, that can operate at low power supply voltage. By utilizing the disclosed FCSs in amplifiers, the said amplifier can operate with low $V_{DD}$ while maintaining its accuracy. The embodiments of amplifiers utilizing first ($FCS_{200A}$), second ($FCS_{200B}$), and third ($FCS_{200C}$) FCS are illustrated in FIG. 2A, FIG. 2B, and FIG. 2C, respectively. Four, another benefit is to lower the output noise of an amplifier by narrow banding the amplifier. To reinvigorate the speed of the narrow banded amplifier, a boost-on signal is initiated which dynamically and rapidly injects a substantial current into the amplifier's bias current to speed up its slew rate, when the amplifier's inputs get off balance due to a large transient differential input signal. Subsequently, after the amplifier has had some time to respond and regulate itself and as the amplifier's inputs approach balance, a boost-off signal dynamically injects a slow and decaying (to zero) current into amplifier's bias circuitry, instead of turning the boost current rapidly, in order to improve the amplifier's settling time. Additionally, the boost circuitry and the amplifier's time constants, that determine the dynamic response of the boost and that of the amplifier, are approximately matched in order to improve smooth transitions in and out of boost and to improve consistency of the amplifier's dynamic response across process, temperature and operation variations. The embodiments of noise reduction and speed boost circuits are illustrated in FIG. 3A, and FIG. 3B. Simulations depicted in FIG. 3C and FIG. 3D illustrate some aspects of the improvements in noise, and the dynamic response of an amplifier with and without the disclosed noise reduction and speed boost circuits. Five, another feature of this disclosure is to make a low voltage, low current, and high-speed buffer driver that is coupled with the high gain stage of an amplifier (FIG. 4A). The buffer driver utilizes CNICM to monitor and rectify the sink-source currents of FET that drive external loads, before the sink-source FET current signals are fed to MCS or LTA circuits. The output of MCS or LTA circuits is then fed onto a NICMA or ICMA or CMA which helps regulate the current in the inactive sink-source FET. The buffer driver can operate with low power supply voltage and consume low currents. Because the elements utilized in the buffer driver run chiefly in current mode, it is inherently fast. Also, because the elements utilized in the buffer driver run chiefly in current mode, voltage swings are inherently small, which helps the buffer driver operate with lower power supplies. The embodiments of buffer driver circuits are illustrated in FIG. 4B, FIG. 4C, and FIG. 4D. Simulations depicted in FIG. 4E and FIG. 4F and FIG. 4G illustrate some aspects of the improvements in current drive capability of amplifiers (that utilize the disclosed buffer drivers) while running at very low operating currents.

Note that the following papers providing additional analysis of relevance to low power and low cost amplifier designs are also hereby incorporated by reference in their entirety: (1) A. Far, "Small size class AB amplifier for energy harvesting with ultra low power, high gain, and high CMRR," 2016 *IEEE International Autumn Meeting on Power, Electronics and Computing (ROPEC)*, Ixtapa, Zihuatanejo, Mexico, 2016, pp. 1-5; (2) A. Far, "Amplifier for energy harvesting: Low voltage, ultra low current, rail-to-rail input-output, high speed," 2016 *IEEE International Autumn Meeting on Power, Electronics and Computing (ROPEC)*, Ixtapa, Zihuatanejo, Mexico, 2016, pp. 1-6; (3) A. Far, "Low Noise Rail-To-Rail Amplifier for Energy Harvesting Runs Fast at Ultra Low Currents," 2017 *IEEE Canadian Conference on Electrical and Computer Engineering (CCECE)*, Windsor, ON, 2017; and (4) A. Far, "Ultra Low Current and Low Voltage Class AB Buffer Amplifier," 2017 *IEEE Canadian Conference on Electrical and Computer Engineering (CCECE)*, Windsor, ON, 2017.
SECTION (I): Detailed Description of Regulated Cascode Current Mirror (RGC-CM) Coupled with Diode Connected Self Cascode (DCSC), as Illustrated in FIG. 1B FIG. 1B is a circuit schematic showing a $RGC\text{-}CM_{100B}$ coupled with $DCSC_{100B}$ according to an embodiment. One differentiation of this teaching, compared to the conventional teachings, is in arranging a $RGC\text{-}CM_{100B}$ coupled with $DCSC_{100B}$ to generate a DC voltage shift thereby allowing the input-output voltage of the current mirror to get closer to the rail.

The basic idea of $RGC\text{-}CM_{100B}$ coupled with $DCSC_{100B}$ in FIG. 1B, is to use negative feedback of an auxiliary amplifier ($A_{AUX}$) that has a gain of 'G' (e.g., formed by $M_{111B}$ and $I_{105B}$), which regulates the $V_{DS}$ of $M_{117B}$ as constant as possible, irrespective of the variations in the output node 102B of the current mirror, which is $V_D$ of $M_{119B}$. Here, the DCSC shifts down the $V_{DS}$ of $M_{117B}$ down by $VDS_{M113B}$ which helps $V_{102B}$ (output of current mirror) get closer to $V_{SS}$.

Throughout the description of FIG. 1B, 'X' is the W/L of a MOSFET, and 'r', 's', 't', 'u', 'v', and 'w' are scale factors for MOSFET W/Ls. These MOSFET scale factors can be set approximately in the ranges of $0.01 \leq r \leq 100$, $0.01 \leq s \leq 100$, $0.01 \leq t \leq 100$, $0.01 \leq u \leq 100$, $0.01 \leq v \leq 100$, and $0.01 \leq w \leq 100$ depending on considerations such as current consumption, voltage span, and die size, amongst others. Also, current source (e.g., $I_{111B}$, $I_{105B}$, and $I_{107B}$) scale factors can be set approximately in the ranges of $0.01 \leq o \leq 100$, $0.01 \leq p \leq 100$, $0.01 \leq q \leq 100$. For example, for a embodiment of FIG. 1A that utilizes plurality of $RGC\text{-}CM_{100B}$ coupled with $DCSC_{100B}$ of FIG. 1B, the MOSFET's W=4 µm, and X=1 µm computes to W/L=4. In this example, the MOSFET W/L scale factors are set to r=10, v=3, and u=t=s=t=w=1. Also, here the current sources, i=5 nA for $I_{M111B} = I_{M105B} = I_{M107B} = 5$ nA, where o=p=q=1.

The connections of the elements in FIG. 1B are described as follows. The body terminal of all NMOSFETs in FIG. 1B are connected to node 2 which is $V_{SS}$, and the body terminals of PMOSFETs are connected to node 1 which is $V_{DD}$. Bias current sources $I_{111B}$, $I_{105B}$, and $I_{107B}$ have their upper terminals connected to node 1, which is $V_{DD}$. The source terminal of NMOSFETs $M_{126B}$, $M_{111B}$, and $M_{117B}$ are connected to node 2 that is $V_{SS}$. The lower terminal of $I_{111B}$ is connected to node 100B, which is connected to the gate terminal of $M_{126B}$, and the drain terminal of $M_{126B}$, and the gate terminal of $M_{117B}$. Node 101B is connected to the lower terminal of $I_{105B}$, the drain terminal of $M_{111B}$, and the gate terminal of $M_{119B}$. Node 102B is connected to the drain terminal of $M_{119B}$, which is the output of the current mirror (or terminal $Io_{100B}$). Node 103B is connected to the gate terminal of $M_{111B}$, the source terminal of $M_{115B}$, and the drain terminal of $M_{113B}$. Node 104B is connected to the lower terminal of $I_{107B}$, the gate terminal of $M_{115B}$, the drain terminal of $M_{115B}$, and the gate terminal of $M_{113B}$. Node 105B is connected to the source terminal of $M_{113B}$, the drain terminal of $M_{117B}$, and the source terminal of $M_{119B}$. The $I_{M111B}$ terminal is the input current to the RGC-CM$_{100B}$ coupled with DCSC$_{100B}$, and $I_{M119B}$ terminal is its output.

Describing the details of the circuit in FIG. 1B is as follows. The $I_{111B}$ flows through $M_{126B}$, whose $V_{GS}$ is the same as that of $M_{117B}$, which mirrors and scales $v \times I_{M126B} = u \times I_{M117B}$. For descriptive clarity of FIG. 1B, let's assume current source scale factors of o=q=1, and the MOSFET scale factors of r=10, s=t=u=w=1, and v=2. As such, $I_{107B} \approx 1i$ (which flows through $M_{115B}$ and $M_{113B}$) is fed into node 105B where $ID_{M117B} \approx 2i$, and hence the current mirror's output which is $ID_{M119B} \approx ID_{M117B} - I_{107B} \approx 1i$.

The current mirror of FIG. 1B utilizes DCSC which is composed of two FETs, $M_{115B}$ and $M_{113B}$, whose function is briefly discussed. The basic function of DCSC here is to provide a DC voltage shift, which is a function of the difference $(\Delta VGS) = VGS_{M113B} - VGS_{M115B} \approx VDS_{M113B} \approx V_T \times \ln(r/s)$. In the subthreshold region, this DC voltage shift is chiefly dependent on $V_T$ which is well controlled and it is approximately independent of CMOSFET's $V_{TH}$ (note that the value of $V_{TH}$ has normal but wide fluctuations in fabrication manufacturing).

In FIG. 1B, the $A_{AUX}$ which is configured as a simple common source amplifier (CSA) which can be composed of only one FET and one current source, $M_{111B}$-$I_{105B}$, where $I_{105B}$ can be supplied via a one FET of a PMOS current mirror. This $A_{AUX}$, has an approximate gain of $G \propto V_A/V_T$, and it regulates the gate voltage of $M_{119A}$ in order to increase the $R_{OUT}$ at node 102B, which is the output of the RGC-CM. The $R_{OUT}$ is approximately $\propto g_m^2 \times r_{ds}^3 \propto (V_A/V_T)^2 \times (V_A/I_D)$. Note that $R_{OUT}$ of RGC-CM on actual silicon will likely be lower due to second order effects such as η (subthreshold slope factor) and substrate leakage, amongst other factors. Moreover, it is of note that for additional headroom at RGC-CM's input-output, multiple DCSCs can be cascaded to developed a larger DC voltage shift, for example.

In summary, the prior art illustrated in FIG. 1G, the minimum $V_{103G} = Von_{M119G} + VGS_{M111G}$. Comparatively, the embodiment of FIG. 1B utilizes a simple circuit that improves the minimum $V_{102B} \approx Von_{M119B} + VGS_{M111B} - V_T \times \ln(r/s)$. Also note that $VDS_{M117B} = VGS_{M103B} - VDS_{M113B}$, and $VGS_{M115B} - VGS_{M113B} + VDS_{M117B} \approx VDS_{M111B} \approx V_T \times \ln(r/s)$.

In conclusion, the benefits of the FIG. 1B, RGC-CM$_{100B}$ coupled with DCSC$_{100B}$ include the following. First, the same type FETs may be used in each of the $A_{AUX}$ (e.g., a $M_{111B}$ which is NMOSFETs), the DCSC$_{100B}$ (e.g., $M_{115B}$-$M_{113B}$ which are also NMOSFETs), and the cascode FETs in the current mirror (e.g., $M_{117B}$-$M_{119B}$) whose device parameters match and track, and hence benefiting the amplifier's DC, AC, and transient specifications stability over fabrication process, temperature, and power supply variations. Second, the bias voltages in the RGC-CM$_{100B}$ coupled with DCSC$_{100B}$ are self biased (i.e., no need for separate voltages to set its internal bias nodes), which lower complexity and lowers current consumption, reduces die size and cost, and improved quality. Third, the RGC-CM$_{100B}$ coupled with DCSC$_{100B}$ has low transistor count (i.e., it is small) and low current because its' auxiliary amplifier's gain is achieved by only two FETs and the widening of output voltage headroom is achieved by only two FETs (e.g., $M_{115B}$ and $I_{113B}$) in DCSC. Fourth, the RGC-CM$_{100B}$ coupled with DCSC$_{100B}$'s headroom is widened by $V_T \times \ln(r/s)$ with 2 FETs, which can practically be programmed or pre-determined to have a range of, for example, 50 mV to 150 mV. For sub-1V power supply environments, every 100 mV extra headroom in the current mirror translates to 10% extra operating room at the current mirror output. Fifth, as stated earlier, electronic functions used in energy harvesting applications may require more smooth and stable power up and down transient responses (e.g., for power save reasons or for frequent switching from a magnetic power harvester source to a kinetic power harvester source). The simple and small circuit arrangement, in RGC-CM$_{100B}$ coupled with DCSC$_{100B}$ that utilizes few FETs (i.e., 2 FETs to make a single stage $A_{AUX}$ to increase $R_{out}$), is beneficial for AC and transient response of the current mirror. This is because the single stage amplifier neither require multiple AC loops nor complicated AC and transient compensation. For energy harvesting applications, that may subject ICs to less predictable or disorderly power supply on and off patterns, this simple arrangement in RGC-CM coupled with DCSC can provide additional guard band for smoother dynamic performance.

Section (II): Detailed Description of Regulated Cascode Current Mirror (RGC-CM) Coupled with Inverting Current Mirror Amplifier (ICMA), as Illustrated in FIG. 1D FIG. 1D is a circuit schematic showing a RGC-CM$_{100D}$ coupled with ICMA$_{100D}$, according to another embodiment. A differentiation of this teaching, compared to conventional teachings, is in arranging a RGC-CM$_{100D}$ coupled with ICMA$_{100D}$, where ICMA$_{100D}$ has a current input terminal whose operating voltage can be programmed with flexibility. As a result, this aspect of ICMA$_{100D}$ can widen the input-output voltage range of the current mirror. Here, the ICMA$_{100D}$ serves the function of auxiliary amplifier, $A_{AUX}$, that increase its $R_{OUT}$. The benefits of this arrangement include the widening of voltage output span, and increasing the $R_{OUT}$ of the RGC-CM$_{100D}$ coupled with ICMA$_{100D}$ can provide low power and high speed with low cost. Throughout the description of FIG. 1D, 'X' is the W/L of a MOSFET, and 'n', 'r', 's', 't', 'u', 'v', and 'w' are scale factors for MOSTEL W/Ls. These MOSFET scale factors can be set approximately in the ranges of $0.01 \le n \le 100$, $0.01 \le r \le 100$, $0.01 \le s \le 100$, $0.01 \le t \le 100$, $0.01 \le u \le 100$, $0.01 \le v \le 100$, $0.01 \le w \le 100$ depending on considerations such as current consumption, voltage span, and die size, amongst others. Also, for current source (e.g., $I_{113D}$, $I_{105D}$, $I_{107D}$, and $I_{109D}$) scale factors can be set approximately in the ranges of $0.01 \le o \le 100$, $0.01 \le p \le 100$, $0.01 \le q \le 100$, and $0.01 \le m \le 100$. For example, for an embodiment of FIG. 1C that utilizes RGC-CM$_{100D}$ coupled with ICMA$_{100D}$ of FIG. 1D, for MOSFET's W=4 μm, and X=1 μm, which computes to W/L=4. In this example, the MOSFET W/L scale factors are set to n=0.05, v=3, and r=s=t=u=w=1. Also, current source scale factors can be set to q=2, and o=p=m=1 for i=5 nA such that $I_{M111D} \approx I_{M113D} \approx I_{M115D} \approx I_{M121D} \approx I_{M119D} \approx \frac{1}{2} \times I_{M117D} \approx I_{M128D} \approx 5$ nA.

The connections of the elements in FIG. 1D are described as follows. The body terminal of all NMOSFETs in FIG. 1D are connected to $V_{SS}$, and the body terminals of PMOSFETs are connected to node 1 that is $V_{DD}$. Bias current sources $I_{113D}$, $I_{105D}$, $I_{107D}$, and $I_{M109D}$ have their upper terminals connected to node 1 that is $V_{DD}$. The body terminal of all NMOSFETs in FIG. 1B are connected to node 2 that is $V_{SS}$, and the body terminals of PMOSFETs are connected to node 1 that is $V_{DD}$. The source terminal of NMOSFETs $M_{128D}$, $M_{111D}$, $M_{113D}$, $M_{117D}$, and $M_{121D}$ are connected to node 1 that is $V_{SS}$. The lower terminal of $I_{113D}$ is connected to node 100D, which is connected to the gate terminal of $M_{128D}$, and the drain terminal of $M_{128D}$, and the gate terminal of $M_{117D}$. Node 101D is connected to the lower terminal of $I_{105D}$, the drain terminal of $M_{111D}$, and the gate terminal of $M_{119D}$. Node 102D is connected to the drain terminal of $M_{115D}$, the drain terminal of $M_{113D}$, the gate terminal of $M_{113D}$, and the lower terminal of $I_{107D}$. Node 103D is connected to the drain terminal of $M_{119D}$, which is the output of the current mirror (or terminal $Io_{100D}$). Node 104D is connected to the source terminal of $M_{115D}$, the drain terminal of $M_{117D}$, and the source terminal of $M_{119D}$. Node 105D are connected to the gate terminal of $M_{121D}$, the drain terminal of $M_{121D}$, and the lower terminal of $I_{109D}$. The $I_{M113D}$ is the input current to the RGC-CM$_{100D}$ coupled with ICMA$_{100D}$, and $ID_{M119D}$ is its output current that is its mirror.

Note that the ICMA$_{100D}$ function is performed by $M_{115D}$, $M_{113D}$, $I_{107D}$, $M_{111D}$, and $I_{105D}$. For clarity in describing the RGC-CM$_{100D}$ coupled with ICMA$_{100D}$ of FIG. 1D, it is assumed that n=0.05, v=2, and r=s=t=u=w=1. Also, it is assumed that the current source scale factors to q=2, and o=p=m=1 for i=5 nA.

During steady state conditions, $I_{113D}$ flows through $M_{128D}$, whose $V_{GS}$ is the same as that of $M_{117D}$, which causes $v \times I_{M128D} = u \times I_{M117D}$ or $2I_{M128D} = I_{M117D}$. As such, $ID_{M111D} \approx ID_{M113D} \approx ID_{M115D} \approx ID_{M121D} \approx ID_{M119D} \approx \frac{1}{2} \times I_{DM117D} \approx ID_{M128D} \approx i \approx 5$ nA.

As noted earlier, the regulated cascode (RGC) is used in a current mirror (CM), chiefly, to increase its $R_{OUT}$. When there are voltage changes ($\Delta v_X$) at the output (node 103D), the goal is for the output current ($ID_{M119D}=i$) variations ($\Delta i_X$) to be minimized. The $\Delta v_X$ here can cause a $\Delta i_X$ on $M_{119D}$, because $M_{119D}$ has a finite impedance between its source and drain terminals. Since $I_{M117D}=2I_{128D}=2i$ is fixed, then at node 104A, the $\Delta i_X$ would flow through $M_{115D}$, which is the current input terminal of ICMA$_{100D}$. Given that $I_{107D}=2i$ is also constant, as explained earlier, this change in current, $\Delta i_X$, flowing through $M_{115D}$ gets subtracted from the steady state current of $ID_{M113D}$. The auxiliary amplification, $A_{AUX}$, function inside the ICMA$_{100D}$ is performed by $M_{111D}$ and $I_{105D}$ whose $R_{OUT} \propto V_A/I_D$ (when CMOS is operating in the subthreshold region). Consequently, the $\Delta i_X$ in $ID_{M113D}$ is mirrored onto $M_{111D}$ whose drain (at node 101D is coupled to $I_{105D}=i$ that is a constant current source) responds to this $\Delta i_X$, with negative gained voltage change of about $\Delta i_X \times R_{OUT}$. At node 101D, this negative gained voltage change is fed-back to the gate terminal of $M_{119D}$. This negative gain voltage feedback, is the mechanism that regulates the VGS of $M_{119D}$ so that $\Delta i_X \rightarrow$ near zero.

In summary, the ICMA$_{100D}$ regulates the gate voltage of $M_{119D}$ in order to increase the $R_{OUT}$ of at node 103D. The $R_{OUT}$ of RGC-CM$_{100D}$ coupled with ICMA$_{100D}$ is approximately $\propto g_m^2 \times r_{ds}^3 \propto (V_A/V_T)^2 \times (V_A/I_D)$, assuming subthreshold operations and assuming that the gain from node 104D to 102D is about unity with equal currents flowing through $M_{115D}$, $M_{113D}$, and $M_{111D}$.

The RGC-CM$_{100D}$ coupled with ICMA$_{100D}$ output voltage span is also improved substantially, mainly because of the flexibility in setting $V_{105D}$ fairly independently (e.g., $V_{105D} \propto I_{109D}$, and W/L of $M_{121D}$) which bias the $VG_{M115D}$. The minimum $V_{103D} = Von_{M119D} + Von_{M117D}$, and $Von_{M117D} = VGS_{M121D} - VGS_{M115D} = \Delta VGS \approx V_T \times \ln(r/n)$. Hence, minimum $V_{103D} = Von_{M119E} + V_T \times \ln(r/n)$ above $V_{SS}$, and approximately independent of CMOSFET's $V_{TH}$.

In conclusion, the benefits of the proposed RGC-CM$_{100D}$ coupled with ICMA$_{100D}$ illustrated in of FIG. 1D include the following. First it contains the function of the auxiliary amplifier that is composed of the same type FETs (e.g., a $M_{115D}$, $M_{113D}$, and $M_{111D}$ that are all NMOS) as that of the FETs in the cascoded current mirror (e.g., $M_{117D}$, $M_{119D}$ that also NMOS). Note that constant current sources $ID_{105D}$ and $ID_{107D}$ can be made of single PMOSFETs to serve only the function of constant 'bias current' source. Therefore, the DC, AC, and transient specifications stability and manufacturability of RGC-CM can be improved, because utilizing the device parameters of the same type of FETs (e.g., NMOSFETs) better match and track each other over normal variations in fabrication process, temperature, and power supply. Second, RGC-CM$_{100D}$ coupled with ICMA$_{100D}$ has low transistor count (i.e., it is small) and low current because the expanded output span as well as the auxiliary amplification function to increase $R_{OUT}$ can be accomplished by 4 FETs ($M_{111D}$, $M_{113D}$, $M_{115D}$, $M_{121D}$) and 3 current sources ($I_{105D}$, $I_{107D}$, and $I_{109D}$ which can be made with 3 FETs as well). Third, it can operate fast in part because ICMA operate in current mode. Moreover, ICMA is fast because small geometry FETs can be selected in the ICMA signal path ($M_{111D}$, $M_{113D}$, and $M_{115D}$) with a scale factor of 1 (i.e., they are not composed of plurality of FETs arranged in parallel). Fourth, the headroom is widened substantially allowing the RGC-CM$_{100D}$ coupled with ICMA$_{100D}$'s output voltage to swing within $Von_{M119E} + V_T \times \ln(r/n)$ above the power supply rail. As noted earlier, for sub-1V power supply environments, every 100 mV extra headroom in the current mirror translates to 10% extra operating room at the current mirror output. Fifth, as stated earlier, electronic functions used in energy harvesting applications may subject ICs to less predictable or disorderly power supply on and off patterns, thereby requiring more smooth transient responses. This ICMA$_{100D}$ operates chiefly in current mode which is inherently fast, and its $A_{AUX}$ has a single pole (simplifying its compensation) that can provides for additional transient performance guard band.

Section (III): Detailed Description of Regulated Cascode Current Mirror (RGC-CM) Coupled with Composite Amplifier (CSGA), Illustrated in FIG. 1F FIG. 1F is a circuit schematic showing a RGC-CM$_{100F}$ coupled with CSGA$_{100F}$ according to a embodiment. As explained in previous sections, increasing the $R_{OUT}$ of a current mirror is one of the motivation for utilizing an auxiliary amplifier ($A_{AUX}$). One of the differentiation of the RGC-CM$_{100F}$ coupled with CSGA$_{100F}$ in FIG. 1F is in the arrangement of CSGA$_{100F}$ that performs the function of $A_{AUX}$ to increase $R_O$ as well as input-output voltage span of the current mirror by utilizing a few FETs. Here, the CSGA$_{100F}$ utilizes a first differential common source amplifier (CSA), with a built-in offset, that feeds its output current into first a common gate amplifier (CGA) that is inherently fast and whose gate is biased from the common source summing junction of the first CSA. The designation of 'composite amplifier' is because this CSGA$_{100F}$ intertwines the composite of PMOSFETs and NMOSFETs to generate both the gain and widen the input-out voltage span of the current mirror. The gain "G" (attained chiefly by $M_{113F}$ and $I_{109F}$) of CSGA$_{100F}$ keeps the $V_{DS}$ of $M_{117F}$ as constant as possible, ideally speaking, irrespective of the variations in $V_D$ of $M_{119F}$. Here, the input-output voltage span of the current mirror is widened by lowering the $VDS_{M117F}$. This voltage is set by the built-in input offset voltage ($\Delta VGS \approx VDS_{M117F} \approx V_T \times \ln(r/s)$) generated by scaling $M_{115F}$-$M_{111F}$ that are the differential inputs the first CSA within the CSGA$_{100F}$. Alternatively, (to provide the CSA with a DC voltage shift), the $M_{111F}$ input of CSA can be biased at an alternative voltage instead of ground or $V_{SS}$, which avoids scaling $M_{115F}$-$M_{111F}$ and saves die area.

Throughout the description of FIG. 1F, 'X' is the W/L of a MOSFET, and 'r', 's', 't', 'u', 'v', and 'w' are scale factors for MOSTEL W/Ls. These MOSFET scale factors can be set approximately in the ranges of $0.01 \leq r \leq 100$, $0.01 \leq s \leq 100$, $0.01 \leq t \leq 100$, $0.01 \leq u \leq 100$, $0.01 \leq v \leq 100$, and $0.01 \leq w \leq 100$ depending on considerations such as current consumption, voltage span, and die size, amongst others. Also, current sources (e.g., $I_{111F}$, $I_{107F}$, $I_{109F}$, and $I_{119F}$) scale factors can be set approximately in the ranges of $0.01 \leq n \leq 100$, $0.01 \leq o \leq 100$, $0.01 \leq p \leq 100$, $0.01 \leq q \leq 100$. For example, for an embodiment of FIG. 1E that utilizes RGC-CM coupled with composite amplifier of FIG. 1F, the MOSFET's W=4 μm, and X=1 μm computes to W/L=4. In this example, the MOSFET W/L scale factors are set to s=0.0625, v=2, and u=t=r=t=w=1. Also, here the current sources, i=5 nA for $2 \times I_{M119F} = 2 \times I_{M109F} = I_{M111F} = I_{M107F} = 10$ nA, where q=o=1, n=p=2.

The connections of the elements in FIG. 1F are described as follows. The body terminal of all NMOSFETs in FIG. 1F are connected to node 2 which is $V_{SS}$, and the body terminals of PMOSFETs are connected to node 1 which is $V_{DD}$. Bias current sources $I_{119F}$, $I_{107F}$, and $I_{109F}$ have their upper terminals connected to node 1, which is $V_{DD}$. The lower terminal of $I_{111F}$ is connected to node 2, which is $V_{SS}$. The drain terminal of $M_{111F}$, and the gate terminal of $M_{111F}$ are connected to node 2, which is $V_{SS}$. The source terminal of NMOSFETs $M_{131F}$ and $M_{117F}$ are connected to node 2 that is $V_{SS}$. Node 100F is connected to drain terminal of $M_{131F}$, the gate terminal of $M_{131F}$, and the gate terminal of $M_{117F}$. Node 101F is connected to source terminal of $M_{111F}$, the source terminal of $M_{115F}$, the gate terminal of $M_{113F}$, and the lower terminal of current source $I_{107F}$. Node 101F is the summing junction of CSA containing the CSA differential input FETs ($M_{111F}$, $M_{115F}$) and the current source $I_{107F}$ that provides the tail current to the CSA differential input FETs ($M_{111F}$, $M_{115F}$). Node 102F is connected to drain terminal of $M_{113F}$, the gate terminal of $M_{119F}$, and the lower terminal of $I_{109F}$. Node 103F is connected to source terminal of $M_{113F}$, the drain terminal of $M_{115F}$, and the upper terminal of $I_{111F}$. Node 104F is connected to source terminal of $M_{119F}$, the drain terminal of $M_{117F}$, and the gate terminal of $M_{115F}$. Node 105F is connected to the drain terminal of $M_{119F}$ and it is the output terminal, $IO_{100F}$, of the RGC-CM.

The details of various functions of the circuit in FIG. 1F, which is RGC-$CM_{100F}$ coupled with $CSGA_{100F}$ is now described. The $I_{119F}$ flows through $M_{131F}$, whose $V_{GS}$ is the same as that of $M_{117F}$, which mirrors and scales $v \times ID_{M131F} = u \times ID_{M117F}$. For descriptive clarity, it is assumed that current source scale factors of q=o=1, n=p=2, and the MOSFET scale factors of r=0.0625, s=t=u=w=1, and v=1. As such, $ID_{M109F} \approx 1i$ flows through $M_{M113F}$, which subtracts from $I_{111F} \approx 2i$ thus leaving $ID_{M115F} \approx 1i$. Consequently, $ID_{M115F} \approx 1i$ subtracts from $I_{107F} \approx 2i$ which leaves $ID_{M111F} \approx 1i$.

The $CSGA_{100F}$ of FIG. 1F serves at least two functions, which is first to provide a build-in offset ($\Delta VGS$) that widens the input-output voltage span of the current mirror. The $\Delta VGS \approx VGS_{M115F} - VGS_{M111F} = VDS_{M117F} \approx V_T \times \ln(r/s)$. Note that the build-in offset is chiefly dependent on $V_T$ (generally, constant value at ~26 mV by laws of device physics) and approximately independent of CMOSFET's $V_{TH}$ (note that the value of $V_{TH}$ has normal but wide fluctuations in fabrication manufacturing). The second function of the $CSGA_{100F}$ is to serve as the $A_{AUX}$ as follows. A change in voltage at node 105F which is the output of the current mirror, $\Delta v_{OUT}$, generate a differential current, $\Delta i_{OUT}$, at node 104F. Since $ID_{M117F}$ is constant, then $\Delta i_{OUT}$ causes a voltage change at node 104F, $\Delta v_x$. This $\Delta v_x$ is effectively applied (to a CSA with its inputs as $M_{115F}$-$M_{111F}$) between the nodes 104F ($VDS_{M117F}$) and $V_{SS}$, setting aside the built in offset voltage which is also a constant voltage $\approx V_T \times \ln(r/s)$. With $\Delta v_x$ applied to CSA, an inverse current output change, $-\Delta i_x$ is generated that is fed into a CGA (containing $M_{113F}$ and $I_{M109F}$) that is inherently fast. The $-\Delta i_x$ applied to the output of this CGA (at its high impedance node) generates a negative gained voltage change at node 102F that regulates the $VG_{M119F}$. It can be noted in FIG. 1F that while $\Delta VGS$ can be generated by scaling PMOSFETs, but $\Delta VGS$ is independent of PMOSFET device parameters and it is approximate a function of $V_T$ (thermal voltage).

As indicated earlier, it is possible to connect the gate terminal of $M_{111F}$ (the other input of the CSA) to a secondary bias voltage instead of $V_{SS}$ or GND that established the $VG_{M111F}$ (e.g., $VG_{M111F} + VGS_{M111F} - VGS_{M115F} \approx VDS_{117F} V_{DS}$), which would then allow to make r=s=1. This arrangement would save area since $M_{115F}$ or $M_{111F}$ needs not be scaled, and the secondary bias voltage would facilitate the headroom needed at node 104F Node 101F which is the summing junction of CSA (source terminals of $M_{111F}$ and $M_{115F}$) establishes a DC voltage that biases $VG_{M113F}$ which is the gate terminal of the CGA. The CGAs are inherently fast and CSA output (drain terminal of $M_{115F}$) is fed into the current input of CGA (source terminal of $M_{113F}$). Therefore, the manner of arranging the RGC-$CM_{100F}$ coupled with $CSGA_{100F}$ in FIG. 1F serves the function of auxiliary amplifier and can speed up its dynamic response.

In summary, voltage movements, $\Delta v_{OUT}$, at node 105F (output terminal of the current mirror) cause a voltage, $\Delta v_x$, at node 104F. The $\Delta v_x$ would cause a negative change in current, $-\Delta i_x$, in node 103F, which in turn cause a gained voltage change at the output of the $CSGA_{100F}$, $\approx -\Delta i_x \times R_{OUT\,aux} \approx -G \times \Delta v_x$ at node 102F, which is the gate of $M_{119F}$. As a result, the source voltage of $M_{119F}$ follows its gate voltage, thereby regulating the voltage at node 104F until $\Delta v_x \rightarrow$ near zero again and as such the $R_{OUT}$ of the RGC-CM can be increased in this arrangement.

The gain, 'G', of the RGC-CM amplifier is approximately $G \propto V_A/V_T$, since FETs operate in the subthreshold region. The $R_{out}$ of RGC-CM is approximately $\propto g_m^2 \times r_{ds}^3 \propto (V_A/V_T)^2 \times (V_A/I_D)$. As stated earlier, the $R_{OUT}$ of RGC-CM on actual silicon will be lower due to second order effects such as η (subthreshold slope factor) and substrate leakage, amongst other factors.

In summary, the benefits of the FIG. 1F RGC-$CM_{100F}$ coupled with $CSGA_{100F}$ include the following. First, same channel type FETs are utilized in the current mirrors ($M_{117F}$, $M_{119F}$) and CGA (containing $M_{113F}$), whose device parameters match and track, and hence benefiting the amplifier's DC, AC, and transient specifications stability over fabrication process, temperature, and power supply variations. The generated built-in offset is made using PMOSFETs where the offset voltage is chiefly a function $V_T$, and it is independent of PMOSFET device parameters (because they operate in the subthreshold region). Second, the bias voltages in the RGC-$CM_{100F}$ coupled with $CSGA_{100F}$ are self biased (i.e., no need for separate voltages to set its internal bias nodes), which lowers complexity and current consumption. Third, it has low transistor count (i.e., it is small) and low current because its' auxiliary amplifier's gain function and the widening of input-output voltage span is achieved by 3 FETS ($M_{111F}$, $M_{113F}$, and $M_{115F}$) and 3 current sources ($I_{103F}$, $I_{107F}$, and $I_{109F}$) where each current source can be made of a single FET. Fourth, headroom to the rails can be set (e.g., $V_T \times \ln(r/s)$ above $V_{SS}$) independent of the auxiliary amplifier, and practically be programmed or pre-determined to have a range of, for example, 50 mV to 150 mV above $V_{SS}$. Therefore, the input-output voltage span of the current mirror is widened. As noted earlier, for sub-1V power supply environments, every 100 mV extra headroom in the current mirror translates to 10% extra operating room at the current mirror output.

Section (IV): Detailed Description of Amplifier ($AMP_{100A}$) is Illustrated in FIG. 1A, Utilizing Plurality of RGC-$CM_{100B}$ Coupled with $DCSC_{100B}$ as Illustrated in FIG. 1B FIG. 1A is a circuit schematic showing a embodiment of a folded cascode transconductance amplifier (FCTA) that utilizes the plurality of RGC-$CM_{100B}$ coupled with $DCSC_{100B}$ illustrated in FIG. 1B. When the RGC-$CM_{100B}$ coupled with $DCSC_{100B}$ is utilized in the FCTA, it expands the amplifier's input-output voltage span and increases its output impedance ($R_{OUT}$) which in turn increases the amplifier's gain ($A_V$). Beside higher gain and wider input-output voltage span, the other improvements associated with RGC-$CM_{100B}$ coupled with $DCSC_{100B}$, are carried over to the amplifier which improve he amplifier's gain, enables its input and output to operate rail-to-rail, lower its cost, lower its power, and increase its speed.

Note that alternative amplifier embodiments are possible such as an amplifier with NMOS input stage or complementary (PMOS and NMOS) rail-to-rail input stages, other amplifier topologies that are not FCTA, amongst others. The connections of the elements of $AMP_{100A}$ of FIG. 1A are described as follows. The body terminal of all NMOSFETs in FIG. 1A are connected to node 2 that is the $V_{SS}$, and the body terminals of PMOSFETs are connected to node 1 that is the $V_{DD}$. The upper terminals of the bias current sources $I_{108A}$, $I_{109A}$, $I_{110A}$, $I_{111A}$, $I_{101A}$, $I_{103A}$, $I_{105A}$, and $I_{M107A}$ are connected to node 1 that is $V_{DD}$. Bias current sources $I_{100A}$, $I_{102A}$, $I_{104A}$, and $I_{106A}$ have their lower terminals connected to node 2 that is $V_{SS}$. The source terminal of PMOSFETs $M_{100A}$, $M_{106A}$, $M_{110A}$, and $M_{116A}$ are connected to node 1 which is the positive supply voltage, $V_{DD}$. The source terminal of NMOSFETs $M_{122A}$, $M_{126A}$, $M_{101A}$, $M_{107A}$, $M_{111A}$, and $M_{117A}$ are connected to the negative supply voltage, $V_{SS}$. Node 100A is connected to the gate terminal of $M_{120A}$. Node 101A is connected to the gate terminal of $M_{121A}$. Node 100A is the $V_{IN+}$ terminal of the amplifier and node 101A is the $V_{IN-}$ terminal of the amplifier. Node 102 is connected to the source terminal of $M_{120A}$, the source terminal of $M_{121A}$, and the lower terminal of $I_{108A}$. Node 103A is connected to the drain terminal of $M_{122A}$, the gate terminal of $M_{125A}$, and the lower terminal of $I_{109A}$. Node 104A is connected to the drain terminal of $M_{123A}$, the gate terminal of $M_{123A}$, the gate terminal of $M_{124A}$, and the lower terminal of $I_{110A}$. Node 105A is connected the drain terminal of $M_{124A}$, the source terminal of $M_{123A}$, and the gate terminal of $M_{122A}$. Node 106A is connected to the drain terminal of $M_{126A}$, the source terminal of $M_{125A}$, and the source terminal of $M_{124A}$. Node 107A is connected to the drain terminal of $M_{125A}$, the lower terminal of $I_{111A}$, the gate terminal of $M_{126A}$, the gate terminal of $M_{107A}$, and the gate terminal of $M_{117A}$. Node 108A is connected to the drain terminal of $M_{107A}$, the source terminal of $M_{109A}$, and the source terminal of $M_{103A}$ as well as the drain terminal of $M_{120A}$. Node 109A is connected to the source terminal of $M_{119A}$, and the source terminal of $M_{117A}$ as well as the drain terminal of $M_{121A}$. Node 110A is connected to the drain terminal of $M_{101A}$, the gate terminal of $M_{109A}$, and the lower terminal of $I_{101A}$. Node 111A is connected to the drain terminal of $M_{105A}$, the gate terminal of $M_{105A}$, the gate terminal of $M_{103A}$, and the lower terminal of $I_{103A}$. Node 112A is connected the drain terminal of $M_{103A}$, the source terminal of $M_{105A}$, and the gate terminal of $M_{101A}$. Node 113A is connected to the drain terminal of $M_{108A}$, the gate terminal of $M_{106A}$, the gate terminal of $M_{116A}$, and the drain terminal of $M_{109A}$. Node 114A is connected to the drain terminal of $M_{111A}$, the gate terminal of $M_{119A}$, and the lower terminal of $I_{105A}$. Node 115A is connected to the drain terminal of $M_{115A}$, the gate terminal of $M_{115A}$, the gate terminal of $M_{113A}$, and the lower terminal of $I_{107A}$. Node 116A is connected the drain terminal of $M_{113A}$, the source terminal of $M_{115A}$, and the gate terminal of $M_{111A}$. Node 117A is connected to the drain terminal of $M_{102A}$, the source terminal of $M_{104A}$, and the gate terminal of $M_{100A}$. Node 118A is connected to the drain terminal of $M_{100A}$, the gate terminal of $M_{108A}$, and the upper terminal of $I_{100A}$. Node 119A is connected to the drain terminal of $M_{106A}$, the source terminal of $M_{108A}$, and the source terminal of $M_{102A}$. Node 120A is connected to the drain terminal of $M_{104A}$, the gate terminal of $M_{104A}$, the gate terminal of $M_{102A}$, and the upper terminal of $I_{102A}$. Node 121A is connected to the drain terminal of $M_{116A}$, the source terminal of $M_{118A}$, and the source terminal of $M_{112A}$. Node 122A is connected to the drain terminal of $M_{110A}$, the gate terminal of $M_{118A}$, and the upper terminal of $I_{104A}$. Node 123A is connected to the drain terminal of $M_{114A}$, the gate terminal of $M_{114A}$, the gate terminal of $M_{114A}$, and the upper terminal of $I_{106A}$. Node 124A is connected the drain terminal of $M_{112A}$, the source terminal of $M_{114A}$, and the gate terminal of $M_{110A}$. The high impedance (high gain) output of $AMP_{100A}$ is $V_{OUT}$, which is node 125A that is connected to the drain terminal of $M_{118A}$, and the drain terminal of $M_{119A}$.

Note that five RGC-$CM_{100B}$ coupled with $DCSC_{100B}$ are utilized in the amplifier, $AMP_{100A}$, embodiment of FIG. 1A. The NMOS ones are $RGC_{101A}$ containing $M_{122A}$-$M_{123A}$-$M_{124A}$-$M_{125A}$-$M_{126A}$-$I_{109A}$-$I_{110A}$; $RGC_{102A}$ containing $M_{101A}$-$M_{103A}$-$M_{105A}$-$M_{107A}$-$M_{109A}$-$I_{101A}$-$I_{103A}$; and $RGC_{103A}$ containing $M_{111A}$-$M_{113A}$-$M_{115A}$-$M_{117A}$-$M_{119A}$-$I_{105A}$-$I_{107A}$. The PMOS ones are $RGC_{104A}$ containing $M_{100A}$-$M_{102A}$-$M_{104A}$-$M_{106A}$-$M_{108A}$-$I_{100A}$-$I_{102A}$; and $RGC_{105A}$ containing $M_{110A}$-$M_{112A}$-$M_{114A}$-$M_{116A}$-$M_{118A}$-$I_{104A}$-$I_{106A}$. It would be possible that $AMP_{100A}$ could function properly without $RGC_{101A}$ and $RGC_{104A}$, which can be substituted with diode connected cascodes for current mirrors. The $RGC_{101A}$ and $RGC_{104A}$ are added in the embodiment of FIG. 1A, in part, for better systematic matching considerations and improved AC performance. Note that, in order to avoid repeating how the amplifier is benefited by each of $RGC_{101A}$ to $RGC_{105A}$, the explanation of one RGC-CM (e.g., $RGC_{103A}$) is deemed sufficient, regarding the function of RGC-CM (coupled with DCSC) in the main amplifier, FCTA.

For explanation regarding RGC-$CM_{100B}$ coupled with $DCSC_{100B}$ refer to its detailed description, but below is a brief description of how they operate and benefit a FCTA. The FCTA has generally 3 parts, 'common source amplifier' (CSA), 'common gate amplifier' (CGA), and a current mirror (CM). The $V_{IN}$ is applied to a differential CSA, containing $M_{120A}$ and $M_{121A}$, whose output feed the CGA, containing $M_{109A}$ and $M_{119A}$. The differential outputs of this CGA feed the CM, made up of $M_{106A}$ and $M_{116A}$, to make a single ended output, $V_{OUT}$ which is also the high impedance node (125A) of FCTA. The current $I_{111A}$=i controls $VGS_{M126A}$ that establishes $I_{M126A}$, which is mirrored and scaled onto $I_{M107A}$=$I_{M117A}$=3i. The CSA's input currents $I_{M120A} \approx M_{121A} \approx i$ are fed into the source terminals of $M_{109A}$ and $M_{119A}$, respectively, which are the differential inputs of the CGAs. The $I_{103A}=i$ and $I_{105A}=i$ flow through the DCSCs of $RGC_{102A}$ and $RGC_{103A}$, respectively, which are passed onto $M_{107A}$ and $M_{117A}$, and in that order. Therefore, the operating currents of CGA's (containing $M_{109A}$ and $M_{119A}$) are $I_{M109A} \approx I_{M107A} - I_{103A} - I_{M120A} \approx 3i-2i=i$ and $I_{M119A} \approx I_{M117A} - I_{105A} - I_{M121A} \approx 3i-2i=i$. As explained in the RGC-CM coupled with DCSC in previous section regarding $RGC_{103A}$, the auxiliary amplifier (composed of $M_{111A}$-$I_{105A}$) regulates the $VG_{M119A}$ which increase the output impedance of the RGC-CM. This same discussion is applicable to $RGC_{102A}$, $RGC_{104A}$, and $RGC_{105A}$. As a result, effectively, the output impedance and gain of CGAs and current mirrors in FCTA is increased. Note that main amplifier's $R_{OUT} \propto r_o \times (r_o \times g_m)^2$ and $A_v$ is $\propto R_{OUT} \times g_{mi}$. Hence, $A_v \propto (r_o \times g_m)^3$, in the subthreshold region of operations for CMOS. To save current consumption, note that $A_v$ can be increased by raising only $I_{108A}$ and $I_{111A}$, instead of increasing the current consumption of the whole amplifier, given that $A_v$ is $\propto R_{OUT} \times g_{mi}$, and $g_{mi}$ is the input stage transconductance that is about $\propto I_{108A}/V_T$ Moreover, the DC common mode range of the main amplifier inputs ($M_{120A}$ and $M_{121A}$) is expanded because, with the DC voltage shift generated by the DCSCs in $RGC_{102A}$ and $RGC_{103A}$, the $V_{108A}$ and $V_{109A}$ can get closer to the rails. The DC voltage shift generated in DCSC of $RGC_{103A}$ is approximately, $VGS_{M113A} - VGS_{M115A} = \Delta VGS \approx VDS_{M113A} \approx V_T \times \ln(r/s)$. Hence, $V_{109A} \approx VGS_{M111A} - V_T \times \ln(r)$ from the negative rail.

Figure 1H:
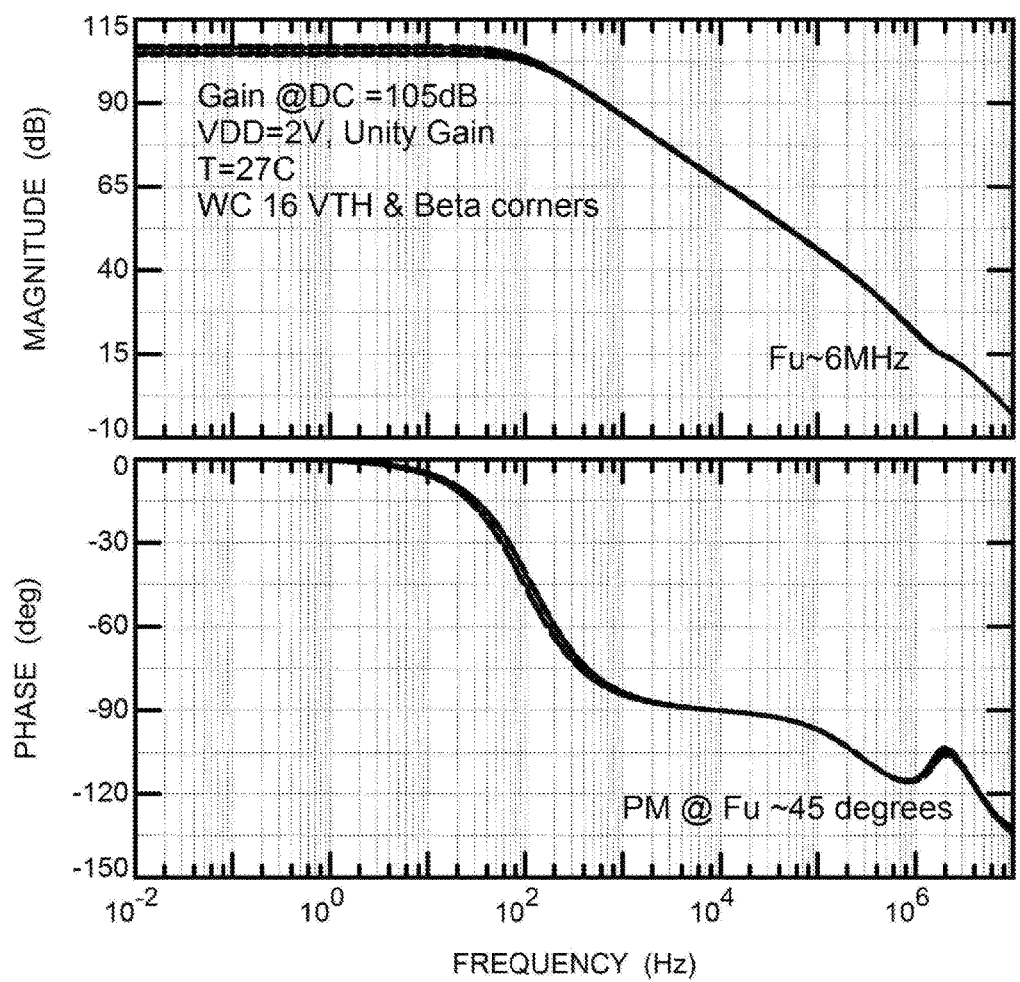
FIG. 1H is a circuit simulation showing a frequency response of the amplifier illustrated FIG. 1A.
Figure 1:
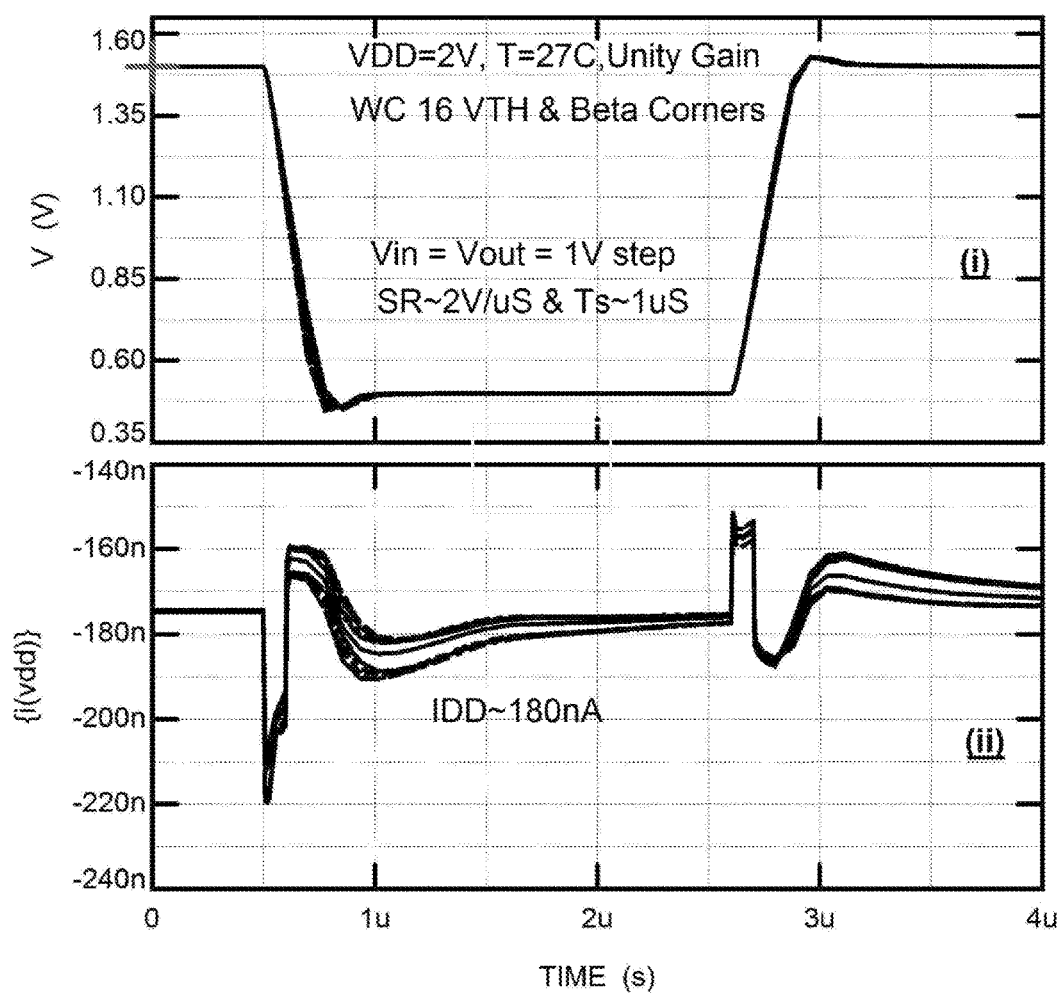
FIG. 1I is a circuit simulation showing a transient response and current consumption of the amplifier illustrated FIG. 1A.
FIG. 1J is a circuit simulation showing a frequency response of the amplifier illustrated FIG. 1C.
FIG. 1K is a circuit simulation showing a transient response and current consumption of the amplifier illustrated FIG. 1C.
FIG. 1L is a circuit simulation showing a frequency response of the amplifier illustrated FIG. 1E.
FIG. 1M is a circuit simulation showing a transient response and current consumption of the amplifier illustrated FIG. 1E.
Figure 1J:
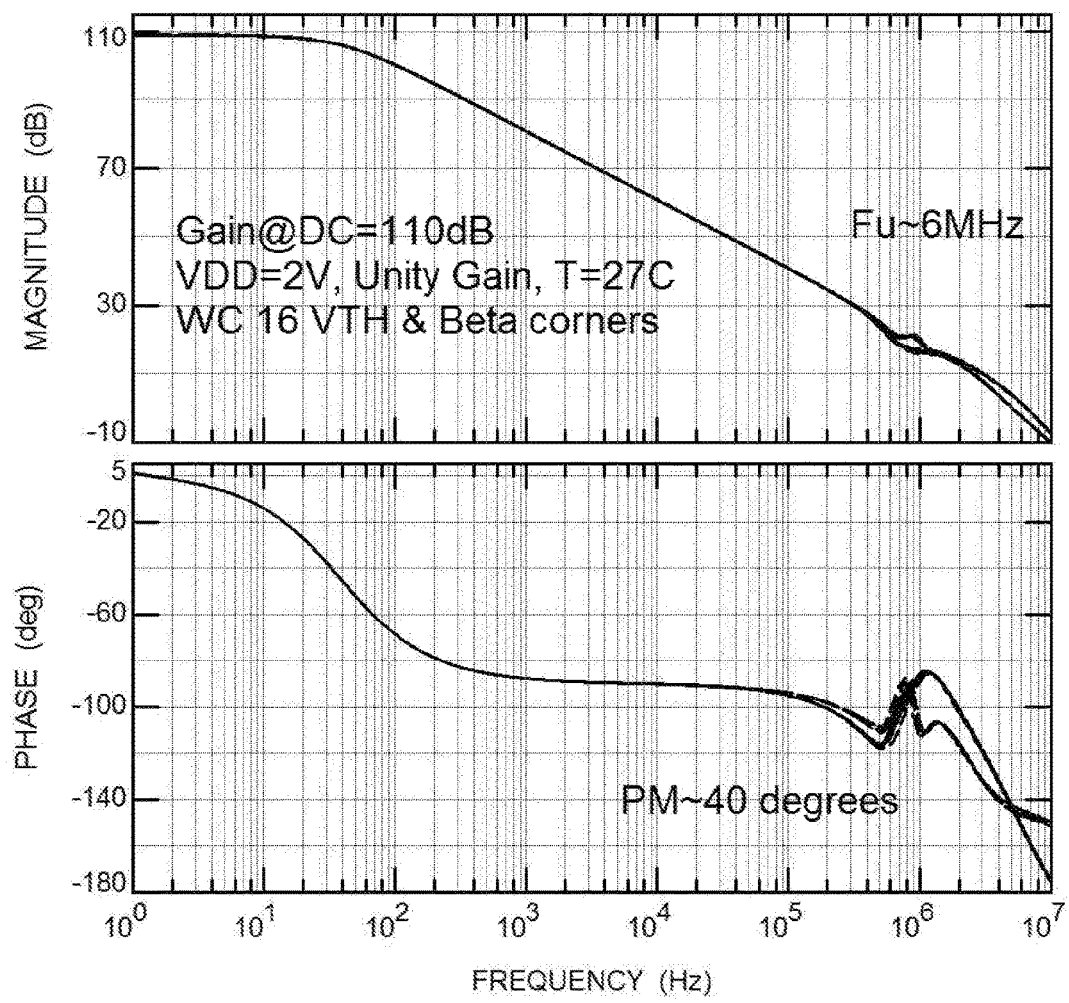
Figure 1K:
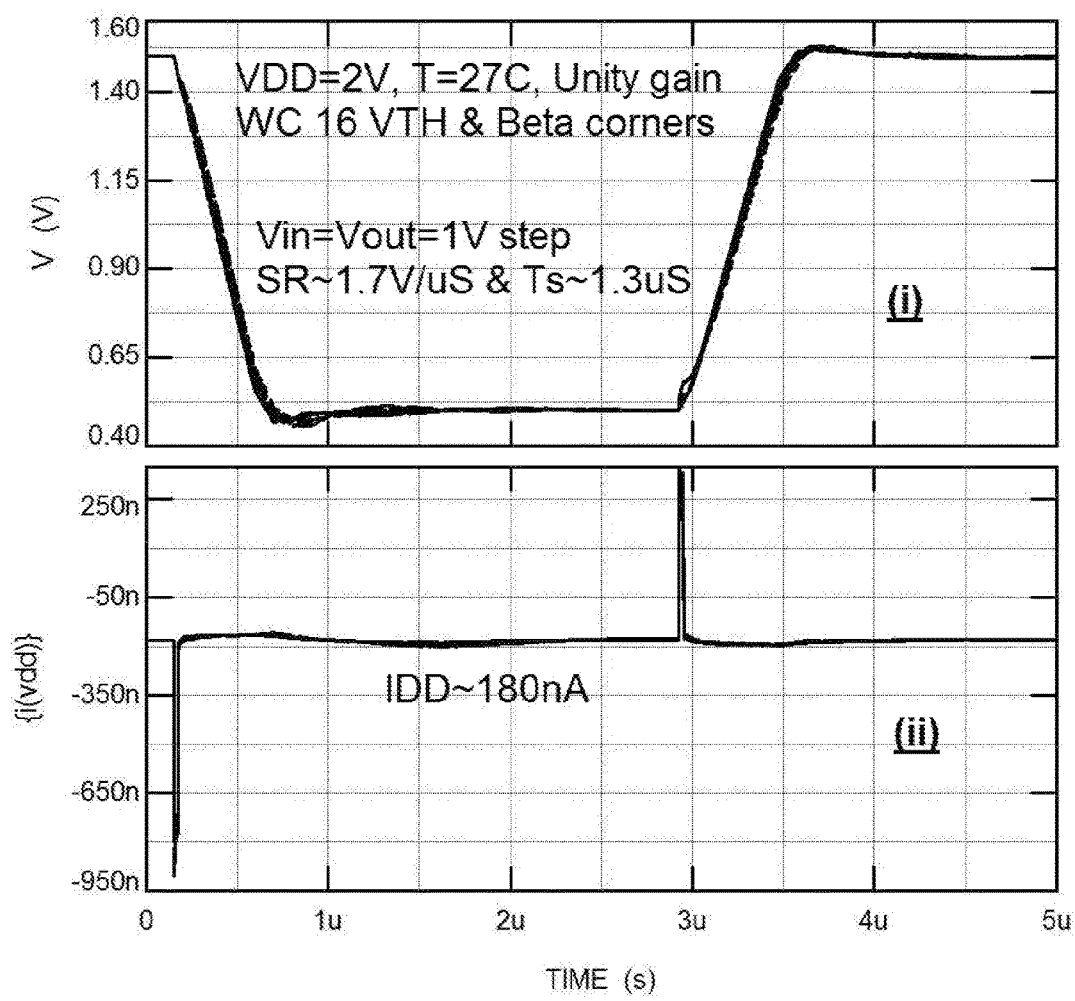

Additionally, the same type of FETs (e.g., NMOSFETs) are utilized in the CGAs function, the DC voltage shift function that expands the $V_{OUT}$ span, and the auxiliary amplifier function that increases $R_{OUT}$ of the RGC-CM. Utilizing the same type of FETs here, improves the consistency of DC, AC, and transient performance over temperature, power supply, and process variations. FIG. 1H illustrates a worst case (WC) AC simulation of FIG. 1A that $A_v \sim 105$ dB, $P_M \sim 45°$ is achievable. FIG. 1I upper graph (i) is the WC transient simulation of FIG. 1A indicating that SR$\sim 2$V/μS and $t_s \sim 1$ μS is achievable. Moreover, FIG. 1I lower graph (ii) indicates current consumption of $\sim 180$ nano Ampere is achievable for FIG. 1A circuit.

In summary, besides increasing an amplifier's gain, the benefits of utilizing plurality of $RGC-CM_{100B}$ coupled with $DCSC_{100B}$ in an amplifier are as follows. First, the same type (e.g., NMOSFET) FETs are used in each of the main amplifier's CGA, and RGC-CM's auxiliary amplifiers plus DCSCs. Given that same type (e.g., NMOSFET) FET's device parameters match and track each other, therefore the FCTA's consistency of DC and AC specifications and stability is improved over fabrication process, temperature, and power supply variations. Second, each of the amplifier's $RGC_{101A}$ to $RGC_{105A}$ are self biased (i.e., no need for separate voltages to set its internal bias nodes) saving current and die space. Third, the listed benefits of $RGC-CM_{100B}$ coupled with $DCSC_{100B}$ (see previous section) carry over to the amplifier, including small size, low current, and faster dynamic response. Fourth, the DC voltage shift provided in the $RGC-CM_{100B}$ coupled with $DCSC_{100B}$ widen the amplifier's input-output span closer to the rails. As stated before, for example, a 75 mV head-room expansion at the input and output of each of the upper PMOS and the lower NMOS based $RGC-CM_{100B}$ coupled with $DCSC_{100B}$, can expand the voltage span at the input of the amplifier as well as at the high gain (impedance) node of FCTA by 150 mV or 15%, which is beneficial especially in the sub-1V power supply environment.

Section (V): Detailed Description of Amplifier ($AMP_{100C}$) in FIG. 1C Utilizing Plurality of $RGC-CM_{100D}$ Coupled with $ICMA_{100D}$, as illustrated in FIG. 1D FIG. 1C is a circuit schematic showing a embodiment of an folded cascode transconductance amplifier (FCTA) that utilizes plurality of $RGC-CM_{100D}$ coupled with $ICMA_{100D}$, illustrated in FIG. 1D. When $RGC-CM_{100D}$ coupled with $ICMA_{100D}$ is utilized in an amplifier, it can expand its input and output voltage span and increase its output impedance, $R_{OUT}$, which in turn increases the amplifier's gain, $A_v$. Also, the benefits of $RGC-CM_{100D}$ coupled with $ICMA_{100D}$ are carried over to improve the amplifier with low power and higher speed. Note that alternative amplifier embodiments are possible such as an amplifier with NMOS input stage or complementary rail-to-rail input stages, other amplifier topologies that are not FCTA, amongst others.

The connections of the elements in FIG. 1C are described as follows: The body terminal of all NMOSFETs in FIG. 1C are connected to node 2 which is $V_{SS}$, and the body terminals of PMOSFETs are connected to node 1 which is $V_{DD}$. The upper terminals of the bias current sources $I_{101C}$, $I_{103C}$, $I_{105C}$, $I_{107C}$, $I_{109C}$, $I_{110C}$, $I_{111C}$, $I_{M112C}$, and $I_{M113C}$ are connected to node 1, which is $V_{DD}$. Bias current sources $I_{100C}$, $I_{102C}$, $I_{104C}$, $I_{106C}$, and $I_{108C}$ have their lower terminals connected to node 2, which is $V_{SS}$. The source terminal of PMOSFETs $M_{100C}$, $M_{102C}$, $M_{106C}$, $M_{110C}$, $M_{112C}$, $M_{116C}$, and $M_{120C}$ are connected to node 1 which is $V_{DD}$. The source terminal of NMOSFETs $M_{124C}$, $M_{125C}$, $M_{128C}$, $M_{101C}$, $M_{103C}$, $M_{107C}$, $M_{111C}$, $M_{113C}$, $M_{117C}$, and $M_{121C}$ are connected to node 2 which is $V_{SS}$. Node 100C is the $V_{IN+}$ terminal of the amplifier and connected to the gate terminal of $M_{122C}$. Node 101C is the $V_{IN-}$ terminal of the amplifier and connected to the gate terminal of $M_{123C}$. Node 102C is connected to the source terminals of $M_{122C}$, and $M_{123C}$. Node 103C is connected to the drain terminal of $M_{122C}$, the drain terminal of $M_{107C}$, the source terminal of $M_{105C}$, and the source terminal of $M_{109C}$. Node 104C is connected to the drain terminal of $M_{123C}$, the drain terminal of $M_{117C}$, the source terminal of $M_{115C}$, and the source terminal of $M_{119C}$. Node 105C is connected to the drain terminal of $M_{100C}$, the gate terminal of $M_{108C}$, and the upper terminal of $I_{100C}$. Node 106C is connected to the drain terminal of $M_{102C}$, the gate terminal of $M_{102C}$, the drain terminal of $M_{104C}$, and the upper terminal of $I_{102C}$. Node 107C is connected to the drain terminal of $M_{108C}$, the drain terminal of $M_{109C}$, the gate terminal of $M_{106C}$, and the gate terminal of $M_{116C}$. Node 108C is connected to the drain terminal of $M_{106C}$, and the source terminal of $M_{104C}$, the source terminal of $M_{108C}$. Node 109C is connected to the drain terminal of $M_{110C}$, the gate terminal of $M_{118C}$, and the upper terminal of $I_{104C}$. Node 110C is connected to the drain terminal of $M_{112C}$, the gate terminal of $M_{112C}$, the drain terminal of $M_{114C}$, and the upper terminal of $I_{106C}$. Node 111C is connected to the drain terminal of $M_{116C}$, the source terminal of $M_{114C}$, and the source terminal of $M_{118C}$. Node 112C is connected to the drain terminal of $M_{120C}$, the gate terminal of $M_{120C}$, the gate terminal of $M_{114C}$, the gate terminal of $M_{104C}$, and the upper terminal of $I_{108C}$. Node 113C is connected to the drain terminal of $M_{124C}$, the gate terminal of $M_{127C}$, and the lower terminal of $I_{111C}$. Node 114C is connected to the drain terminal of $M_{125C}$, the gate terminal of $M_{125C}$, the drain terminal of $M_{126C}$, and the lower terminal of $I_{112C}$. Node 115C is connected to the drain terminal of $M_{127C}$, the lower terminal of $I_{113C}$, the gate terminal of $M_{128C}$, the gate terminal of $M_{107C}$, and the gate terminal of $M_{117C}$. Node 116C is connected to the drain terminal of $M_{128C}$, and the source terminal of $M_{127C}$, the source terminal of $M_{126C}$. Node 117C is connected to the drain terminal of $M_{101C}$, the gate terminal of $M_{109C}$, and the lower terminal of $I_{101C}$. Node 118C is connected to the drain terminal of $M_{103C}$, the gate terminal of $M_{103C}$, the drain terminal of $M_{105C}$, and the lower terminal of $I_{103C}$. Node 119C is connected to the drain terminal of $M_{111C}$, the gate terminal of $M_{119C}$, and the lower terminal of $I_{105C}$. Node 120C is connected to the drain terminal of $M_{113C}$, the gate terminal of $M_{113C}$, the drain terminal of $M_{115C}$, and the lower terminal of $I_{107C}$. Node 121C is the high impedance high gain node or the output, $V_{OUT}$, of the amplifier and connected to the drain terminal of $M_{118C}$, and the drain terminal of $M_{119C}$. Node 122C is connected to the drain terminal of $M_{121C}$, the gate terminal of $M_{115C}$, the gate terminal of $M_{105C}$, the gate terminal of $M_{126C}$, the gate terminal of $M_{121C}$, and the lower terminal of $I_{109C}$.

Note that five RGC-$CM_{100D}$ coupled with $ICMA_{100D}$ are utilized in the amplifier of FIG. 1C. The NMOS ones are $RGC_{101C}$ made up of $M_{124C}$-$M_{125C}$-$M_{126C}$-$M_{127C}$-$M_{128C}$-$I_{111C}$-$I_{112C}$; $RGC_{102C}$ made up of $M_{101C}$-$M_{103C}$-$M_{105C}$-$M_{107C}$-$M_{109C}$-$I_{101C}$-$I_{103C}$; and $RGC_{103C}$ made up of $M_{111C}$-$M_{113C}$-$M_{115C}$-$M_{117C}$-$M_{119C}$-$I_{105C}$-$I_{107C}$. The PMOS ones are $RGC_{104C}$ made up of $M_{100C}$-$M_{102C}$-$M_{104C}$-$M_{106C}$-$M_{108C}$-$I_{100C}$-$I_{102C}$; and $RGC_{105C}$ made up of $M_{110C}$-$M_{112C}$-$M_{114C}$-$M_{116C}$-$M_{118C}$-$I_{104C}$-$I_{106A}$. It would be possible that the amplifier of FIG. 1A would function properly without $RGC_{101C}$ and $RGC_{104C}$, which can be substituted with diode connected cascodes. The $RGC_{101C}$ and $RGC_{104C}$ are added in the embodiment of FIG. 1C, in part, for better matching considerations and improved AC performance. Note that, in order to avoid repeating how the amplifier is benefited by each of $RGC_{101C}$ to $RGC_{105C}$, the explanation of one RGC-CM (e.g., $RGC_{103C}$) is deemed sufficient, regarding the function of RGC-$CM_{100D}$ coupled with $ICMA_{100D}$ in the FCTA.

For explanation regarding RGC-$CM_{100D}$ coupled with $ICMA_{100D}$ refer to its detailed description. A general description is provided for more context in how utilizing RGC-$CM_{100D}$ coupled with $ICMA_{100D}$ can improve the amplifier's performance. In the amplifier embodiment of FIG. 1C, the $V_{IN}$ is applied to a differential CSA, containing $M_{122C}$ and $M_{123C}$, whose current outputs feed a differential CGA, containing $M_{109C}$ and $M_{119C}$. Then, the differential current outputs of this CGA feed a 'current mirror', made up of $M_{106C}$ and $M_{116C}$, to make a single ended output, $V_{OUT}$. The RGC-$CM_{100D}$ coupled with $ICMA_{100D}$ (of FIG. 1D) is chiefly utilized in the CGAs and 'current mirrors' of the FCTA of FIG. 1C, in order to increase the amplifier's output impedance, expand its input-output voltage span, which helps the FCTA's dynamic response at low power.

Via $M_{127C}$ and $M_{128C}$, the current $I_{113C} \approx i$ is mirrored and scaled onto $ID_{M107C} \approx ID_{M117C} \approx 3i$. The FCTA input currents $I_{M122C} \approx I_{M123C} \approx i$ (part of CSA) are fed into the source terminals of $M_{109C}$ and $M_{119C}$, respectively, which are the differential inputs of the CGAs. The $I_{103C} = 2i$ and $I_{107C} = 2i$ flow through ICMAs of $RGC_{102C}$ and $RGC_{103C}$, respectively, and passed onto $M_{107C}$ and $M_{117C}$, and in that order. Therefore, the operating currents of CGA's are $ID_{M109C} \approx ID_{M107C} - I_{103C} - ID_{M103C} - ID_{M122C} \approx i$ and $I_{M119C} \approx ID_{M117C} - I_{107C} - ID_{M113C} - ID_{M123C} \approx i$. As explained in the RGC-$CM_{100D}$ coupled with $ICMA_{100D}$ section, the auxiliary amplifier function (performed by ICMA containing $M_{115C}$, $M_{113C}$, $M_{111C}$, $I_{107C}$, and $I_{107C}$) regulates the $VG_{M119C}$ which increase the output impedance and gain of FCTA's CGA (containing $M_{111C}$), and thereby increases the $R_{OUT}$ and gain ($A_v$) of the FCTA at node 121C. Note that main amplifier's $R_{OUT} \propto r_o \times (r_o \times g_m)^2$ and $A_v$ is $\propto R_{OUT} \times g_{mi}$. Hence, $A_v \propto (r_o \times g_m)^3$, with the amplifier FETs operating in the subthreshold region. To save current consumption, note that amplifier's gain can be increased by raising only $I_{110C}$ and $I_{113C}$, instead of increasing the current consumption of the whole amplifier, given that $A_v$ is $\propto R_{OUT} \times g_{mi}$, and $g_{mi}$ is the input stage transconductance that is roughly $\propto I_{110C}/V_T$.

Moreover, the DC common mode range of the main amplifier inputs ($M_{122C}$ and $M_{123C}$) is expanded. The $M_{105C}$ and $M_{115C}$ source terminals sense the 103C and 104C signals in current mode. The DC input and output range of the amplifier is limited by $V_{103C}$ and $V_{104C}$, which can be predetermined by the gate voltages of $M_{105C}$ and $M_{115C}$, which are set by the scale and current of $M_{121C}$. As such, $VGS_{121C} - VGS_{115C} = VGS_{121C} - VGS_{105C} = \Delta VGS \approx VDS_{M117C} \approx VDS_{M107C} \approx V_T \times \ln(r/n)$, which enable the input and output voltages of the amplifier to can get much closer to the rails. Additionally, note that the same type of FETs (e.g., NMOSFETs) are utilized in the CGAs function, the DC voltage shift function that expands the $V_{IN}$ and $V_{OUT}$ span, plus the auxiliary amplifier function (performed by ICMA) that increases $R_{OUT}$ of $RGC_{103C}$ and $RGC_{105C}$ (and hence raises the $A_v$ of the amplifier) which improves consistency of DC, AC, and transient performance over temperature, power supply, and process variations In summary, besides providing the extra gain, the benefits of utilizing plurality of RGC-$CM_{100D}$ coupled with $ICMA_{100D}$ in an amplifier are as follows. First, the same type (e.g., NMOSFET) FETs are used in each of the main amplifier's common gate amplifiers (CGA), and RGC-CM's auxiliary amplifiers ($A_{AUX}$) whose function is accomplished by the ICMAs. Given that for example the NMOSFET device parameters match and track each other better, therefore the consistency and stability of the main amplifier's DC, AC, and transient specifications are improved over fabrication process, temperature, and power supply variations. If for example CGA was based on NMOFETS, and $A_{AUX}$ was based on mix of PMOSFETs and NMSOFETs, then that would increase the risk of inconsistencies in the amplifier's performance in the long run in manufacturing. FIG. 1J illustrates a worst case (WC) AC simulation of FIG. 1C that $A_v \sim 110$ dB (i.e., gain of over 315,000), and $P_M \sim 40°$ is achievable with the amplifier utilizing the plurality of RGC-CM coupled with ICMA. FIG. 1K upper graph (i) is the WC transient simulation of FIG. 1C indicating that SR~1.7 V/μS and $t_s \sim 1.3$ μS is achievable with the amplifier of FIG. 1C utilizing the plurality of RGC-CM coupled with ICMA. Moreover, FIG. 1K lower graph (ii) indicates current consumption of ~180 nano Ampere (i.e., one over one billion of an Ampere) is achievable with the amplifier of FIG. 1C utilizing the plurality of RGC-CM coupled with ICMA. Second, the aforementioned benefits (see prior section) of the same RGC-$CM_{100D}$ coupled with $ICMA_{100D}$ is utilized in the amplifier in repeated (plurality of) instances, which carries over its benefits to the amplifier including small size, low current, and higher speed. Third, the DC voltage shift provided in the RGC-$CM_{100D}$ coupled with $ICMA_{100D}$ widens the amplifier's rail to rail span, which is beneficial especially in the sub-1V power supply environment where every 10 mV, of extra voltage swing closer to the rails, counts.

Section (VI): Detailed Description of Amplifier (AMP$_{100E}$) Utilizing Plurality of RGC-CM$_{100F}$ Coupled with CSGA$_{100F}$, as Illustrated in FIG. 1F FIG. 1E is a circuit schematic showing a embodiment of a folded cascode transconductance amplifier (FCTA) that utilizes plurality of RGC-CM$_{100F}$ coupled with CSGA$_{100F}$ of FIG. 1F that is described in the previous sections. When RGC-CM$_{100F}$ coupled with CSGA$_{100F}$ is utilized in a FCTA, it expands the input-output voltage span and increases the amplifier's output impedance which in turn increases its gain (A$_v$). Also, the other benefits of RGC-CM$_{100F}$ coupled with CSGA$_{100F}$, are carried over to improve the FCTA performance including small size, low cost, low power, and higher speed.

Note that alternative amplifier embodiments may be possible such as an amplifier with NMOS input stage or complementary (PMOS and NMOS) rail-to-rail input stages, other amplifier topologies that are not folded cascode transconductance, amongst others.

The connections of the elements in FIG. 1E are described as follows. The body terminal of all NMOSFETs in FIG. 1E are connected to node 2 which is V$_{SS}$, and the body terminals of PMOSFETs are connected to node 1 which is V$_{DD}$. Bias current sources I$_{101E}$, I$_{103E}$, I$_{104E}$, I$_{107E}$, I$_{109E}$, I$_{110E}$, I$_{113E}$, I$_{115E}$, and I$_{119E}$ have their upper terminals connected to node 1, which is V$_{DD}$. The lower terminal of I$_{100E}$, I$_{102E}$, I$_{106E}$, I$_{108E}$, I$_{117E}$, I$_{105E}$, and I$_{111E}$ are connected to node 2, which is V$_{SS}$. Node 1 is also connected to the drain terminal of M$_{100E}$, the gate terminal of M$_{100E}$, the drain terminal of M$_{M110E}$, and the gate terminal of M$_{110E}$. Also, node 2 is connected to the drain terminal of M$_{123E}$, the gate terminal of M$_{123E}$, the drain terminal of M$_{101E}$, the gate terminal of M$_{101E}$, the drain terminal of M$_{111E}$, and the gate terminal of M$_{111E}$. The source terminal of M$_{131E}$, M$_{107E}$, and M$_{117E}$ are connected to node 2 that is V$_{SS}$. The source terminal of M$_{106E}$ and M$_{116E}$ are connected to node 1 that is V$_{DD}$. Node 101E is connected to gate terminal of M$_{120E}$, and it is the positive side of the amplifier's input voltage terminal, or V$_{IN+}$. Node 102E is connected to gate terminal of M$_{121E}$, and it is the negative side of the amplifier's input voltage terminal, or V$_{IN-}$. Node 103E is connected to source terminal of M$_{120E}$, the source terminal of M$_{121E}$, and the lower terminal of current source I$_{112E}$. Node 104E is connected to the drain terminal of M$_{120E}$, the source terminal of M$_{109E}$, the drain terminal of M$_{107E}$, and the gate terminal of M$_{105E}$. Node 105E is connected to the drain terminal of M$_{121E}$, the source terminal of M$_{119E}$, the drain terminal of M$_{117E}$, and the gate terminal of M$_{115E}$. Node 106E is connected to source terminal of M$_{100E}$, the source terminal of M$_{104E}$, the gate terminal of M$_{102E}$, and the upper terminal of current source I$_{100E}$. Node 108E is connected to drain terminal of M$_{102E}$, the gate terminal of M$_{108E}$, and the upper terminal of I$_{102E}$. Node 107E is connected to source terminal of M$_{M102E}$, the drain terminal of M$_{104E}$, and the lower terminal of I$_{104E}$. Node 109E is connected to the source terminal of M$_{108E}$, the drain terminal of M$_{106E}$, and the gate terminal of M$_{104E}$. Node 110E is connected to the drain terminal of M$_{109E}$, the drain terminal of M$_{108E}$, the gate terminal of M$_{106E}$, the gate terminal of M$_{116E}$. Node 111E is connected to source terminal of M$_{110E}$, the source terminal of M$_{114E}$, the gate terminal of M$_{112E}$, and the upper terminal of current source I$_{106E}$. Node 112E is connected to the source terminal of M$_{112E}$, the drain terminal of M$_{114E}$, and the lower terminal of I$_{110E}$. Node 113E is connected to drain terminal of M$_{112E}$, the gate terminal of M$_{118E}$, the upper terminal of I$_{108E}$. Node 114E is connected to the source terminal of M$_{118E}$, the drain terminal of M$_{116E}$, and the gate terminal of M$_{114E}$. Node 115E is connected to the drain terminal of M$_{119E}$, the drain terminal of M$_{118E}$, and it is the output of the amplifier, V$_{OUT}$. Node 116E is connected to source terminal of M$_{123E}$, the source terminal of M$_{127E}$, the gate terminal of M$_{125E}$, and the lower terminal of current source I$_{113E}$. Node 117E is connected to drain terminal of M$_{125E}$, the gate terminal of M$_{129E}$, and the lower terminal of I$_{115E}$. Node 118E is connected to source terminal of M$_{125E}$, the drain terminal of M$_{127E}$, and the upper terminal of I$_{117E}$. Node 119E is connected to the drain terminal of M$_{129E}$, the gate terminal of M$_{131E}$, the gate terminal of M$_{107E}$, and the gate terminal of M$_{117E}$. Node 120E is connected to the source terminal of M$_{129E}$, the drain terminal of M$_{131E}$, and the gate terminal of M$_{127E}$. Node 121E is connected to source terminal of M$_{101E}$, the source terminal of M$_{105E}$, the gate terminal of M$_{103E}$, and the lower terminal of current source I$_{101E}$. Node 122E is connected to drain terminal of M$_{103E}$, the gate terminal of M$_{109E}$, and the lower terminal of I$_{103E}$. Node 123E is connected to source terminal of M$_{103E}$, the drain terminal of M$_{105E}$, and the upper terminal of I$_{105E}$. Node 124E is connected to source terminal of M$_{111E}$, the source terminal of M$_{115E}$, the gate terminal of M$_{113E}$, and the lower terminal of current source I$_{107E}$. Node 125E is connected to drain terminal of M$_{M113E}$, the gate terminal of M$_{119E}$, and the lower terminal of I$_{109E}$. Node 126E is connected to source terminal of M$_{113E}$, the drain terminal of M$_{115E}$, and the upper terminal of I$_{111E}$.

Note that there are five of RGC-CM$_{100F}$ coupled with CSGA$_{100F}$ that are utilized in the amplifier embodiment of FIG. 1E. The lower ones on the NMOS side of FCTA current mirrors are RGC$_{101E}$ made up of M$_{123E}$-M$_{125E}$-M$_{127E}$-M$_{129E}$-M$_{131E}$-I$_{113E}$-I$_{115E}$-I$_{117E}$; RGC$_{102E}$ made up of of M$_{101E}$-M$_{103E}$-M$_{105E}$-M$_{107E}$-M$_{109E}$-I$_{101E}$-I$_{103E}$-I$_{105E}$; and RGC$_{103E}$ made up of M$_{111E}$-M$_{113E}$-M$_{115E}$-M$_{117E}$-M$_{119E}$-I$_{107E}$-I$_{109E}$-I$_{111E}$. On the PMOS side of FCTA current mirrors there are RGC$_{104E}$ made up of M$_{100E}$-M$_{102E}$-M$_{104E}$-M$_{106E}$-M$_{108E}$-I$_{100E}$-I$_{102E}$-I$_{104E}$; and RGC$_{105E}$ made up of M$_{110E}$-M$_{112E}$-M$_{114E}$-M$_{116E}$-M$_{118E}$-I$_{106E}$-I$_{108E}$-I$_{110E}$. It would be possible that the amplifier of FIG. 1E would function properly without RGC$_{101E}$ and RGC$_{104E}$, which can be substituted with diode connected cascodes. The RGC$_{101E}$ and RGC$_{104E}$ are utilized in the amplifier of FIG. 1E, in part, for systematic matching considerations and improved AC performance. Note that, in order to avoid repeating how the amplifier is benefited by each of RGC$_{101E}$ to RGC$_{105E}$, the explanation of one RGC-CM$_{100F}$ coupled with CSGA$_{100F}$ (e.g., RGC$_{103E}$) is deemed sufficient, regarding its function in the FCTA.

For explanation regarding RGC-CM$_{100F}$ coupled with CSGA$_{100F}$, refer to its detailed description. A general description is provided for more context in how utilizing RGC-CM$_{100F}$ coupled with CSGA$_{100F}$ can improve the main amplifier's performance. The V$_{IN}$ is applied to a differential CSA, containing M$_{120E}$ and M$_{121E}$, whose current outputs feed a differential CGA, containing M$_{109A}$ and M$_{119A}$. The differential current outputs of this CGA feed a current mirror function containing M$_{106E}$ and M$_{116E}$, to make a single ended output, V$_{OUT}$. For the FCTA during steady state, the current I$_{119E}$≈i controls VGS$_{M131E}$ that establishes ID$_{M131E}$, which is mirrored and scaled onto ID$_{M107E}$≈ID$_{M117E}$≈2i. The FCTA's CSA input currents I$_{M120E}$≈M$_{121E}$≈i are fed into the source terminals of M$_{109E}$ and M$_{119E}$, respectively, which are the differential inputs of the CGAs. At node 105E, the ID$_{M120E}$≈1i subtracts from ID$_{M117E}$≈2i which provides for ID$_{M119E}$≈1i. At node 104E, the ID$_{M121E}$≈i subtracts from ID$_{M107E}$≈2i which provides for ID$_{M109E}$≈1i. As explained in the RGC-CM coupled with composite amplifier in previous sections, the $A_{AUX}$ (containing $M_{113E}$-$I_{109E}$) regulates the $VG_{M119E}$ which increases $R_{OUT}$ of $RGC_{103E}$. Similar discussion in applicable to role of $RGC_{102E}$, $RGC_{104E}$, and $RGC_{105E}$ in FCTA here. As a result, effectively, the output impedance and gain of CGAs and current mirrors in FCTA are increased, and thereby the $R_{OUT}$ and gain ($A_v$) of the FTCA are increased at node 115E. Note that main amplifier's $R_{OUT}$ is about $\propto r_o \times (r_o \times g_m)^2$ and $A_v$ is about $\propto R_{OUT} \times g_{mi} \propto (r_o \times g_m)^3$, in the subthreshold region of operations. To save current consumption, note that $A_v$ can be increased by raising only $I_{112E}$ and $I_{119E}$, instead of increasing the current consumption of the FCTA, given that $A_v$ is $\propto R_{OUT} \times g_{mi}$, and $g_{mi}$ is the input stage transconductance that is roughly $\propto I_{112E}/V_T$. Moreover, the input DC common mode range of the FCTA ($M_{120E}$ and $M_{121E}$) is expanded because, with the built-in offsets (generated by the scaled $M_{101E}$-$M_{105E}$ and $M_{111E}$-$M_{115E}$) in $RGC_{102E}$ and $RGC_{103E}$, the $V_{104E}$ and $V_{105E}$ can get closer to $V_{SS}$. As noted earlier, this built-in offsets in for example $RGC_{103E}$ is approximately, $VGS_{M111E}$-$VGS_{M115E} = \Delta VGS \approx VDS_{M117E} \approx V_T \times \ln(r/s)$. Hence, by proper scaling and operating current in $M_{120E}$-$M_{121E}$, the inputs of FCTA can span to the negative rail, $V_{SS}$.

The voltage span of the output of FCTA is also improved. The built in offset in PMOSFETs in $RGC_{101E}$ to $RGC_{103E}$ is chiefly a function of $V_T$ and mostly independent of PMOSFET device parameters, such as PMOSFET $V_{TH}$. Similarly, the built in offset in NMOSFETs in $RGC_{104E}$ and $RGC_{105E}$ is chiefly a function of $V_T$ and mostly independent of NMOSFET device parameters, such as NMOSFET $V_{TH}$. Therefore, the voltages at nodes 104E, 105E, 109E, and 114E are mostly independent of MOSFET device parameters, and track each other given that they are mostly a function of $V_T$. Therefore, maximum $V_{OUT}$ is approximately $\leq V_{DD} - V_T \times \ln(r/s) - VDS_{M118E\text{-}sat}$. Also, minimum $V_{OUT}$ is approximately $\leq V_{SS} + V_T \times \ln(r/s) + VDS_{M119E\text{-}sat}$.

The amplifier is improved in consistency of DC, AC, and transient performance over temperature, power supply, and process variations, in part because the auxiliary amplifier ($A_{AUX}$) function in each of $RGC\text{-}CM_{100F}$ coupled with $CSGA_{100F}$ is made of the same channel FET as the FCTA's CGA and current mirror. The fact that the built-in offset for all RGC-CM (coupled with composite amplifier) is mostly a function of $V_T$ also helps reduce systematic mismatches in the FCTA signal path and helps improve FCTA performance over temperature, power supply, and process variations.

Figure 1L:
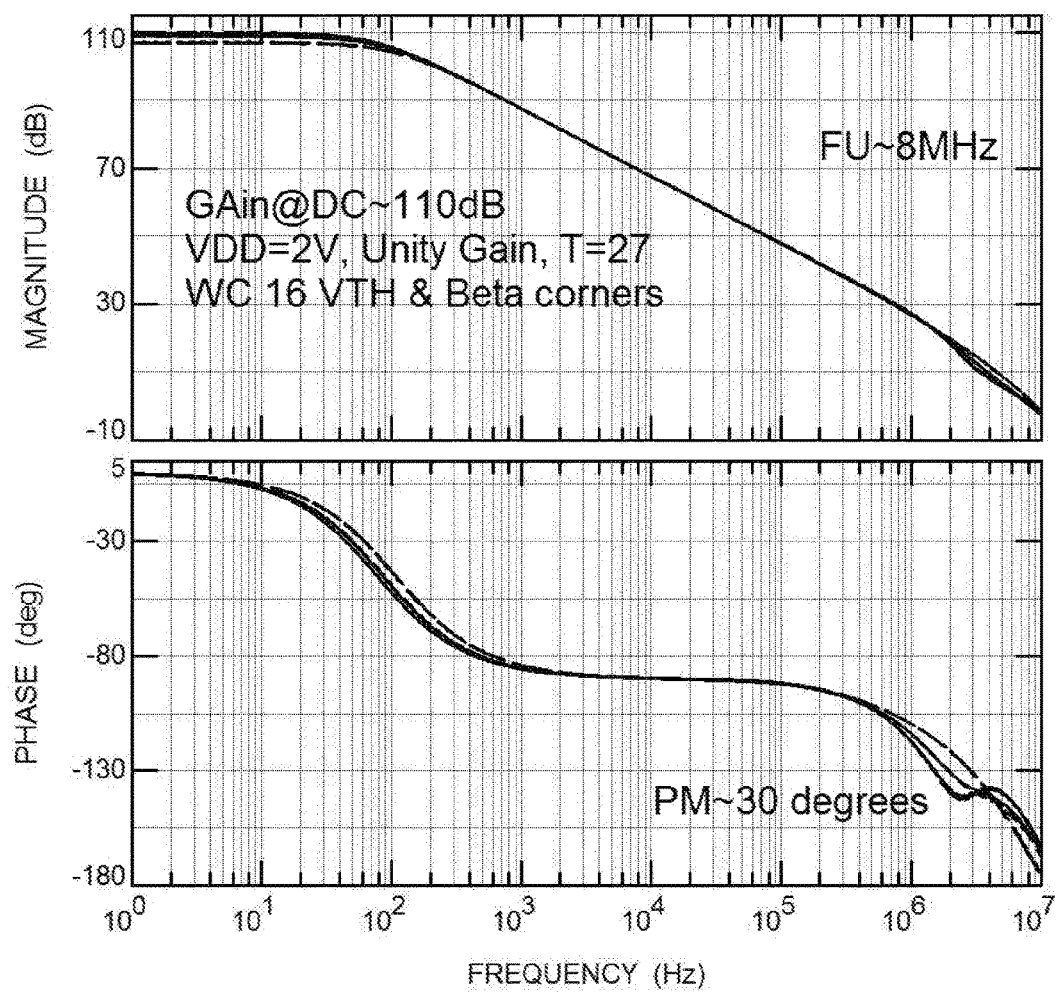
Figure 1M:
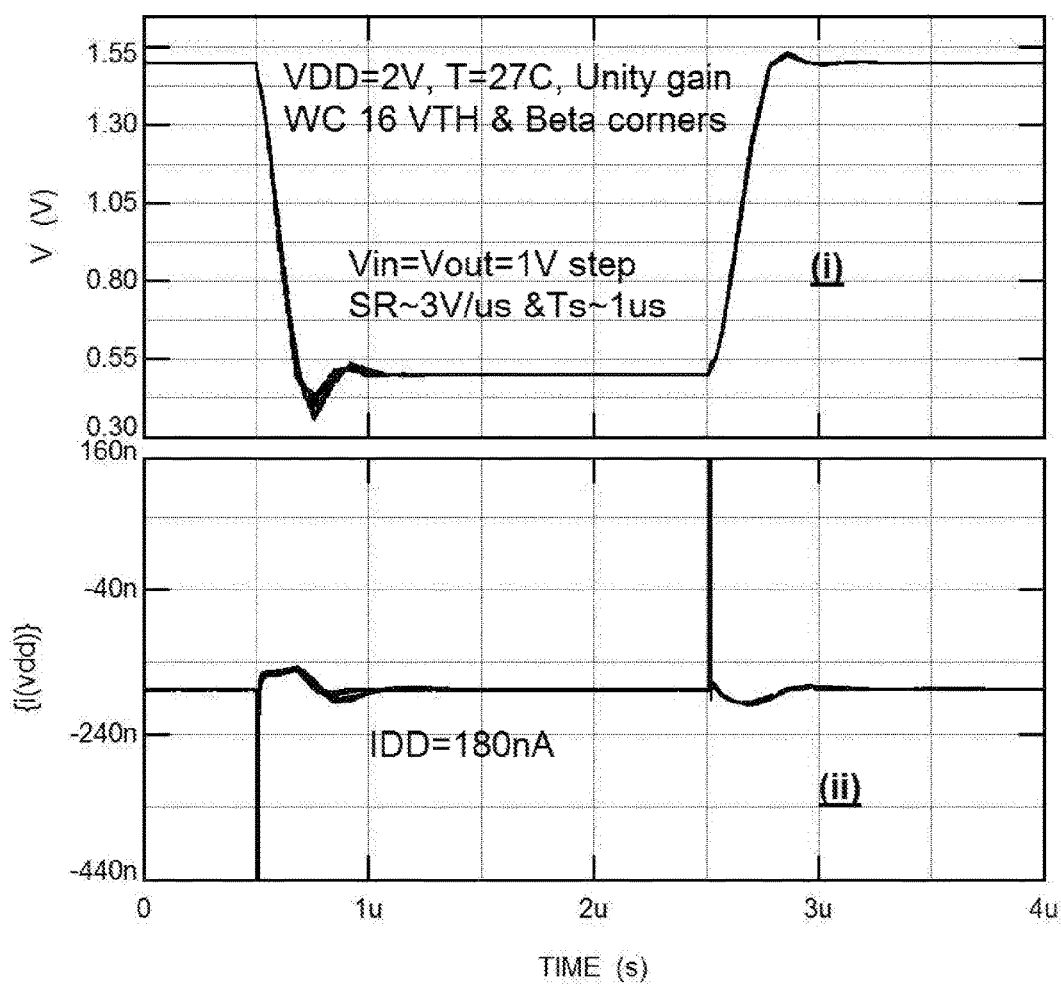

FIG. 1L illustrates a worst case (WC) AC simulation of FIG. 1E that $A_v \sim 110$ dB, $P_M \sim 30°$ is achievable with the FCTA after utilizing the plurality of RGC-CMs coupled with composite amplifiers. FIG. 1M upper graph (i) is the WC transient simulation of FIG. 1E indicating that SR~3V/µS and $t_s \sim 1$ µS is achievable with the FCTA after utilizing the plurality of RGC-CMs coupled with composite amplifiers. Moreover, FIG. 1M lower graph (ii) indicates current consumption of ~180 nano Ampere is achievable with the FCTA after utilizing the plurality of RGC-CMs coupled with composite amplifiers.

In summary, besides providing the extra gain, the benefits of utilizing RGC with composite amplifier in the main amplifier include the following. First, the same type of FETs are used in FCTA's CGA and current mirrors and those used in RGC-CM's $A_{AUX}$. The build-in offset in RGC-CM is generated by PMOSFET and NMOSFET. However, the build-in offset itself is roughly independent of either PMOSFET and NMOSFET device parameters such as CMOSFET $V_{TH}$. The build-in offset is mostly a function of $V_T$ which is highly predictable and insensitive to process variations. Therefore the FCTA's DC and AC specifications and stability is improved over fabrication process, temperature, and power supply variations. Second, each of the amplifier's $RGC_{101E}$ to $RGC_{105E}$ are self biased (i.e., no need for separate voltages to set its internal bias nodes) saving current and die space. Third, the aforementioned benefits of the same RGC-$CM_{100F}$ coupled with $CSGA_{100F}$ that is utilized in the FCTA in repeated instances, carries over to the FTCA the improvements in small size, low current, higher speed, and wider output voltage span as well as consistency of specification performance over fabrication process, temperature, and power supply variations. Fourth, the DC voltage shift provided in the RGC-$CM_{100F}$ coupled with $CSGA_{100F}$ expands the amplifier's DC common mode input and output ranges closer to the rails. As noted earlier, for example, a 75 mV head-room expansion at the input-output of each of the upper PMOS and the lower NMOS of RGC-$CM_{100F}$ coupled with $CSGA_{100F}$, can expand the voltage span at the input-output of the amplifier as well as at the high gain (impedance) node of the FCTA by 150 mV or 15%, which is beneficial especially in the sub-1V power supply environment.

Section (VII): Detailed Description of First Embodiment of an Amplifier of FIG. 2A Utilizing the First Floating Current Source ($FCS_{200A}$)

FIG. 2A is a schematic circuit diagram of the embodiment illustrating an amplifier utilizing the first FCS ($FCS_{200A}$) shown in BLOCK: $FCS_{200A}$ at the left bottom side of FIG. 2A. The embodiment discloses $FCS_{200A}$, which emulates the benefits of a FCS in the amplifier current mirror network, enables the amplifier to operate at low $V_{DD} \geq \sim V_{GS} + 2V_{DS}$, improves matching of upper and lower currents independent of the common mode voltage swings.

The amplifier of FIG. 2A is a conventional folded cascode transconductance amplifier (FCTA) that utilizes $FCS_{200A}$. As indicated in prior sections, broadly speaking, a FCTA is composed of a CSA that converts the input differential voltage to differential currents which are then fed onto a differential input and differential output CGA that is fast. In a FCTA, the differential current outputs of CGA are then steered onto a CM to generate a single output voltage gain at $V_{OUT}$. The amplifier of FIG. 2A has two complementary inputs though, a PMOSFET input and a NMOSFET input, operating in parallel in order to provide rail-to-rail input operations which is consistent with the benefits of this disclosure. This arrangement is chosen so that either the PMOSFET inputs keep on operating when NMOSFETs run out of headroom near the negative rail ($V_{SS}$ or GND), or the NMOSFET inputs keep on operating when PMOSFETs run out of headroom near the positive rail ($V_{DD}$). On the NMOSFET side of FCTA, the $V_{IN}$ is applied to a differential $CSA_{N200A}$ containing $M_{209A}$ and $M_{211A}$. The differential current outputs of $CSA_{N200A}$ then feed into a $CGA_{P200A}$ containing $M_{202A}$-$M_{214A}$ in conjunction with a current mirror ($CM_{P200A}$) containing $M_{200A}$-$M_{212A}$, the combination of which generates a single ended output at node 212A. On the PMOSFET side of FCTA, the $V_{IN}$ is applied to a differential $CSA_{P200A}$ containing $M_{208A}$ and $M_{210A}$. The differential current outputs of $CSA_{P200A}$ then feed into a $CGA_{N200A}$ containing $M_{203A}$-$M_{215A}$ in conjunction with a current mirror ($CM_{N200A}$) containing $M_{201A}$-$M_{213A}$, combination of which generates a single ended output at node 212A, which is the amplifier's high impedance, high gain output ($V_{OUT}$).

There are other amplifier configurations that can utilize this FCS. One such example would be a FCTA with a $g_m$ control circuit to keep the amplifier's input transconductance ($g_m$) constant across input voltage common mode range (VIN$_{CM}$). Another example would be FCTA that utilizes regulated cascode current mirrors (RGCs) to improve the amplifier's performance, including increasing the gain of the amplifier. Note also that in FIG. 2A that the current source scale factors (e.g., 2×i=I$_{205A}$ or 1×i=I$_{201A}$, etc) and MOSFET scale factors (e.g., W/L of M$_{201A}$ versus W/L of M$_{213A}$, or W/L of M$_{204A}$ versus W/L of M$_{202A}$) can be altered for different cost-performance goals, such as speed versus power versus accuracy versus larger die which would cost more.

The connections of the elements in FIG. 2A are described as follows. The body terminal of all NMOSFETs in FIG. 2A are connected to node 2 which is V$_{SS}$, and the body terminals of PMOSFETs are connected to node 1 which is V$_{DD}$. The lower terminals of current sources I$_{200A}$, I$_{202A}$, and I$_{205A}$ are connected to node 2. The upper terminals of current sources I$_{201A}$, I$_{203A}$, and I$_{204A}$ are connected to node 1. The source terminals of M$_{200A}$, M$_{206C}$, and M$_{212A}$ are connected to node 1. The source terminals of M$_{201A}$, M$_{207A}$, and M$_{213A}$ are connected to node 2. Node 200A is connected to gate terminal of M$_{206A}$, the drain terminal of M$_{206A}$, the gate terminal of M$_{204A}$, the gate terminal of M$_{202A}$, and the gate terminal of M$_{214A}$. Node 201A is connected to the gate terminal of M$_{207A}$, the drain terminal of M$_{207A}$, the gate terminal of M$_{205A}$, the gate terminal of M$_{203A}$, and the gate terminal of M$_{215A}$. Node 202A is connected to the gate terminal of M$_{200A}$, the drain terminal of M$_{204A}$, the gate terminal of M$_{212A}$, and the upper terminal of current source I$_{200A}$. Node 203A is connected to the gate terminal of M$_{201A}$, the drain terminal of M$_{205A}$, the gate terminal of M$_{213A}$, and the lower terminal of current source I$_{201A}$. Node 204A is connected to the drain terminal of M$_{209A}$, the drain terminal of M$_{200A}$, the source terminal of M$_{204A}$, the source terminal of M$_{202A}$, and the drain terminal of M$_{203A}$. Node 205A is connected to the drain terminal of M$_{208A}$, the drain terminal of M$_{201A}$, the source terminal of M$_{205A}$, the source terminal of M$_{203A}$, and the drain terminal of M$_{202A}$. Node 206A is connected to the source terminal of M$_{208A}$, the source terminal of M$_{210A}$, and the lower terminal of current source I$_{204A}$. Node 207A is connected to the source terminal of M$_{209A}$, the source terminal of M$_{211A}$, and the upper terminal of current source I$_{205A}$. Node 208A is connected to the drain terminal of M$_{211A}$, the drain terminal of M$_{212A}$, and the source terminal of M$_{214A}$. Node 209A is connected to the drain terminal of M$_{210A}$, the source terminal of M$_{215A}$, and the drain terminal of M$_{M213A}$. Node 210A is connected to the gate terminal of M$_{208A}$, and the gate terminal of M$_{209A}$, and it is the negative input terminal (V$_{IN-}$) of the amplifier. Node 211A is connected to the gate terminal of M$_{210A}$, and the gate terminal of M$_{211A}$, and it is the positive input terminal (V$_{IN+}$) of the amplifier. Node 212A is the high impedance output (high gain node) of the amplifier, V$_{OUT}$, which is connected to the drain terminal of M$_{215A}$, and the drain terminal of M$_{214A}$. To be clear, the BLOCK: FCS$_{200A}$ contains the following FETs: M$_{200A}$, M$_{202A}$, M$_{204A}$, M$_{206A}$, I$_{200A}$, and I$_{202A}$ plus M$_{201A}$, M$_{203A}$, M$_{205A}$, M$_{207A}$, I$_{201A}$, and I$_{203A}$.

One of the reasons for utilizing a FCS (or its equivalent function in an amplifier current mirror network) such as that of a FCTA, is to make the biasing at the summing junction of the FCTA output more insensitive to the common mode voltage swings in order to improve the amplifier's accuracy. The prior art FCS circuit is illustrated in FIG. 2D, I$_{M209D}$+I$_{M208D}$ flow into drains of M$_{202D}$ and M$_{203D}$, and then onto M$_{200D}$ and M$_{201D}$, respectively, thus equalizing the operating currents in M$_{200D}$ and M$_{201D}$ for the FCS. While this prior art FCS circuit in FIG. 2D is simple, but its minimum V$_{DD}$ is restrictive. The minimum V$_{DD}$ of FIG. 2D is the greater of VGS$_{M204D}$30 VGS$_{M206D}$+VDS$_{I202D}$ or ~VGS$_{M205E}$+VGS$_{M207E}$+VDS$_{I203E}$, which is restrictive. The BLOCK: FCS$_{200A}$ at the left bottom side of FIG. 2A, improves the FCS performance including lowering its minimum power supply voltage, and described as follows. For clarity, the operations of the FCS$_{200A}$ independent of the amplifier is described first. Thus, ID$_{M208A}$ and ID$_{M209A}$ are set to zero for now and non-idealities such as device mismatches are set aside. The FCS$_{200A}$ utilizes the first regulating circuit which is made up of M$_{204A}$, and M$_{206A}$, and current sources I$_{200A}$, and I$_{202A}$. Given that VGS$_{M202A}$=VGS$_{M204A}$⇒ID$_{M202A}$≈ID$_{M204A}$≈I$_N$=I$_{200A}$. The second regulating circuit utilized in FCS$_{200A}$ is made up of M$_{205A}$, and M$_{207A}$, and current sources I$_{201A}$, and I$_{203A}$. Also, given that VGS$_{M205A}$=VGS$_{M203A}$⇒ID$_{M205A}$≈ID$_{M203A}$≈I$_P$=I$_{201A}$. The KCL at node 205A computes to ID$_{M205A}$+ID$_{M203A}$+ID$_{M202A}$=ID$_{M201A}$≈2×I$_P$+ID$_{M202A}$≈2×I$_P$+I$_N$. Similarly, the KCL at node 204A computes to ID$_{M204A}$+ID$_{M202A}$+ID$_{M203A}$=ID$_{M200A}$≈2×I$_N$+ID$_{M203A}$≈2×I$_N$+I$_P$. Setting I$_N$=I$_P$≈1×i, results in ID$_{M200A}$≈ID$_{M201A}$≈3×i, which will mirror onto M$_{212A}$ and M$_{213A}$, respectively. If there is a mismatch of 10% and for example I$_P$0.9×i and I$_N$≈1× i⇒ID$_{M200A}$2.8×i and ID$_{M201A}$2.9×i⇒ID$_{M200A}$/ID$_{M201A}$≈97%. As such an error due to mismatch between I$_P$ and I$_N$ is roughly attenuated by a factor of 3 in this FCS$_{200A}$ embodiment. Now that the FCS$_{200A}$ is explained, the operations of the amplifier including the FCS$_{200A}$ is described next.

The steady state operations of the FIG. 2A amplifier that utilizes FCS$_{200A}$ is described first. With the amplifier operating under steady state conditions, on the upper side of the amplifier, ID$_{M209A}$≈ID$_{M211A}$≈1×i. The first regulating circuit, containing M$_{204A}$ and current source I$_{M200A}$, regulate the gate voltage of M$_{200A}$, and the KCL operates on node 204A where ID$_{M200A}$≈ID$_{M204A}$+ID$_{M202A}$+ID$_{M203A}$+ID$_{M209A}$≈4×i . Given that currents through M$_{200A}$ and M$_{212A}$ (≈2×i) are mirrored and scaled, the sum of currents at node 208A would result in ID$_{M214A}$≈ID$_{M212A}$−ID$_{M211A}$≈i. Similarly, in steady state conditions, the amplifier's inputs are balanced and ID$_{M208A}$≈ID$_{M210A}$≈1×i. The second regulating circuit, containing M$_{205A}$ and current source I$_{M201A}$, regulate the gate voltage of M$_{201A}$, and the KCL operates on node 205A where ID$_{M201A}$≈ID$_{M205A}$+ID$_{M203A}$+ID$_{M202A}$+ID$_{M208A}$4×i . Given that currents through M$_{201A}$ and M$_{213A}$ (≈2×i) are mirrored and scaled, the sum of currents at node 209A would result in ID$_{M215A}$≈ID$_{M213A}$−ID$_{M210A}$≈i. Therefore, at the summing gain node 212A of FCTA, operating current are in balance with ID$_{M214A}$≈ID$_{M215A}$≈i.

With regards to node 204A, operating currents ID$_{M202A}$=ID$_{M204A}$≈i and ID$_{M203A}$≈i are held constant, setting aside non-idealities. As the KCL operates on node 204A, an input voltage change (Δv$_{IN}$) at the FCTA amplifier applied across M$_{209A}$-M$_{211A}$ generates a current change (Δi$_N$) in ID$_{M209A}$. This in turn would cause the first regulating circuit (containing M$_{204A}$ and current source I$_{M200A}$) to regulate the gate voltage of M$_{200A}$ which results in the Δi$_N$ to flow into M$_{200A}$, while ID$_{M200A}$ is 'current mirrored' with ID$_{M212A}$ (and scaled). Note that the dynamic response of this current mirror (M$_{200A}$-M$_{212A}$) is also improved. This is because the second regulating circuit containing M$_{204A}$ and current source I$_{M200A}$ is configured as a common gate amplifier (CGA), which is very fast, and whose output drives the gate terminals of M$_{200A}$-M$_{212A}$.

Similarly, with regards to node 205A, as explained earlier, the operating currents ID$_{M203A}$=ID$_{M205A}$≈i and ID$_{M202A}$≈i are held constant, setting aside non-idealities. As the KCL operates on node 205A, an input voltage change ($\Delta v_{IN}$) at FCTA, applied across $M_{208A}$-$M_{210A}$, generates a current change ($\Delta i_P$) in $ID_{M208A}$. This in turn would cause the second regulating circuit (containing $M_{205A}$ and current source $I_{M201A}$) to regulate the gate voltage of $M_{M201A}$ which would result in the $\Delta i_P$ to flow into $M_{M201A}$, while $ID_{M201A}$ is 'current mirrored' with $ID_{M213A}$ (and scaled). Note also that the dynamic response of this current mirror ($M_{201A}$-$M_{213A}$) is improved. Similarly, this is because the second regulating circuit containing $M_{205A}$ and current source $I_{M201A}$ is configured as a common gate amplifier (CGA), which is inherently fast, and whose output drives the gates terminals of $M_{201A}$-$M_{213A}$.

The $FCS_{200A}$ minimum $V_{DD} \geq V_{GS} 2V_{DS}$ is improved using fewer transistors and less current (versus prior art of FIG. 2D where minimum $V_{DD} \geq 2V_{GS} + V_{IDS}$). Note that, in utilizing $FCS_{200A}$, the input common mode span of the amplifier remains wide, given that node 203A, 209A, and 204A, 208a are set a $V_{DS}$ above and below rails.

In summary, the $FCS_{200A}$ block that is utilized in the amplifier of FIG. 2A, operates as follows: the NMOSFET cascode current source ($M_{201A}$ and $M_{203A}$ cascoded on node 205A) and the PMOSFET cascode current source ($M_{200A}$ and $M_{202A}$ cascoded on node 204A) are arranged such that the drain current of $M_{202A}$ is fed into node 205A while the drain current of $M_{203A}$ is fed into node 204A. Concurrently, a first regulating circuit regulates the gate terminal $M_{200A}$, and a second regulating circuit regulates the gate terminal $M_{201A}$ such that the operating currents of $M_{200A}$ and $M_{201A}$ are substantially equalized, while the $FCS_{200A}$ operates with low power supply voltages.

Figure 2E:
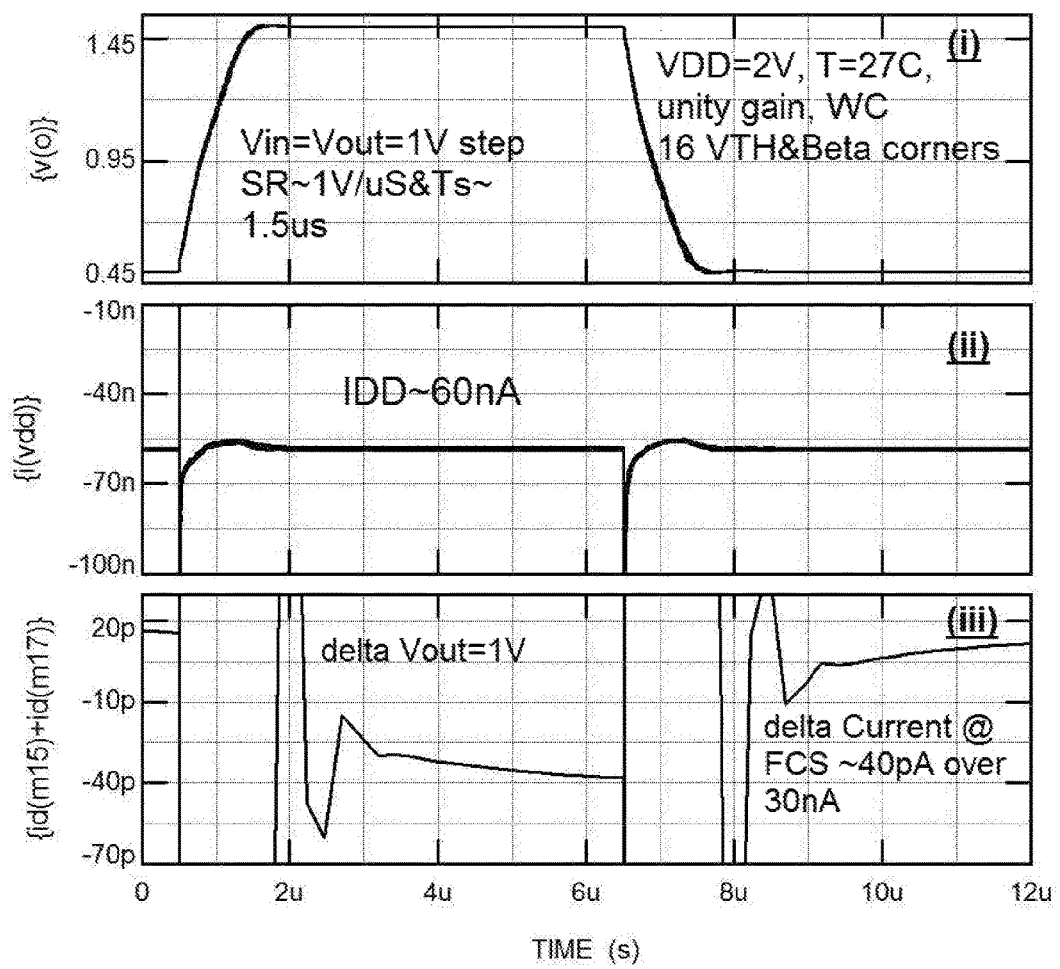
FIG. 2E is a circuit simulation showing transient response, current consumption, and change in the FCS200A current in response to change in input-output voltage of the amplifier illustrated FIG. 2A.

FIG. 2E upper graph (i) is the WC transient simulation of FIG. 2A indicating that SR~1V/µS and $t_s$~1.5 µS is achievable with the FCTA utilizing the first FCS. Moreover, FIG. 2D middle graph (ii) indicates current consumption of ~60 nano Ampere is achievable, and FIG. 2D bottom graph (iii) indicates that with FCTA in unity gain configuration subjected to a 1 volt (V) change in common mode input voltage followed by 1V change in output voltage would cause a ~40 Pico ampere (pA) change in the operating current of FCS, which is about 30 nA.

In conclusion, some of the benefits of utilizing $FCS_{200A}$ in an amplifier may include one or more of the following. First, the FCS can operate at lower power supply, using fewer transistors with less current, which is beneficial for the amplifier that utilizes this FCS. Second, the FCS can provides matching between upper and low cascoded current sources which improves amplifier's performance, including lowering its offset and noise. Third, given the regulating circuit of $FCS_{200A}$ is based on common gate amplifier (CGA) configuration, the dynamic response of the FCS is improved which improves the dynamic response of the amplifier that utilizes it.

Section (VIII): Detailed Description of Second Embodiment of an Amplifier of FIG. 2B Utilizing the Second Floating Current Source ($FCS_{200B}$)

FIG. 2B is a schematic circuit diagram of the embodiment illustrating an amplifier utilizing the second FCS, which is depicted in BLOCK: $FCS_{200B}$ at the left bottom side of FIG. 2B. Similar to the first FCS discussed in the previous sections, the disclosed $FCS_{200B}$, emulating the function of a floating current mirror in the amplifier's current mirror network, here that enables the amplifier to operate at low $V_{DD} \geq \sim V_{GS} + 2V_{DS}$, improves speed, and improve accuracy by making the current matching more independent of common mode voltage swings. Refer to the description provided regarding the FCTA of FIG. 2A in the previous section, which is similar to the amplifier herein FIG. 2B that utilizes $FCS_{200B}$. The $FCS_{200B}$ illustrated in BLOCK: $FCS_{200B}$ (at the left bottom side of FIG. 2B) which also utilizes two cascode current sources, PMOSFETs ($M_{200B}$ and $M_{202B}$) and NMSOFETs ($M_{201B}$ and $M_{203B}$). The upper and lower FETs ($M_{202B}$ and $M_{203B}$) in the two cascodes are criss crossed by feeding the middle PMOSFET ($M_{202B}$) drain current into the middle NMOSFET ($M_{203B}$) source terminal and conversely feeding the middle NMOSFET ($M_{203B}$) drain current into the middle PMOSFET ($M_{202B}$) source terminal. Concurrently, regulating circuits regulate the gate voltages of the upper and lower FETs ($M_{200B}$ and $M_{201B}$) in the two cascodes such that their operating currents ($ID_{M200B}$ and $ID_{M201B}$) are substantially equalized.

As noted in the prior sections, it would be possible that there are other amplifier configurations besides FCTA that can utilize this $FCS_{200B}$. Moreover, note that in FIG. 2B the current source scale factors (e.g., 2×i=$I_{205B}$ or 1×i=$I_{201B}$, etc) and MOSFET scale factors (e.g., W/L of $M_{201B}$ versus W/L of $M_{213B}$, or W/L of $M_{204B}$ and W/L of $M_{202B}$ versus W/L of $M_{216B}$ and W/L of $M_{220B}$) can be altered in aiming for different performance goals, such as speed versus power versus accuracy.

The connections of the elements in FIG. 2B are described as follows. The body terminal of all NMOSFETs in FIG. 2B are connected to node 2 which is $V_{SS}$, and the body terminals of PMOSFETs are connected to node 1 which is $V_{DD}$. The lower terminals of current sources $I_{200B}$, $I_{202B}$, $I_{205B}$, $I_{206B}$, and $I_{208B}$ are connected to node 2. The upper terminals of current sources $I_{201B}$, $I_{203B}$, $I_{204B}$, $I_{207B}$, and $I_{209B}$ are connected to node 1. Source terminals of $M_{200B}$, $M_{206B}$, $M_{212B}$, and $M_{218B}$ are connected to node 1. Source terminals of $M_{201B}$, $M_{207B}$, $M_{215B}$, and $M_{219B}$ are connected to node 2. Node 200B is connected to the gate terminal of $M_{206B}$, the drain terminal of $M_{206B}$, the gate terminal of $M_{202B}$, the gate terminal of $M_{214B}$, and the gate terminal of $M_{220B}$. Node 201B is connected to the gate terminal of $M_{207B}$, the drain terminal of $M_{207B}$, the gate terminal of $M_{203B}$, the gate terminal of $M_{215B}$, and the gate terminal of $M_{221B}$. Node 202B is connected to the drain terminal of $M_{218B}$, the source terminal of $M_{220B}$, and the source terminal of $M_{216B}$. Node 203B is connected to the drain terminal of $M_{219B}$, the source terminal of $M_{221B}$, and the source terminal of $M_{217B}$. Node 204B is connected to the drain terminal of $M_{220B}$, the gate terminal of $M_{218B}$, and the upper terminal of $I_{208B}$. Node 205B is connected to the drain terminal of $M_{221B}$, the gate terminal of $M_{219B}$, and the lower terminal of $I_{209B}$. Node 206B is connected to the drain terminal of $M_{216B}$, the gate terminal of $M_{216B}$, the gate terminal of $M_{204B}$, and the upper terminal of $I_{206B}$. Node 207B is connected to the drain terminal of $M_{217B}$, the gate terminal of $M_{217B}$, the gate terminal of $M_{205B}$, and the lower terminal of $I_{207B}$. Node 208B is connected to the gate terminal of $M_{200B}$, the drain terminal of $M_{204B}$, the gate terminal of $M_{212B}$, and the upper terminal of current source $I_{200B}$. Node 209B is connected to the gate terminal of $M_{201B}$, the drain terminal of $M_{205B}$, the gate terminal of $M_{213B}$, and the lower terminal of current source $I_{201B}$. Node 210B is connected to the drain terminal of $M_{200B}$, the source terminal of $M_{204B}$, the source terminal of $M_{202B}$, the drain terminal of $M_{203B}$, and the drain terminal of $M_{209B}$. Node 211B is connected to the drain terminal of $M_{201B}$, the source terminal of $M_{203B}$, the source terminal of $M_{205B}$, the drain terminal of $M_{202B}$, and the drain terminal of $M_{208B}$. Node 212B is connected to the source terminal of $M_{208B}$, the source terminal of $M_{210B}$, and the lower terminal of current source $I_{204B}$. Node 213B is connected to the source terminal of $M_{209B}$, the source terminal of $M_{211B}$, and the upper terminal of current source $I_{205B}$. Node 214B is connected to the drain terminal of $M_{211B}$, the drain terminal of $M_{212B}$, and the source terminal of $M_{214B}$. Node 215B is connected to the drain terminal of $M_{210B}$, the source terminal of $M_{214B}$, and the drain terminal of $M_{215B}$. Node 216B is connected to the gate terminal of $M_{208B}$, and the gate terminal of $M_{209B}$, and it is the negative input terminal ($V_{IN-}$) of the amplifier. Node 217B is connected to the gate terminal of $M_{210B}$, and the gate terminal of $M_{211B}$, and it is the positive input terminal ($V_{IN+}$) of the amplifier. Node 218B is the high impedance output (high gain node) of the amplifier, $V_{OUT}$, which is connected to the drain terminal of $M_{214B}$, and the drain terminal of $M_{215B}$. To be clear, the BLOCK $FCS_{200B}$ containing the following: $M_{200B}$, $M_{202B}$, $M_{204B}$, $M_{206B}$, $M_{216B}$, $M_{218B}$, $M_{220B}$, $I_{200B}$, $I_{202B}$, $I_{206B}$, on the top side and $I_{208B}$ plus $M_{201B}$, $M_{203B}$, $M_{205B}$, $M_{207B}$, $M_{217B}$, $M_{219B}$, $M_{221B}$, $I_{201B}$, $I_{203B}$, $I_{207B}$, and $I_{209B}$ on the bottom side.

For clarity and consistency with the prior sections, the operations of the $FCS_{200B}$ is described first, independent of that of the amplifier. Thus, $ID_{M208A}$, and $ID_{M209A}$ are assumed to be zero for the purpose of this segment's description, and also non-idealities such as device mismatches are set aside.

The $FCS_{200B}$ top side utilizes the first regulating circuit made up of $M_{204B}$, $M_{206B}$, $M_{216B}$, $M_{218B}$, and $M_{220B}$, and current sources $I_{200B}$, $I_{202B}$, $I_{206B}$, and $I_{208B}$. In this embodiment, the $I_{200B} \approx I_{206B} \approx I_{208B} \approx 1i$ are set as equals constant current sources that bias $VGS_{M204B} \approx VGS_{M220B} \approx VGS_{M216B}$. Applying the KVL to the voltage loop containing $VGS_{M202B} = VGS_{M220B} - VGS_{M216B} + VGS_{M204B} \approx VGS_{M220B}$. Therefore, $ID_{M202B} \approx ID_{M220} \approx 1i$. The first regulating circuit is a current input amplifier, where $VGS_{M206B} - VGS_{M220B} + VGS_{M216B}$ establish the $VG_{M204B}$. As such, $M_{204B}$ and $I_{200B}$ function like a common gate amplifier ($CGA_{P200B}$), which is fast. The output of this $CGA_{P200B}$ regulates $VGS_{M200B}$ at the node 208B until the KCL at node 210B is satisfied, which is when $ID_{M200B} \approx ID_{M202B} + ID_{M203B} + ID_{M204B} + ID_{M209B}$.

The second regulating circuit utilized in the bottom side of $FCS_{200B}$ is made up of $M_{205B}$, $M_{207B}$, $M_{217B}$, $M_{219B}$, and $M_{221B}$, and current sources $I_{201B}$, $I_{203B}$, $I_{207B}$, and $I_{209B}$. Similar to the top side, the $I_{201B} \approx I_{207B} \approx I_{209B} \approx 1i$ are set as equal constant current sources that bias $VGS_{M205B} \approx VGS_{M217B} \approx VGS_{M221}$. Applying the KVL to the voltage loop containing $VGS_{M203B} = VGS_{M221B} - VGS_{M217B} + VGS_{M205B} \approx VGS_{M221B}$. Therefore, $ID_{M203B} \approx ID_{M221} \approx 1i$. The second regulating circuit is a current input amplifier, where $VGS_{M207B} - VGS_{M221B} + VGS_{M217B}$ establish the $VG_{M205B}$. As such, $M_{205B}$ and $I_{201B}$ function like a common gate amplifier ($CGA_{N200B}$), which is fast. The output of this $CGA_{N200B}$ regulates $VGS_{M201B}$ at the node 209B until the KCL at node 211B is satisfied, which is when $ID_{M201B} \approx ID_{M203B} + ID_{M202B} + ID_{M205B} + ID_{M208B}$.

The steady state operations of the FIG. 2B amplifier that utilizes $FCS_{200B}$ is described as follows. In steady state conditions, the amplifier's inputs are balanced and $ID_{M208B} \approx ID_{M210B} \approx 1 \times i$. The first regulating circuit, containing $M_{204B}$ and $I_{M200B}$, regulates the gate voltage of $M_{200B}$ until KCL is satisfied by operating on node 210B where $ID_{M200B} \approx ID_{M204B} + ID_{M203B} + ID_{M202B} + ID_{M209B} \approx 4 \times i$. Given that currents through $M_{200B}$ and $M_{212B}$ ($\approx 2 \times i$) are mirrored and scaled, the sum of currents at node 214B would result in $ID_{M214B} \approx ID_{M212B} - ID_{M211B} \approx i$. Similarly, with the amplifier operating under steady state conditions, on the upper complementary side of the amplifier, $ID_{M209A} \approx ID_{M211A} \approx 1 \times i$. The second regulating circuit, containing $M_{205B}$ and $I_{M201B}$, regulate the gate voltage of $M_{201B}$ until KCL is satisfied by operating on node 211B where $ID_{M201B} \approx ID_{M205B} + ID_{M203B} + ID_{M202B} + ID_{M208B} \approx 4 \times i$. Given that currents through $M_{201B}$ and $M_{213B}$ ($\approx 2 \times i$) are mirrored and scaled, the sum of currents at node 215B would result in $ID_{M215B} \approx ID_{M213B} - ID_{M210B} \approx i$.

With regards to node 210B, operating currents $ID_{M202B} = ID_{M204B} \approx i$ and $ID_{M203B} \approx i$ are held constant, setting aside non-idealities. As the KCL operates on node 210B, an input voltage change ($\Delta v_{IN}$) across $M_{209B}$-$M_{211B}$ generates a current change ($\Delta i_N$) in $ID_{M209B}$ that would cause the first regulating circuit (containing $M_{204B}$ and current source $I_{M200B}$) to regulate the gate voltage of $M_{200B}$. As a result, $\Delta i_N$ would flow into $M_{200B}$, while $ID_{M200B}$ is 'current mirrored' with $ID_{M212B}$ (and scaled). Note that the dynamic response of this current mirror ($M_{200B}$-$M_{212B}$) is also improved. This is because this first regulating circuit containing $M_{204B}$ and current source $I_{M200B}$ is configured as a common gate amplifier (CGA), which is inherently fast, and whose output drives the gate terminals of the current mirror containing $M_{200B}$-$M_{212B}$.

With regards to node 211B, the operating currents $ID_{M203A} = ID_{M205A} \approx i$ and $ID_{M202A} \approx i$ are held constant, setting aside non-idealities. While the KCL operates on node 211B, the input voltage change ($\Delta v_{IN}$) across $M_{208B}$-$M_{210B}$ generates a current change ($\Delta i_P$) in $ID_{M208B}$ which would cause the second regulating circuit (containing $M_{205B}$ and current source $I_{M201B}$) to regulate the gate voltage of $M_{M201B}$. As a result, this $\Delta i_P$ would flow into $M_{M201B}$, while $ID_{M201B}$ is 'current mirrored' with $ID_{M213B}$ (and scaled). Note also that the dynamic response of this current mirror ($M_{201B}$-$M_{213B}$) is improved. This is because this second regulating circuit containing $M_{205B}$ and current source $I_{M201B}$ is configured as a common gate amplifier (CGA), which is very fast, and whose output drives the gates terminals of the current mirror containing $M_{201B}$-$M_{213B}$. The $FCS_{200B}$ minimum $V_{DD} \geq V_{GS} + 2V_{DS}$ is improved compared to the prior art of FIG. 2D where minimum $V_{DD} \geq 2V_{GS} + V_{IDS}$. Note that, in utilizing $FCS_{200B}$, the input common mode span of the amplifier remains wide, given that nodes 203B, 211B, 215B and 202B, 210B, 214B can be set as $V_{DS\_sat}$ above and below rails.

In summary, the $FCS_{200B}$ block that is utilized in the amplifier of FIG. 2B, operates as follows. The NMOSFET cascode current source ($M_{201B}$ and $M_{203B}$ cascoded on node 211B) and the PMOSFET cascode current source ($M_{200B}$ and $M_{202B}$ cascoded on node 210B) are arranged such that the drain current of $M_{202B}$ is fed into node 211B while the drain current of $M_{203B}$ is fed into node 210B. Concurrently, a first regulating circuit regulates the gate terminal $M_{200B}$, and a second regulating circuit regulates the gate terminal $M_{201B}$ such that the operating currents of $M_{200B}$ and $M_{201B}$ are substantially equalized, while the $FCS_{200B}$ operates with low power supply voltages.

Figure 2F:
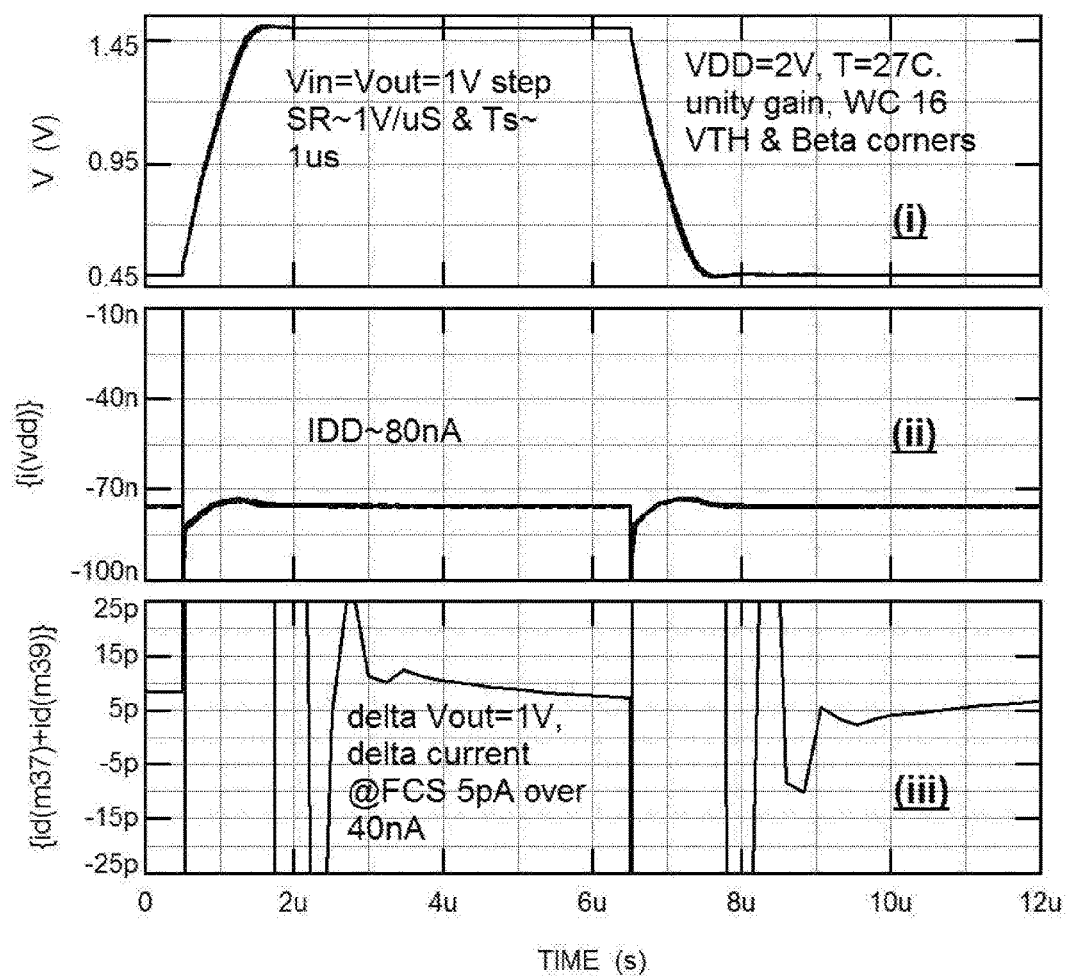
FIG. 2F is a circuit simulation showing transient response, current consumption, and change in the FCS200B current in response to change in input-output voltage of the amplifier illustrated FIG. 2B.

FIG. 2F upper graph (i) is the WC transient simulation of FIG. 2B indicating that SR~1V/µS and $t_s$~1 µS is achievable with the FCTA utilizing the second FCS. Moreover, FIG. 2E middle graph (ii) indicates current consumption of ~80 nano Ampere is achievable, and FIG. 2E bottom graph (iii) indicates that with FCTA in unity gain configuration subjected to a 1 volt (V) change in common mode input voltage followed by 1V change in output voltage would cause a ~5 Pico Ampere (pA) change in the operating current of FCS, which is about 40 nA.

In conclusion, some of the benefits of utilizing $FCS_{200B}$ in an amplifier are the following. First, the FCS can operate at lower power supply which frees the amplifier to operate with lower power supply as well. Second, performance of FCS is improved, including its dynamic response, by separating nodes 207B from 201B and separating nodes 206B from 200B, which helps roughly shield the CGAs used in FCS from transients on nodes 200B and 200B. Hence, the transient response of the amplifier, in which the FCS is utilized, can be improved. Third, the FCS can provides some matching between upper and low cascoded current sources which improves amplifier's performance, including lowering its offset and noise of the amplifier in which the FCS is utilized. Fourth, given the regulating circuit of $FCS_{200B}$ is based on common gate amplifier, the dynamic response of the FCS is improved which improves the dynamic response of the amplifier in which it is utilized.

Section (IX): Detailed Description of Third Embodiment of an Amplifier of FIG. 2C Utilizing the Third Floating Current Source ($FCS_{200C}$)

FIG. 2C is a schematic circuit diagram of the embodiment illustrating an amplifier utilizing the third FCS, which is depicted in BLOCK: $FCS_{200C}$ at the left bottom side of FIG. 2C. Similar to the FCSs discussed in previous sections, the disclosed $FCS_{200B}$ emulates the function of floating current source in the amplifier's current mirror network, here and enables the amplifier to operate at low $V_{DD} \geq \sim V_{GS} 2V_{DS}$, and improve accuracy by making current matching more independent of common mode swings.

As just noted, from a high level functional perspective, the embodiment of $FCS_{200C}$ here is similar to that of $FCS_{200A}$ and $FCS_{200C}$ disclosed in the previous sections. The embodiment of the $FCS_{200C}$ is illustrated in BLOCK: $FCS_{200B}$ (at the left bottom side of FIG. 2C) which also utilizes two cascode current sources, PMOSFETs ($M_{200C}$ and $M_{202C}$) and NMSOFETs ($M_{201C}$ and $M_{203C}$). Here, the middle cascode FETs ($M_{202C}$ and $M_{203C}$) are arranged with their drain and source terminals crisscrossed. As such, the middle PMOSFET ($M_{202C}$) drain current is fed into the middle NMOSFET ($M_{203C}$) source terminal and conversely the middle NMOSFET ($M_{203C}$) drain current is fed into the middle PMOSFET ($M_{202C}$) source terminal. Concurrently, regulating circuits regulate the gate voltages of the upper and lower FETs ($M_{200C}$ and $M_{201C}$) in the two cascodes such that their operating currents ($ID_{M200C}$ and $ID_{M201C}$) are substantially equalized.

As noted in the prior sections, it is possible that there are other amplifier configurations, besides a FCTA amplifier topology, that can utilize this $FCS_{200C}$. Moreover, note that in FIG. 2C, it would be possible that the current source scale factors (e.g., $2\times i=I_{205C}$ or $1\times i=I_{209C}$, etc) and MOSFET scale factors (e.g., W/L of $M_{201C}$ versus W/L of $M_{213C}$, or W/L of $M_{220C}$ versus W/L of $M_{202C}$ or W/L of $M_{205C}$ and W/L of $M_{217C}$) can be altered in aiming for different performance goals, such as speed versus power versus accuracy.

The connections of the elements in FIG. 2C are described as follows. The body terminal of all NMOSFETs in FIG. 2C are connected to node 2 which is $V_{SS}$, and the body terminals of PMOSFETs are connected to node 1 which is $V_{DD}$. The lower terminals of current sources $I_{200C}$, $I_{202C}$, $I_{205C}$, and $I_{208C}$ are connected to node 2. The upper terminals of current sources $I_{201C}$, $I_{203C}$, $I_{204C}$, and $I_{209C}$ are connected to node 1. The source terminals of $M_{200C}$, $M_{206C}$, $M_{212C}$, $M_{218C}$, $M_{222C}$, and $M_{224C}$ are connected to node 1. Source terminals of $M_{201C}$, $M_{207C}$, $M_{213C}$, $M_{219C}$, $M_{223C}$, and $M_{225C}$ are connected to node 2. Node 200C is connected to the gate terminal of $M_{206C}$, the drain terminal of $M_{206C}$, the gate terminal of $M_{202C}$, the gate terminal of $M_{214C}$, the gate terminal of $M_{220C}$, and the upper terminal of $I_{202C}$. Node 201C is connected to the gate terminal of $M_{207C}$, the drain terminal of $M_{207C}$, the gate terminal of $M_{203C}$, the gate terminal of $M_{215C}$, the gate terminal of $M_{221C}$, and the lower terminal of $I_{203C}$. Node 202C is connected to the gate terminal of $M_{216C}$, the drain terminal of $M_{218C}$, and the source terminal of $M_{220C}$. Node 203C is connected to the gate terminal of $M_{217C}$, the drain terminal of $M_{219C}$, and the source terminal of $M_{221C}$. Node 204C is connected to the gate terminal of $M_{218C}$, the drain terminal of $M_{220C}$, and the upper terminal of $I_{208C}$. Node 205C is connected to the gate terminal of $M_{219C}$, the drain terminal of $M_{221C}$, and the upper terminal of $I_{209C}$. Node 206C is connected to the gate terminal of $M_{222C}$, the gate terminal of $M_{224C}$, the drain terminal of $M_{224C}$, and the drain terminal of $M_{204C}$. Node 207C is connected to the gate terminal of $M_{223C}$, the gate terminal of $M_{225C}$, the drain terminal of $M_{225C}$, and the drain terminal of $M_{205C}$. Node 208C is connected to the gate terminal of $M_{200C}$, the gate terminal of $M_{212C}$, the drain terminal of $M_{216C}$, and the drain terminal of $M_{222C}$. Node 209C is connected to the gate terminal of $M_{201C}$, the gate terminal of $M_{213C}$, the drain terminal of $M_{217C}$, and the drain terminal of $M_{223C}$. Node 210C is connected to the drain terminal of $M_{200C}$, the source terminal of $M_{202C}$, the drain terminal of $M_{203C}$, the gate terminal of $M_{204C}$, and the drain terminal of $M_{209C}$. Node 211C is connected to the drain terminal of $M_{201C}$, the source terminal of $M_{203C}$, the drain terminal of $M_{202C}$, the gate terminal of $M_{205C}$, and the drain terminal of $M_{208C}$. Node 212C is connected to the source terminal of $M_{204C}$, the source terminal of $M_{216C}$, and the upper terminal of $I_{200\ C}$. Node 213C is connected to the source terminal of $M_{205C}$, the source terminal of $M_{217C}$, and the lower terminal of $I_{201\ C}$. Node 214C is connected to the source terminal of $M_{208C}$, the source terminal of $M_{210C}$, and the lower terminal of $I_{204\ C}$. Node 215C is connected to the source terminal of $M_{209C}$, the source terminal of $M_{210C}$, and the upper terminal of $I_{205\ C}$. Node 216C is connected to the drain terminal of $M_{212C}$, the source terminal of $M_{214C}$, and the drain terminal of $M_{211\ C}$. Node 217C is connected to the drain terminal of $M_{213C}$, the source terminal of $M_{215C}$, and the drain terminal of $M_{210\ C}$. Node 218C is connected to the gate terminal of $M_{208C}$, the gate terminal of $M_{209C}$, and it is the positive input voltage terminal of the amplifier $V_{IN+}$. Node 219C is connected to the gate terminal of $M_{210C}$, the gate terminal of $M_{211C}$, and it is the negative input voltage terminal of the amplifier $V_{IN-}$. Node 220C is connected to the drain terminal of $M_{214C}$, the drain terminal of $M_{215C}$, and it is the (high gain, high impedance) output voltage terminal of the amplifier $V_{OUT}$. To be clear, the BLOCK $FCS_{200C}$ is made up of the following: top side $M_{200C}$, $M_{202C}$, $M_{204C}$, $M_{206C}$, $M_{216C}$, $M_{218C}$, $M_{220C}$, $M_{222C}$, $M_{224C}$, $I_{200C}$, $I_{202C}$, and the bottom side $I_{208C}$ plus $M_{201C}$, $M_{203C}$, $M_{205C}$, $M_{207C}$, $M_{217C}$, $M_{219C}$, $M_{221C}$, $M_{223C}$, $M_{225C}$, $I_{201C}$, $I_{203C}$, and $I_{209C}$.

For clarity and consistency with the prior sections, the operations of the $FCS_{200C}$ is described first, independent of that of the amplifier. Thus, $ID_{M208C}$, and $ID_{M209C}$ are set to zero and non-idealities such as device mismatches are set aside. The $FCS_{200C}$ utilizes the first regulating circuit, on the top side, made up of $M_{206C}$, $M_{218C}$, and $M_{220C}$, and current sources, $I_{202C}$, and $I_{208C}$ plus the amplifier $A_{N200C}$ (containing $M_{204C}$, $M_{266C}$, $M_{226C}$, $M_{222C}$, and current source $I_{200C}$). Here, $A_{N200C}$'s output regulates $VGS_{M200C}$ until its inputs are substantially equalized, which is when $VGS_{M202C} \approx VGS_{M220C}$ that occurs when $ID_{M202C} \approx ID_{M220C}$. Therefore, $ID_{M202C} \approx ID_{M220} \approx 1i$, and the KCL operating on node 210C would result in $ID_{M200C} \approx ID_{M202C} + ID_{M203C} + ID_{M209C}$.

On the complementary or bottom side, the $FCS_{200C}$ utilizes the second regulating circuit made up of $M_{207C}$, $M_{219C}$, and $M_{221C}$, and current sources, $I_{203C}$, and $I_{209C}$ plus the amplifier $A_{P200C}$ (containing $M_{205C}$, $M_{217C}$, $M_{225C}$, $M_{223C}$, and current source $I_{201C}$). Here, $A_{P200C}$'S output regulates $VGS_{M201C}$ until its inputs are substantially equalized, which is when $VGS_{M203C} \approx VGS_{M221C}$ that occurs when $ID_{M203C} \approx ID_{M221C}$. Therefore, $ID_{M203C} \approx ID_{M221} \approx 1i$, and the KCL operating on node 211C would result in $ID_{M201C} \approx ID_{M203C} + ID_{M202C} + ID_{M208C}$.

The steady state operations of the FIG. 2C amplifier that utilizes $FCS_{200C}$ is described as follows. In steady state conditions, the amplifier's inputs are balanced and $ID_{M208C} \approx ID_{M210C} \approx 1 \times i$. As stated earlier, the first regulating circuit containing $A_{N200C}$ regulates the gate voltage of $M_{200C}$ until KCL is satisfied by operating on node 210C where $ID_{M200C} \approx ID_{M203C} + ID_{M202C} + ID_{M209C} \approx 3 \times i$. Given that currents through $M_{200C}$ and $M_{212C}$ ($\approx 2 \times i$) are mirrored and scaled, the sum of currents at node 216C would result in $ID_{M214C} \approx ID_{M212C} - ID_{M211C} \approx i$. Similarly, with the amplifier operating under steady state conditions, on the top or complementary side of the amplifier, $ID_{M209A} \approx ID_{M211A} \approx 1 \times i$. Also as stated earlier, the second regulating circuit containing $A_{P200C}$ regulates the gate voltage of $M_{201C}$ until KCL is satisfied by operating on node 211C where $ID_{IDM201C} \approx ID_{M203C} + ID_{M202C} + ID_{M208C} 3 \times i$. Given that currents through $M_{201C}$ and $M_{213C}$ ($\approx 2 \times i$) are mirrored and scaled, the sum of currents at node 217C would result in $ID_{M215C} \approx ID_{M213C} - ID_{M210C} \approx i$.

Again while the KCL operates on node 210C, an input voltage change ($\Delta v_{IN}$) across $M_{209C}$-$M_{211C}$ generates a current change ($\Delta i_N$) in $ID_{M209C}$ that would cause the first regulating circuit, containing $A_{N200C}$, to regulate the gate voltage of $M_{200C}$. As a result, $\Delta i_N$ would flow into $M_{200C}$, while $ID_{M200C}$ is 'current mirrored' with $ID_{M212C}$ (and scaled). Similarly, with the KCL operating on node 211C, the input voltage change ($\Delta v_{IN}$) across $M_{208C}$-$M_{210C}$ generates a current change ($\Delta i_P$) in $ID_{M208C}$ that would cause the second regulating circuit containing $A_{P200C}$, to regulate the gate voltage of $M_{M201C}$. As a result, this $\Delta i_P$ would flow into $M_{M201C}$, while $ID_{M201C}$ is 'current mirrored' with $ID_{M213C}$ (and scaled).

The $FCS_{200C}$ minimum $V_{DD} \geq V_{GS} + 2V_{DS}$ is improved compared to the prior art of FIG. 2D where minimum $V_{DD} \geq 2V_{GS} + V_{IDS}$. Note that, in utilizing $FCS_{200C}$, the input common mode span of the amplifier remains wide, given that nodes 203C, 211C, 217C and 202C, 210C, 216C can be set as $V_{DS}$ above and below rails.

Figure 2G:
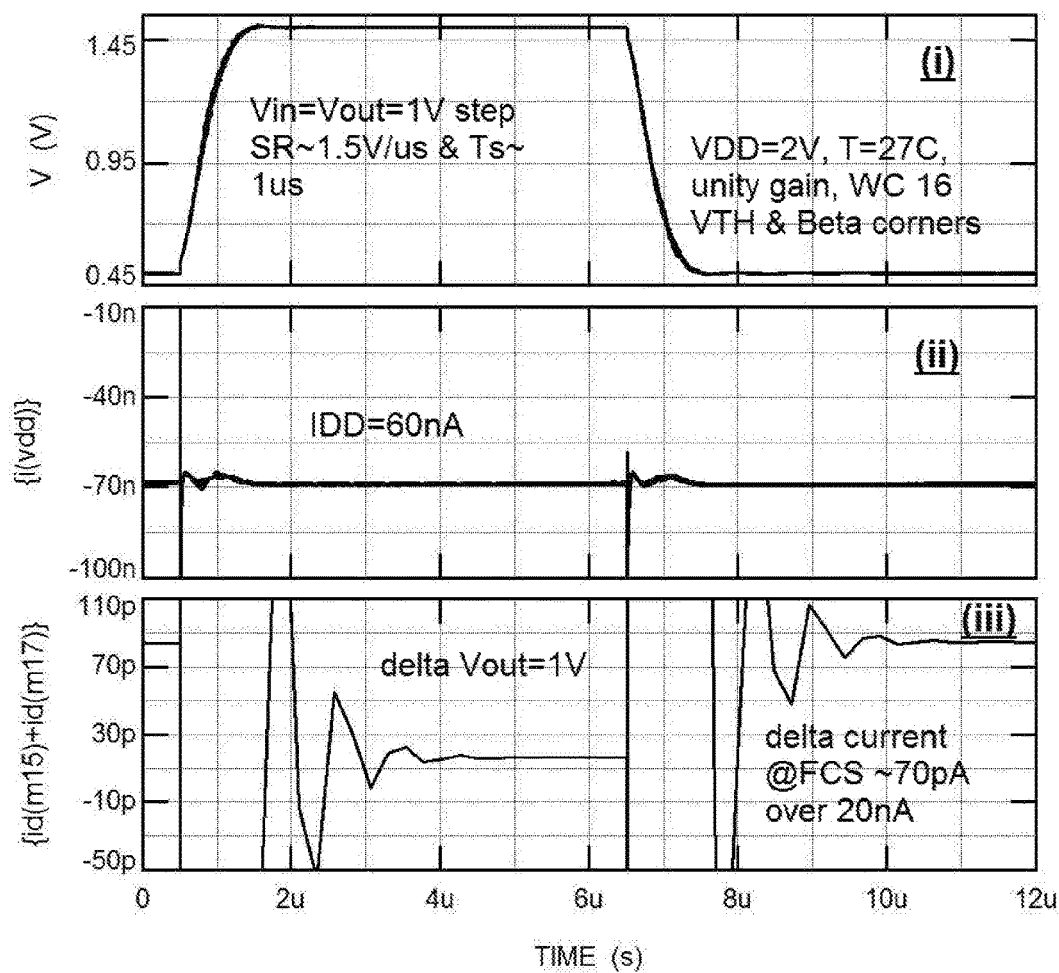
FIG. 2G is a circuit simulation showing transient response, current consumption, and change in the FCS current in response to change in input-output voltage of the amplifier illustrated FIG. 2C.

FIG. 2G upper graph (i) is the WC transient simulation of FIG. 2C indicating that SR~1.5V/µS and $t_s$~1 µS is achievable with the FCTA utilizing the third FCS. Moreover, FIG. 2F middle graph (ii) indicates current consumption of ~60 nano Ampere is achievable, and FIG. 2F bottom graph (iii) indicates that with FCTA in unity gain configuration subjected to a 1 volt change in common mode input voltage followed by 1V change in output voltage would cause a ~70 Pico Ampere (pA) change in the operating current of FCS, which is about 20 nA.

In summary, the $FCS_{200C}$ block that is utilized in the amplifier of FIG. 2C, operates as follows. The NMOSFET cascode current source ($M_{201C}$ and $M_{203C}$ cascoded on node 211C) and the PMOSFET cascode current source ($M_{200C}$ and $M_{202C}$ cascoded on node 210C) are arranged such that the drain current of $M_{202C}$ is fed into node 211C while the drain current of $M_{203C}$ is fed into node 210C. Concurrently, a first regulating circuit regulates the gate terminal $M_{200C}$, and a second regulating circuit regulates the gate terminal $M_{201C}$ such that the operating currents of $M_{200C}$ and $M_{201C}$ are substantially equalized, while the $FCS_{200C}$ operates with low power supply voltages. Some of the benefits of utilizing $FCS_{200C}$ in an amplifier are the following. First, the FCS can operate at lower power supply which frees the amplifier to operate with lower power supply as well. Second, the FCS can provides better matching between upper and low cascoded current sources which improves amplifier's performance, including lowering its offset and noise.

Section (X): Detailed Description of Amplifier Illustrated in FIG. 3A, Utilizing a First Noise Reduction Plus Speed Boost Circuit FIG. 3A is a circuit schematic showing an amplifier (BLOCK 301A) utilizing the noise reduction plus speed boost circuit (BLOCK 300A). One of the contribution of this disclosure is a method of lowering the output noise of an amplifier by narrow-banding it, and then reinvigorating the slower dynamic range of narrow-banded amplifier, by introducing a bias current boost (that feeds the amplifier operating current) which is dynamically enabled when the input of the amplifier become imbalanced after receiving a large differential input transient signal. The dynamic current boost aims to speed the amplifier's dynamic response by boosting not just the amplifier's slew rate but also its settling time.

To improve noise the amplifier is narrow banded. To maintain ultra low power consumption, the steady state quiescent current consumption of the amplifier is kept at ultra low levels. To re-invigorate the dynamic response of the narrow banded amplifier back-up, the intermittent (dynamic) current consumption of the amplifier is increased. One way to narrow band the amplifier is to connect a capacitor (Ce) to the high impedance (high gain) node of the amplifier. Given the low current consumption of the amplifier, the added capacitor to narrow band the amplifier, also makes the dynamic response of the amplifier slow. The disclosed method to reinvigorate the narrow banded (for lowering the noise of) amplifier, provides a 'fast boost-on' current and 'slow boost-off' current helps optimize for faster dynamic response.

The embodiment of FIG. 3A utilizes a folded cascode transconductance amplifier (FCTA). This teaching arranges utilization of the same devices with similar device parameters (e.g., PMOSFETs) as inputs, compensation capacitors (e.g., FET capacitors, or normal capacitors), and bias resistors in both FCTA and $BLOCK_{300A}$, which helps with smoother dynamic (transition) response going into and coming out of boost mode, and more consistent yield to performance specifications over process and operating condition variations.

The scale factors for FETs and current sources (e.g., $M_{314A}$, $M_{316A}$, $I_{300A}$, $I_{301A}$, $I_{302A}$, and $I_{304A}$, $M_{306A}$-$M_{308A}$, $M_{304A}$-$M_{310A}$,) can be altered depending on factors such as speed, and power consumption goal, amongst others. For example, with $0.01 \geq b \geq 1000000$, $0.01 \geq t \geq 1000000$, for the embodiment of FIG. 3A, the current sources, i=10 nA where b=10 and t=20. Also, in this segment of description the terms: amplifier, FCTA, or $BLOCK_{301A}$ are used interchangeably. The terms: noise reduction plus current boost circuit, current boost circuit, speed boost circuit, or $BLOCK_{300A}$ are also used interchangeably. This disclosure utilizes the current boost method with an amplifier configured as FCTA. However, there are alternative amplifier configurations that can utilize this disclosure's noise reduction plus speed boost method that would be possible. Some examples would be to apply the method of lowering noise plus boosting dynamic response of an amplifier by modifying $BLOCK_{300A}$ to match in accordance with an amplifier with NMOS input stage, or a FCTA with cascoded or regulated cascoded current mirrors, or complementary (PMOS and NMOS) rail-to-rail input stages, or amplifier topologies that are not folded cascode transconductance, amongst others.

The connections of the elements in FIG. 3A are described as follows. The body terminal of all NMOSFETs in FIG. 3A are connected to node 2 that is the $V_{SS}$, and the body terminals of PMOSFETs are connected to node 1 that is the $V_{DD}$. The upper terminals of the bias current sources $I_{300A}$, $I_{302A}$, and $I_{301A}$, are connected to node 1 that is $V_{DD}$. The lower terminal of the bias current source $I_{304A}$ is connected to node 2 that is $V_{SS}$. The lower terminal of the voltage source $V_{301A}$ is connected to node 2 that is $V_{SS}$. The ground node (GND) or node 0 is connected to the first terminals of effective capacitances $Ce_{300A}$ and $Ce_{301A}$. The source terminal of PMOSFETs $M_{314A}$, $M_{316A}$, $M_{305A}$, $M_{307A}$, $M_{309A}$, and $M_{311A}$ are connected to node 1 which is the positive supply voltage, $V_{DD}$. The source terminal of NMOSFETs $M_{304A}$, $M_{306A}$, $M_{308A}$, $M_{317A}$, $M_{319A}$, $M_{321A}$, and $M_{323A}$ are connected to the negative supply voltage, $V_{SS}$. Node 300A is connected to the gate terminal of $M_{300A}$ and the gate terminal of $M_{301A}$. Also, node 300A is the $V_{IN+}$ terminal of the FCTA and $BLOCK_{300A}$. Node 301A is connected to the gate terminal of $M_{302A}$ and the gate terminal of $M_{303A}$. Also, node 301A is the $V_{IN-}$ terminal of the FCTA and $BLOCK_{300A}$. Node 302 is connected to the source terminal of $M_{300A}$, the source terminal of $M_{302A}$, and the lower terminal of $I_{300A}$. Node 303A is connected to the source terminal of $M_{301A}$, the source terminal of $M_{303A}$, and the drain terminal of $M_{305A}$. Node 304A is connected to the drain terminal of $M_{300A}$, the gate terminal of $M_{304A}$, the drain terminal of $M_{304A}$, and the gate terminal of $M_{310A}$. Node 305A is connected to the drain terminal of $M_{301A}$, the drain terminal of $M_{319A}$, and the source terminal of $M_{313A}$. Node 306A is connected to the drain terminal of $M_{302A}$, the gate terminal of $M_{306A}$, the drain terminal of $M_{306A}$, and the gate terminal of $M_{308A}$. Node 307A is connected to the drain terminal of $M_{303A}$, the drain terminal of $M_{321A}$, and the source terminal of $M_{315A}$. Node 308A is connected to the drain terminal of $M_{308A}$, and the source terminal of $M_{310A}$. Node 309A is connected to the drain terminal of $M_{317A}$, the gate terminal of $M_{307A}$, the drain terminal of $M_{307A}$, and the gate terminal of $M_{305A}$. Node 310A is connected to the drain terminal of $M_{310A}$, the gate terminal of $M_{312A}$, and the lower terminal of current source $I_{302A}$. Node 311A is connected to the drain terminal of $M_{313A}$, the gate terminal of $M_{309A}$, the drain terminal of $M_{309A}$, and the gate terminal of $M_{311A}$. Node 312A is connected to the source terminal of $M_{312A}$, and the upper terminal of current source $I_{304A}$. Node 313A is the output, $V_{OUT}$, of the FCTA and is connected to the drain terminal of $M_{311A}$, the drain terminal of $M_{315A}$, and the second terminal of effective capacitance $Ce_{301A}$. Node 314A is connected to the drain terminal of $M_{312A}$, the gate terminal of $M_{314A}$, the drain terminal of $M_{314A}$, the gate terminal of $M_{316A}$, and the second terminal of effective capacitance $Ce_{300A}$. Node 315A is connected to the gate terminal of $M_{315A}$, the gate terminal of $M_{313A}$, and the positive terminal of voltage source $V_{V301A}$. Node 316A is connected to the drain terminal of $M_{316A}$, the drain terminal of $M_{323A}$, the gate terminal of $M_{323A}$, the gate terminal of $M_{321A}$, the gate terminal of $M_{319A}$, the gate terminal of $M_{317A}$, and the lower terminal of current source $I_{301A}$.

The $BLOCK_{300A}$ contains $M_{300A}$, $M_{302A}$ (configured in CSA), $M_{304A}$, $M_{306A}$, $M_{308A}$, $M_{310A}$ (configured in minimum current selector, $MCS_{300A}$), $I_{302A}$, $M_{312A}$, $I_{304A}$, $M_{314A}$, $M_{316A}$, $Ce_{300A}$, and $Ce_{301A}$ (configured in providing the 'fast boost-on' and 'boost off' signal as well as shaping the 'fast boost-on' {e.g., slew} current and 'slow boost-off {e.g., slow decay with one-time constant} current that is fed into the FCTA. The FCTA contains $M_{301A}$, $M_{303A}$ (input stage configured in CSA similar to that of the $BLOCK_{300A}$), $M_{313A}$, $M_{315A}$, (configured in CGA) $M_{309A}$, $M_{311A}$ (configured in current mirror), $M_{305A}$, $M_{307A}$, $M_{317A}$, $M_{319A}$, $M_{321A}$, $M_{323A}$, $V_{301A}$, and $I_{301A}$ (configured in the operating current and bias circuitry network for the FCTA).

Describing the details of the circuit in FIG. 3A is as follows to give a general description for more context in how utilizing the noise reduction plus speed boost circuit can improve the amplifier's performance. The $V_{IN}$ is applied to a differential CSA, containing $M_{319A}$ and $M_{321A}$, has its current outputs feed the next CGA, containing $M_{313A}$ and $M_{315A}$. The differential outputs of this CGA feed the CM, containing $M_{309A}$ and $M_{311A}$, to make a single-ended output, $V_{OUT}$. The bandwidth of the amplifier is approximately $$\propto gm_{M301A}/Ce_{301A} \propto \left(\frac{i}{V_T}\right)\Big/Ce_{M301A}).$$

All else equal, increasing the operating current 'i', speeds it up and vice versa, and increasing the effective capacitance at the high impedance node of the FCTA at node 313A narrows bands and makes its dynamic response slower and vice versa.

An amplifier's noise generally increases when the amplifier operates with low currents. This disclosure reduces the output noise of the amplifier by narrow banding the amplifier at its high impedance node 313A by increasing $Ce_{301A}$, while keeping the steady state current consumption at ultra low levels. Because narrow banding the amplifier, slows its dynamic response (speed), then the operating current 'i' is boosted dynamically, which is triggered when the amplifier input ($V_{IN}$) stop tracking each other (and go off balance) after ($V_{IN}$) receive a large transient signal. In this teaching, the dynamic response of the amplifier, generally speaking, goes through two phases: the 'slewing time' or 'slew rate' phase and the 'settling time' phase. The slew rate ($SR \propto 2i/Ce_{301A}$) of FCTA is largely determined by the effective capacitance ($Ce_{301A}$) at the amplifier's high impedance output node 313, and the operating current of the amplifier, 'i', that is scaled as in $ID_{M315A}$ and $ID_{M311A}$. The settling time of the FCTA, that is distinguished from SR for the purpose of this disclosure, is largely dominated by input stage $gm_{M301A}$, $Ce_{301A}$, and the amplifier's output impedance that is largely a function of $r_{ds} \propto V_A/i$. Because both the $g_m$, 'i', and Ce of the noise reduction plus speed boost circuit, $BLOCK_{300A}$, and that of the amplifier, FCTA, are arranged to be a function of similar device parameters on silicon, therefore the dynamic response of FCTA and BLOCK 300A track each other more consistently over process and operating condition variations.

Although the $gm_{M301A}$ of FCTA and $gm_{M300A}$ of FCTA and $BLOCK_{300A}$ at their input stages are similar, but an aspect of this disclosure is that FCTA and $BLOCK_{300A}$ are arranged to respond differently to their input voltage entering and exiting balance (i.e., in and out of steady state conditions). This aspect of the disclosure, that will be described shortly, helps a smoother and more consistent dynamic response in and out of the speed boost phase, over process and operating condition variations.

First, the steady state phase for FIG. 3A is described. When the amplifier and $BLOCK_{300A}$ inputs are in steady-state, the boost signal remains off. The input stage of $BLOCK_{300A}$ and that of the FCTA are similar, made up of the PMOSFET primary pair ($M_{300A}$-$M_{302A}$ and $M_{301A}$-$M_{303A}$, respectively). The input stage differential pair currents $ID_{M300A} \approx I_{M302A} \approx i$ are fed onto the minimum current selector, $MCS_{300A}$.

First, at a high level, lets describe the operations of the minimum current selector ($MCS_{300A}$) composed of $M_{304A}$ mirrored and scaled with $M_{310A}$ coupled with $M_{306A}$ mirrored and scaled with $M_{308A}$. When $ID_{M304A} \approx 0 \rightarrow VGS_{M304A} \approx 0 \rightarrow VG_{M310A} \approx 0$, and thus the output current of $MCS_{300A}$ which is outputted via $ID_{M310A} \approx 0$, thus the $min(ID_{M304A}, ID_{M306A}) \approx ID_{M304A} \approx 0$ is selected. Conversely, when $ID_{M306A} \approx 0 \rightarrow VGS_{M306A} \approx 0 \rightarrow VG_{M308A} \approx 0$, and thus the output current of $MCS_{300A}$ which is outputted via $ID_{M310A} \approx 0$, thus the $min(ID_{M304A}, ID_{M306A}) \approx ID_{M306A} \approx 0$ is selected. In the steady state phase there is current equilibrium, when $ID_{M304A} \approx i \rightarrow VGS_{M304A} \approx VGS_i \rightarrow VG_{M310A} \approx VGS_i$. Similarly in equilibrium, when $ID_{M306A} \approx i \rightarrow VGS_{M306A} \approx VGS_i \rightarrow VG_{M308A} \approx VGS_i$. Given that $M_{310A}$ is scaled at 2× the size of $M_{304A}$ and $M_{308A}$ is scaled at 2× the size of $M_{306A}$, and that $M_{310A}$ is in series with $M_{310A}$, and that $VG_{M308A} \approx VG_{M310A} \approx VGS_i$, therefore the output current of $MCS_{300A}$ which is outputted via $ID_{M310A} \approx i$. Thus, in the steady state phase when $ID_{M304A} \approx ID_{M306A} \approx i$, the FETs in $MCS_{300A}$, including $M_{304A}$, $M_{306A}$, $M_{308A}$, and $M_{310A}$ are in balance and the $MCS_{300A}$ operates accordingly and $min(ID_{M304A}, ID_{M306A}) \approx ID_{M304A} \approx ID_{M306A} \approx i$.

Therefore, in steady state given that the output of $MCS_{300A}$ generates $i \approx ID_{M310A} > I_{302A} \approx 0.5i$, then $V_{310A}$ that controls the boost on-off signal, pulls down ($V_{310A} \approx V_{SS}$) and there is the boost-off phase. As a result, $VG_{M312A} \approx 0 \rightarrow ID_{M312A} \approx 0 \rightarrow ID_{M314A} \approx ID_{M316A} \approx 0$. Thus, in steady state phase, the amplifier's bias current is supplied only by $I_{301A}$, and with $ID_{M316A} \approx 0$ amplifier remains in the 'boost off' phase.

In this segment, the 'boost on' phase is described. When the boost is inactive, $ID_{M323A} \approx I_{301A}$ establishes the ultra low quiescent operating current of the amplifier. While the boost is active, $BLOCK_{300A}$ dynamically generates a boost current that is added to $ID_{M323A}$ to boost the FCAT dynamic response. Here is how this happens. When large differential signal transients are applied at $V_{IN}$, then all or majority of the $I_{300A}$ current $2i$ would flow through, for example, $M_{302A}$. Thus, $ID_{M302A} \approx ID_{M306A} \approx 2i$ and $ID_{M300A} \approx ID_{M304A} \approx 0 << 2i$. Therefore, as noted earlier, then $MCS_{300A}$ operates accordingly and $min(ID_{M304}, ID_{M306}) \approx ID_{M304A} \approx 0 << 2i$. In this phase, $MCS_{300A}$ output (flowing through $M_{310A}$) conduct near or at zero current, and hence $V_{310A}$ is pulled up by $I_{302A}$ (when $V_{310} \approx V_{DD}$) and there is the boost-on phase. In the boost-on phase, all of $I_{304A} \approx b \times i$ passes through $M_{312A}$ (that functions like a current switch) onto $M_{314A}$ that is mirrored and scaled with $M_{316A}$. Hence, $ID_{M316A} \approx b \times t \times i$, which is the boost-on dynamic current that is added onto the amplifier bias network via $M_{316A}$ to $M_{323A}$. Note that the operating currents in the input stage of FCTA ($M_{301A}$-$M_{303A}$) is boosted via the amplifier's bias network that contains $M_{323A}$-$M_{317A}$-$M_{307A}$-$M_{305A}$. As noted earlier, boosting the operating current in the amplifier's input stage, increases its 'i' and $g_m$ and thus speeds up the amplifier's dynamic response. Similarly, the operating currents in the high-impedance high-gain stage of FCTA ($M_{313A}$-$M_{315A}$-$M_{319A}$-$M_{311A}$) is boosted via the amplifier's bias network that contains $M_{323A}$-$M_{319A}$-$M_{321A}$. As noted earlier, boosting the operating current in the amplifier's high impedance stage, increases its 'i' and also speeds up the amplifier's dynamic response, including its slew rate.

Before the dynamics of getting in and out of the current boost phase is described, a clarification with respect to $Ce_{301A}$ and $Ce_{301A}$ is in order. From a high level point of view, this disclosure is flexible in how $Ce_{301A}$ and $Ce_{301A}$ are made. For example, $Ce_{301A}$ and $Ce_{301A}$ can be made of similar devices such as standard capacitors, FET capacitors, or relying on $C_e$ associated with the intrinsic capacitances coupled to the 313A node of amplifier and the 314A node of $BLOCK_{300A}$. The dynamic response of the FCTA and $BLOCK_{300A}$ are designed to match by using the same type of devices that impact their dynamic response, including using similar $C_e$ and running the amplifier and the noise reduction (plus speed boost) circuits with similar bias currents that track each other over process and operating variations. Matching the dynamic response of FCTA and $BLOCK_{300A}$ helps with smooth transient response in and out of boost plus consistency of dynamic response across process and operating condition variations. The $Ce_{301A}$ is the effective capacitance at the high gain high impedance $V_{OUT}$ node 313A of the amplifier that low pass filter filters the noise. This $Ce_{301A}$ can be made with FETs or regular capacitors available in standard CMOS fabrication processes. Part of the $Ce_{301A}$ can also be contributed by the intrinsic input capacitance associated with, for example, a buffer transistor drivers that could be coupled to the main FCTA's $V_{OUT}$ node 313A. Similarly, the $Ce_{300A}$ is the effective capacitance at node 314A, in $BLOCK_{300A}$, that contributes to shaping the transient profile of the 'fast boost-on' current and 'slow boost-off' current that is injected into the amplifier. This $Ce_{300A}$ capacitance can be made with FETs (e.g., PMOSFET capacitors), or regular capacitors available in standard CMOS fabrication processes. Part or all of the effective capacitance, $Ce_{300A}$, can also be contributed by the intrinsic input capacitance associated with, for example, $Ce_{M314A}$ and $Ce_{M316A}$.

Next the dynamics of getting in and out of current boost phase is described. When the boost-on signal is triggered, $I_{304A} \approx b \times i$ slews the node 314A. The 'boost-on' signal at node 310A turns on $M_{312A}$, which acts like a current switch, which causes $I_{304A}$ to provide a 'fast boost-on' current onto $M_{314A}$ that is mirrored and scaled up onto $M_{316A}$. Note that the speed at which node 314A slews (i.e., the dynamic profile of 'fast boost-on' current) is also a function of $Ce_{314A}$, beside $I_{304A}$.

For a better perspective about the dynamic response, note that while the 'fast boost-on' current is still feeding the FCTA's current bias network, the FCTA's SR remains boosted. At some point when the amplifier's inputs approach balance, $BLOCK_{300A}$ triggers the boost off signal (bringing down $V_{310A}$ to $V_{SS}$) which shuts off the current switch $M_{M312A}$. Here, the flow of $I_{304A}$ is closed off, and the amplifier enters the 'boost-off' phase when a decaying current continues feeding the FCTA bias network. When the boost off signal is triggered and $I_{304A}$ is cut off from $M_{314A}$, the profile of 'slow boost-off' current is a function of the $Ze_{314A}$ and $Ce_{300A}$, where $Ze_{314A} \propto 1/gm_{M314A}$, which will be described further shortly.

An aspect of this disclosure is that the boost-off signals is generated responding to different levels of inputs equilibrium, although both FCTA and $BLOCK_{300A}$ are receiving and mentoring the same input voltage. The $BLOCK_{300A}$ in this disclosure is arranged such that when its inputs can be coarsely equalized, it triggers the boost-off signal. $BLOCK_{300A}$ can be arranged such that its inputs can be coarsely equalized in different ways. Some example are for $BLOCK_{300A}$ to have lower gain than the main amplifier, or having the $MSC_{300A}$ trigger node 310A when its currents (e.g., $M_{304A}$ and $M_{306A}$) are coarsely equalized instead of accurately, or inserting a hysteresis in the inputs stage of $BLOCK_{300A}$, or combination thereof, amongst other means. Another aspect of this disclosure is that after the boost off signal is triggered in $BLOCK_{300A}$, subsequently there continues to be a slow decay current (thus the term 'slow boost-off' current) that feeds the amplifier's operating bias current network, until the slow boost-off current dies off. This arrangement improves the FCTA settling time. The aforementioned attributes (boost off signal triggered when inputs are equalized coarsely, plus the slow-boost off current) improve the amplifier's settling time. As noted earlier, the 'slow boost-off' current decay rate is roughly determined by node 314A's time constant set that is set approximately by the equivalent capacitance, $Ce_{314A}$, and impedance, $Ze_{314A}$, at node 314A. Note that in this embodiment $Ce_{314A}$ is dominated by effective capacitance $Ce_{M314A}$ and $Ce_{M316A}$, and $Ze_{314A}$ is dominated by approximately $1/gm_{M314A}$ computed in the saturation region, in light of the boosted transition currents from subthreshold to saturation region during the intermittent boosted phase. As stated earlier, this embodiment enables the SR and settling time of both the amplifier and $BLOCK_{300A}$ (which provides and shapes the dynamic response profile of the 'fast boost on' and 'slow boost-off' currents for the FCTA) to approximately track and match each other. As such, this trait benefits the amplifier with smooth dynamics response (in and out of boost phases) and its consistency over process and operating condition variations.

Comparative simulations in FIG. 3C. depicts improvement in FIG. 3A amplifier's output noise. Based on approximate device models, by utilizing the noise reduction and current boost circuit, the $VO_{noise}$ of the amplifier at 10 Hz can be roughly 4 $\mu V/\sqrt{Hz}$ compared to roughly 8 $mV/\sqrt{Hz}$ for the comparable amplifier that does not utilize the noise reduction and current boost circuit. Moreover, FIG. 300D depicts improvement in the FIG. 3A amplifiers settling time ($\tau_S$) with the amplifier utilizing the noise reduction and current boost circuit can be roughly 8 $\mu s$ compared to $\mu s$ 110 for the comparable amplifier that does not utilize the noise reduction and current boost circuit.

In conclusion, here is a summary of some of the improvements to an amplifiers performance that can be attained by this disclosure. First the amplifier's output noise is reduced by narrow banding the amplifier. Second, the static operating current consumption of the amplifier is kept ultra low. Third, the slowed dynamic response of the narrow-banded amplifier (both slew rate and settling time) are reinvigorated and boosted. Fourth, lower noise, and most other attributes of the amplifier including its gain, bandwidth, static power consumption, common mode range, PSRR, and CMRR are generally not affected by the boost stage, since boost is only engaged dynamically when inputs experience large differential signals. Fifth, amplifier's input structure and that of the boost stage are substantially similar, and hence the boosting function accommodates the full common mode range and power supply span. Sixth, as noted earlier, the AC, slew rate, and transient profiles of the amplifier and that of the boost circuit of $BLOCK_{300A}$ should approximately track each other over temperature and process variations. This is because generally, the amplifier and the boost stage's operating currents, gain (e.g., $\propto V_A/V_T^2$), and input's $1/g_m$ (e.g., $\propto V_T/i$) roughly track each other, as do their poles in $BLOCK_{300A}$ and FCTA are roughly a function of similar $\propto 1/g_m$, and $\propto Ce_{FET}$ (or standard capacitors), and $\propto r_o \approx V_A/i$ given that they are made of similar device parameters for both $BLOCK_{300A}$ and FCTA. Seventh, the switching threshold of the amplifier's input stage from small signal to large signal needs to be large enough (e.g., offset mismatch between the boost and the amplifier input stages, $\Delta V_{OFS}$) so that a false or premature turning on of the boost function is avoided. This is the case considering that in steady state (before boost-on phase), when the $V_{IN}$ imbalance is first detected, the amplifier and boost stage input's $1/gm_{PMOS}$ where $i \approx 10$ s of nano-amperes. Note that the $BLOCK_{300A}$ operating currents remain ultra-low, while the main amplifier currents increase substantially in the boost-on phase to the micro-ampere range, which take the amplifier FETs out of the subthreshold region. This is a transitory change in the gain as well as the dynamic response of the amplifier while in the boost-on phase, compared to $BLOCK_{300A}$ (that stays in subthreshold region) while monitoring and receiving the same input voltage as the amplifier. Note also that, it is possible to provide some hysteresis at the input of $BLOCK_{300A}$ as guard-band against unwanted boost signal toggles. Eighth, to arrange for the boost-off signal to be triggered (setting in motion the boost current decay) when the $BLOCK_{300A}$ inputs are coarsely equalized (as compared to the amplifier's inputs whose inputs continue to converge towards finer balance and finer equalization), the amplifier's settling time is improved. Ninth, the maximum boost current, $b \times t \times i$, is fixed and is proportional to amplifier's static bias current, 'i', which helps control peak dynamic current consumption. This trait also facilitates the boost stage's peak speed to tracks that of the main amplifier, over process, temperature, and operating variations. Note that 'i' can be made independent of $V_{TH}$ and mostly a function of $V_T$ and $\mu_{PMOS}$ which are more tightly controlled in manufacturing, and helps with consistency of performance specification across manufacturing variations. Tenth, care is taken to minimize dependence of amplifier's specifications on multiple device parameters such as NMOSFET, $V_{TH\_NMOS/PMOS}$, and N+/P+ resistors. Instead, amplifier's specifications mostly rely on PMOSFETs which dominate pertinent signal paths, and this can help optimize yield and help lower noise (e.g., PMOSFET 1/f noise<<NMOSFET 1/f noise) further.

Section XI: Detailed Description of Amplifier Illustrated in FIG. 3B, Utilizing a Second Noise Reduction Plus Speed Boost Circuit FIG. 3B is a circuit schematic showing a amplifier utilizing the noise reduction plus speed boost circuit ($BLOCK_{300B}$). The embodiment illustrated in circuit schematic section in $BLOCK_{300B}$ (of FIG. 3B) utilizes a Loser Take All $LTA_{300B}$ circuit (compared to the $MCS_{300A}$ that was utilized in $BLOCK_{300A}$ of FIG. 3A). All else is substantially similar and the description of the disclosure is interchangeably applicable between FIG. 3B and that of FIG. 3A. Beyond what is already described in the previous section, the description here provides the description of elements, and detailed explanation of the $LTA_{300B}$, with a summary in its conclusion.

Similar to the teaching in previous section, the disclosure here is a method of lowering the output noise of an amplifier by band passing it while keeping its static current consumption ultra low, and concurrently speeding up the amplifier's dynamic response, by boosting the amplifier's operating current in the face of the amplifier's inputs receiving a large transient signal. The noise reduction and speed boost circuit of $BLOCK_{300B}$ utilizes a $LTA_{300B}$ to detect when inputs are imbalanced. Similar to FIG. 3A, the circuit of FIG. 3B speeds up the amplifier's dynamic response by boosting both its SR as well as its' settling time. The scale factors for FETs and current sources (e.g., $M_{304B}$, $M_{310B}$, $M_{314B}$, $M_{316B}$, $I_{300B}$, $I_{301B}$, $I_{302B}$, and $I_{304B}$) can be altered depending on factors such as speed, power consumption goal, amongst others. For example, with $0.01 \leq b \leq 1000000$, $0.01 \leq t \leq 1000000$, for an embodiment of FIG. 3B, the current sources, i=10 nA where b=10, and t=20. This disclosure utilizes the current boost method with an amplifier configured as FCTA. However, there are alternative amplifier configurations that can utilize this disclosure's noise reduction plus speed boost method that would be possible. Some examples would be to apply the method of lowering noise plus boosting dynamic response of an amplifier by modifying $BLOCK_{300B}$ to match in accordance with an amplifier with NMOS input stage, or a FCTA with cascoded or regulated cascoded current mirrors, or complementary (PMOS and NMOS) rail-to-rail input stages, or amplifier topologies that are not FCTA, amongst others. It would be also be possible to utilize variations of $MCS_{300A}$ or $LTA_{300B}$ or combination thereof to detect an imbalance at the input of an amplifier, including for example utilizing Winner Takes All (WTA) function, amongst others.

The connections of the elements in FIG. 3B are described as follows. The body terminal of all NMOSFETs in FIG. 3B are connected to node 2 that is the $V_{SS}$, and the body terminals of PMOSFETs are connected to node 1 that is the $V_{DD}$. The upper terminals of the bias current sources $I_{300B}$, $I_{302B}$, and $I_{301B}$, are connected to node 1 that is $V_{DD}$. The lower terminal of the bias current source $I_{304B}$ is connected to node 2 that is $V_{SS}$. The lower terminal of the voltage source $V_{301B}$ is connected to node 2 that is $V_{SS}$. The ground node (GND) or node 0 is connected to the first terminals of effective capacitances $Ce_{300B}$ and $Ce_{301B}$. The source terminal of PMOSFETs $M_{314B}$, $M_{316B}$, $M_{305B}$, $M_{307B}$, $M_{309B}$, and $M_{311B}$ are connected to node 1 which is the positive supply voltage, $V_{DD}$. The source terminal of NMOSFETs $M_{304B}$, $M_{304B}'$, $M_{306B}$, $M_{306B}'$, $M_{308B}$, $M_{310B}$, $M_{317B}$, $M_{319B}$, $M_{321B}$, and $M_{323B}$ are connected to the negative supply voltage, $V_{SS}$, which is node 2. Node 300B is connected to the gate terminal of $M_{300B}$ and the gate terminal of $M_{301B}$. Also, node 300B is the $V_{IN+}$ terminal of the FCTA and $BLOCK_{300B}$. Node 301B is connected to the gate terminal of $M_{302B}$, the gate terminal of $M_{302B}'$, and the gate terminal of $M_{303B}$. Also, node 301B is the $V_{IN-}$ terminal of the FCTA and $BLOCK_{300B}$. Node 302 is connected to the source terminal of $M_{300B}$, the source terminal of $M_{302B}$, the source terminal of $M_{M302B}'$, and the lower terminal of $I_{300B}$. Node 303B is connected to the source terminal of $M_{M301B}$, the source terminal of $M_{303B}$, and the drain terminal of $M_{305B}$. Node 304B is connected to the drain terminal of $M_{300B}$, the gate terminal of $M_{304B}$, the drain terminal of $M_{304B}$, and the gate terminal of $M_{304B}'$. Node 305B is connected to the drain terminal of $M_{301B}$, the drain terminal of $M_{319B}$, and the source terminal of $M_{313B}$. Node 306B is connected to the drain terminal of $M_{302B}$, the drain terminal of $M_{304B}'$, the gate terminal of $M_{306B}$, the drain terminal of $M_{306B}$, and the gate terminal of $M_{306B}'$. Node 307B is connected to the drain terminal of $M_{303B}$, the drain terminal of $M_{321B}$, and the source terminal of $M_{315B}$. Node 308B is connected to the drain terminal of $M_{306B}'$, the drain terminal of $M_{308B}$, the gate terminal of $M_{308B}$, and the gate terminal of $M_{310B}$. Node 309B is connected to the drain terminal of $M_{317B}$, the drain terminal of $M_{307B}$, the drain terminal of $M_{307B}$, and the gate terminal of $M_{305B}$. Node 310B is connected to the drain terminal of $M_{M310B}$, the gate terminal of $M_{312B}$, and the lower terminal of current source $I_{302B}$. Node 311B is connected to the drain terminal of $M_{313B}$, the gate terminal of $M_{309B}$, the drain terminal of $M_{309B}$, and the gate terminal of $M_{311B}$. Node 312B is connected to the source terminal of $_{M312B}$, and the upper terminal of current source $1_{304B}$. Node 313B is the output, $V_{OUT}$, of the FCTA and is connected to the drain terminal of $M_{311B}$, the drain terminal of $M_{315B}$, and the second terminal of effective capacitance $Ce_{301B}$. Node 314B is connected to the drain terminal of $M_{312B}$, the gate terminal of $M_{M314B}$, the drain terminal of $M_{314B}$, the gate terminal of $M_{316B}$, and the second terminal of effective capacitance $Ce_{300B}$. Node 315B is connected to the gate terminal of $M_{315B}$, the gate terminal of $M_{313B}$, and the positive terminal of voltage source $V_{301B}$. Node 316B is connected to the drain terminal of $M_{316B}$, the drain terminal of $M_{323B}$, the gate terminal of $M_{323B}$, the gate terminal of $M_{321B}$, the gate terminal of $M_{319B}$, the gate terminal of $M_{317B}$, and the lower terminal of current source $I_{301B}$.

The $BLOCK_{300B}$ contains $M_{300B}$, $M_{302B}$, and $M_{302B}'$ (configured in CSA), $M_{304B}$, $M_{304B}'$, $M_{306B}$, $M_{306B}'$, $M_{308B}$, $M_{310B}$ (configured in Looser Take All, $LTA_{300B}$), $I_{302B}$, $M_{312B}$, $I_{304B}$, $M_{314B}$, $M_{316B}$, $Ce_{300B}$, and $Ce_{301B}$ (configured in providing the 'boost on' and 'boost off' signal as well as shaping the 'fast boost-on' (e.g., slew) current and 'slow boost-off' {e.g., slow decay with one-time constant} current that is fed into the FCTA. The FCTA contains $M_{301B}$, $M_{303B}$ (input stage configured in CSA similar to that of the $BLOCK_{300B}$), $M_{313B}$, $M_{315B}$, (configured in CGA) $M_{309B}$, $M_{311B}$ (configured in current mirror), $M_{305B}$, $M_{307B}$, $M_{317B}$, $M_{319B}$, $M_{321B}$, $M_{323B}$, $V_{301B}$, and $I_{301B}$ (configured in the operating current and bias network circuitry for the FCTA).

Here, description of the operations Loser Take All, $LTA_{300B}$ (which is similar in function to that of prior section regarding $MCS_{300A}$) is provided, ignoring non-idealities such as mismatches. The boundary conditions are described first. When large signals are applied to $V_{IN}$ and input FETs $M_{300B}$-$M_{302B}$-$M_{302B}'$ become imbalanced. First, the case is described when all of $I_{300B}$=4×i flows through $M_{300B}$, and $ID_{M302B} \approx ID_{M302B}' \approx 0 \ll 4 \times i$. Therefore, $ID_{M304B} \approx 2 \times ID_{M304B}' \approx 4 \times i$. Given that $ID_{M302B}' \approx 0$ and $ID_{M304B}' \approx 2 \times i \rightarrow V_{306B} \approx 0 \rightarrow VGS_{M306B} \approx 0 \rightarrow ID_{M306B} \approx ID_{M306B}' \approx 0$. Given that $ID_{M302B}' \approx 0$ and $ID_{M306B}' \approx 0 \rightarrow ID_{M308B} \approx 0 \approx ID_{M310B}$. Thus the output current of $LTA_{300B}$ is outputted via $ID_{M310B} \approx 0$, thus the loser($ID_{M300B}$, $ID_{M302B\&B}') \approx ID_{M302B\&B}' \approx 0$ takes all. Note that $ID_{M302B\&B}'$ denotes $ID_{M302B}$, $ID_{M302B}'$ that are equal (having the same VGS) whose sum is 2i during steady state.

Next, considering the case where the large signal $V_{IN}$ causes an imbalance such that all of $I_{300B}$=4×i flows through $M_{302B}$ and $M_{302B}'$. Here, $ID_{M300B} \approx 0 \ll 4 \times i$ and $ID_{M302B} \approx ID_{M302B}' \approx 2 \times i$. Therefore, $ID_{M304B} \approx 2 \times ID'_{M304B} \approx 0 \ll 4 \times i$. With $ID_{M302B} \approx 2 \times i$ and $ID_{M304B}' \approx 0 \rightarrow ID_{M306B} \approx 2 \times i \approx ID_{M306B}'$. With $ID_{M302B}' \approx 2 \times i$ and $ID_{M306B}' \approx 2 \times i$, therefore no current is left for $M_{308B}$. Thus, $ID_{308B} \approx 0 \approx ID_{M310B}$. Therefore the output current of $LTA_{300B}$ is outputted via $ID_{M310B} \approx 0$, thus the loser($ID_{M300B}$, $ID_{M302B\&B}') \approx ID_{M300B} \approx 0$ takes all.

In summary, when there is an imbalance (in either direction) as a result of a large signal $V_{IN}$, the $LTA_{300B}$ generates a zero current through $ID_{M310B} \approx 0$. As such $I_{302B}$=1×i pulls up on node 310B ($V_{310B} \approx V_{DD}$)→$M_{312B}$ turns on and passes $I_{304B}$=b×i onto $M_{314B}$ whose current is mirrored and scaled up onto $M_{316B}$ with $ID_{M314} \approx b \times t \times i$. This $ID_{M314B}$ is the boost-on current that is added to the FCTA quiescent current, $I_{304B}$, to feed the FCTA current bias network through $M_{323B}$.

Next considering the steady state, or static, conditions when the amplifier is regulated its input FETs $M_{300B}$-$M_{302B}$-$M_{302B}'$ are in balance. In steady state, $ID_{M300B} \approx 2 \times ID_{M302B} \approx 2 \times ID_{M302B}' \approx 2 \times i$. Therefore, $ID_{304B} \approx 2 \times ID_{M304B}' \approx 2 \times i$ and $ID_{M302B} \approx i$. Therefore, there is no current left for $M_{306B} \rightarrow ID_{M306B} \approx ID_{M306B}' \approx 0$. With $ID_{M306B}' \approx 0$, then all of $ID_{M302B} \approx i$ flows through $M_{308B}$ which is mirrored and scaled up 2× into $M_{310B}$ and thus $2\times ID_{M308B} \approx ID_{M310B} \approx 2\times i$. Thus the output current of $LTA_{300B}$ is outputted via $ID_{M310B} \approx 2\times i$ since there are no loser, but equals per se here, the loser($ID_{M300B}$, $ID_{M302B\&B}') \approx ID_{M300B} \approx ID'_{M302B\&B} \approx 2\times i$ takes all. Therefore, when the amplifier's inputs arrive at balance in steady state conditions, the output current of $LTA_{300B}$ generates a $ID_{M310B} \approx 2\times i$ (½ the tail current of the input stage). As such, $ID_{M310B}$ pulls down on $I_{302B} = 1\times i$ which takes node 310B down $(V_{310B} \approx V_{SS}) \rightarrow M_{312B}$ turns off and blocks $I_{304B} = b\times i$ from flowing into $M_{314B}$. Thus, $ID_{M314B} \approx 0 \approx ID_{M316B}$. As a result, the ultra low static FCTA quiescent current, $I_{304B}$, feeds $M_{323B}$ in steady state conditions with no boost current.

In summary, FIG. 3B is a circuit schematic based on a method of reducing an amplifier's output noise by narrow-banding the amplifier, which slows its dynamic response, while independently reinvigorating the amplifier's narrow-banded dynamic response via boosting both its' slew rate and settling time. This is accomplished as follows. PMOSFET or standard capacitors can be used at the high impedance node to low pass filter the amplifier's output noise. A loser take all (LTA) circuit is utilized to detect and trigger a boost on and boost off signal, when the amplifier's inputs approximately go in and out of balance. A boost function is enabled, in response to large differential transient input signals, by injecting a dynamic current into the amplifiers pre-existing static bias current network, which at first rapidly speeds up the amplifier's slew rate. When inputs approximately approach balance, the boost signal is triggered off. But here, a slow and decaying current continues feeding the amplifier's bias current network, until the decaying current fades off. This decaying current (which is initially sizable enough when compared to the otherwise statically ultra low current operant in the un-boosted mode) roughly follows a single pole trajectory, which helps speed up the amplifier's settling time.

As explained earlier, while reinvigorating the SR and settling time, the price to pay for lowering the amplifier's noise, is the increased dynamic current consumption (intermittent power consumption). After the amplifier's inputs receive a large signal transient, and the boost-on signal is triggered, the 'fast boost-on' current kick starts speeding up the amplifier's dynamic response by boosting up its slew rate, which moves the amplifier back on the path towards balancing its inputs ahead of boost-off signal trigger. To save on the intermittent power consumption, the boost off signal can be triggered sooner which cuts off the slewing current boost sooner. However, a 'slow boost-off' arrangement continues injecting a dynamic decaying current into the amplifier bias network (which eventually levels off to zero) to speed up the amplifier's settling time. This is accomplished, in part, as explained previously above by arranging $BLOCK_{300B}$ to initiate the boost-off signal when its inputs are not equalized in the same size and fashion as that of the inputs of FCTA (e.g., the amplifier has approached but not fully regulated).

The whole amplifier operates in the subthreshold region when it is un-boosted, but its' input, transconductance gain, and (would be) output buffer stages would become faster by receiving the boosted dynamic current and transition in and out of saturation during the intermittent boosted phases. It is also of note that PMOSFETs can be used at input stages and also as active resistors to set the operating bias currents for the whole amplifier (including, input stages, gain stage, the boost circuit, and output stage), which can establish both their input stage's transconductance ($gm_{PMOS}$). Moreover, PMOSFET or normal capacitors can be utilized to set the dominant poles of each of the amplifier gain stage and that of the boost stage. In other words, dynamic response of both the FCTA and $BLOCK_{300B}$ can be largely proportional to the same (operating current) 'i' and (dominant effective capacitance) '$C_e$', and same kind of device parameters. Hence, the dynamic response in and out of boost track each other, and follow a reasonably smooth and stable passage, in and out of boost phases. Moreover, the profiles of the amplifier and the boost stage dynamic response can be more consistent from lot-to-lot in manufacturing, across operating variations.

Figure 5:
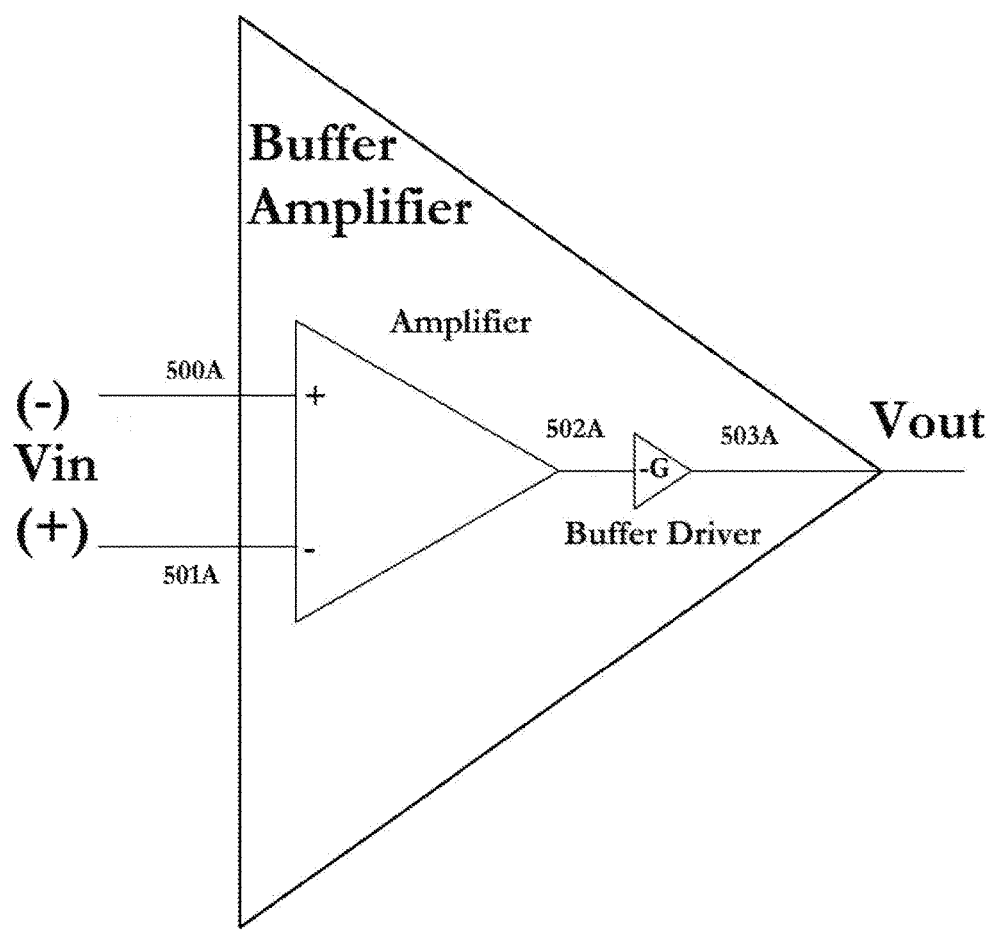
FIG. 5 is a block level diagram showing the Buffer Amplifier having the Amplifier coupled with the Buffer Driver section.

Section (XII): Describing a Prior Art Amplifier Gain Stage Illustrated in FIG. 4A, Coupled with (Inverting) Buffer Driver Generally a buffer amplifier, as depicted in FIG. 5, contains an amplifier section coupled with a buffer driver section. The amplifier section amplifies the signals applied to its inputs, and has high input impedance and high output impedance and is sometimes referred to gain stage. Buffer driver section has high input impedance and low output impedance with its outputs capable of sinking and sourcing currents to drive external loads, such as resistors, capacitors, inductors or a combination thereof. Combination of amplifier and buffer driver makes a buffer amplifier that can amplify signals applied to its inputs. A buffer driver also has high input impedance, low output impedance, and its output is capable of sinking and sourcing currents to drive external loads. Therefore, there may be formed a buffer amplifier ($AMP_{400}$) comprised of a amplifier gain stage of FIG. 4A, coupled with a buffer driver (e.g., inverting buffer driver). The (inverting) buffer drivers can be anyone of the disclosed $BUF_{400B}$, $BUF_{400C}$, and $BUF_{400D}$ embodiments illustrated in FIG. 4B, FIG. 4C, or FIG. 4D (respectively), which will be discussed in the next sections. Note that $AMP_{400B}$ is formed by amplifier gain stage of FIG. 4A coupled with $BUF_{400B}$. The $AMP_{400C}$ is formed by amplifier gain stage of FIG. 4A coupled with $BUF_{400C}$. The $AMP_{400D}$ is formed by amplifier gain stage of FIG. 4A coupled with $BUF_{400D}$. The connection of the elements in FIG. 5 are described as follows. Node 500A is the negative input terminal of the Buffer Amplifier that is connected to the positive input terminal of the Amplifier (that provides the gain stage). Node 501A is the positive input terminal of the Buffer Amplifier that is connected to the negative input terminal of the Amplifier (that provides the gain stage). Node 502A is the output terminal of the Amplifier (that provides the gain stage) that is connected to the input terminal of the (inverting) buffer driver (that provides current drive capability to an external load). Node 503A is the output of the Buffer Driver that is also the output of the Buffer Amplifier (that provides the Buffer Amplifier current drive capability to an external load). Note that it would be obvious for one in the art to modify the disclosed teaching wherein the output of the Amplifier can be composed of 2 outputs (instead of one output at node 502A) that would feed 2 inputs of a Buffer Driver (instead of one input to the Buffer Driver). Moreover, note that the designation '–G' denotes the inverting aspect of the disclosed preferred embodiment of the Buffer Driver. It would be obvious to one skilled in the art to utilize a variation of the disclosed Buffer Driver, that is non-inverting, coupled with an Amplifier (that provides the gain stage) whose inputs are re-arranged in order to keep the signal signs in proper order in making the Buffer Amplifier As such, the amplifier gain stage's output node 414A ($vol_{400A}$) of FIG. 4A can connect to the buffer drivers vin1's, which can be the input node 414B of $BUF_{400B}$, or input node 414C of $BUF_{400C}$, or input nodes 414D of $BUF_{400D}$. Accordingly, gain output node 415A ($vo1_{400A}$) of FIG. 4A can connect to buffer driver vin2's, which can be the input node 415B of $BUF_{400B}$, or input node 415C of $BUF_{400C}$, or input nodes 415D of $BUF_{400D}$, respectively. Also, note that either one or both of the inputs of (inverting) buffer drivers, can be current input terminals.

In the next sections of this disclosure, $AMP_{400B}$, $AMP_{400C}$, or $AMP_{400D}$ are configured in unity gain. In unity gain configuration, the output of $BUF_{400B}$ which is $Vo_{400B}$, or output of $BUF_{400C}$ which is $Vo_{400C}$, or output of $BUF_{400D}$ which is $Vo_{400D}$ connect to the negative input terminal node 412A or $v_{in-}$ of the amplifier gain stage of FIG. 4A. To explain how an amplifier's gain stage interacts with an (inverting) buffer driver, first assume an $AMP_{400}$ which is comprised of amplifier gain stage of FIG. 4A coupled with an ideal (inverting) buffer driver, and describe both the steady state and non-steady state of amplifier gain stage of FIG. 4A. In steady state conditions, and assuming no non-idealities or mismatch, a $AMP_{400}$ configured in unity gain (node 412A or $v_{in-}$ is connected to the output of an ideal inverting buffer driver) would have $v_{in-}=v_{in+}$ (i.e., $\Delta v_{in}=0$). In the input stage of FIG. 4A, there is current equilibrium with $ID_{M409A}\approx ID_{M411A}\approx 0.5\times ID_{M407A}\approx i$ and $ID_{M408A}\approx ID_{M410A}\approx 0.5\times ID_{M406A}$. In the upper and lower current mirrors, there is also current equilibrium, with $ID_{M403A}\approx ID_{M413A}\approx ID_{M415A}\approx 2i$ and $ID_{M402A}\approx ID_{M412A}\approx ID_{M414A}\approx 2i$. Accordingly, $(ID_{M416A}\approx ID_{M418}\approx i)\approx (ID_{M417A}\approx ID_{M419}\approx i)$. Second, assume $AMP_{400}$ is also in unity gain configuration, but it is initially in non-steady-state condition, for example $v_{in-}<v_{in+}$ (albeit a very small finite $-\Delta v_{in}$). Here, $(ID_{M410A}\approx ID_{M408A})<(ID_{M409A}\approx ID_{M411A})$ and $ID_{M406A}>ID_{M407A}$. At node 405A, the increased $ID_{M406A}$ is mirrored via $ID_{M403A}$ to increase $(ID_{M413A}\approx ID_{M415A})$. At node 404A, the decreased $ID_{M406A}$ is mirrored via $ID_{M402A}$ to decrease $(ID_{M412A}\approx ID_{M414A})$. With less of $(ID_{M410A}\approx ID_{M408A})$ flowing into nodes 411A and 409A, there will be more of the increased $(ID_{M413A}\approx ID_{M415A})$ available to flow through $(ID_{M417A}\approx ID_{M419A})$. Conversely, with more of $(ID_{M409A}\approx ID_{M411A})$ flowing into nodes 410A and 408A, there will be less of the decreased $(ID_{M412A}\approx ID_{M414A})$ available to flow through $(ID_{M416A}\approx ID_{M418})$. Hence, initially, in non-steady state condition when $v_{in-}<v_{in+}\rightarrow (ID_{M416A}\approx ID_{M418A})<(ID_{M417A}\approx ID_{M419A})\rightarrow$ initially both node 414A ($Vo1_{400A}$) and node 415A ($Vo2_{400A}$) are pulled down together. Conversely, when $v_{in-}>v_{in+}$, the opposite dynamics occur and initially both node 414A ($Vo1_{400A}$) and node 415A ($Vo2_{400A}$) are pulled up together. Nodes 414A and 415A (are a pair of high-gain high-impedance outputs of the amplifier's gain stage that connect to inputs to the inverting buffer drivers, vin1 and vin2 that) have the same polarity, and move up and down together.

Next, considering the $AMP_{400B}$, or $AMP_{400C}$, or $AMP_{400D}$. Note that steady state conditions may be disturbed indirectly as well. For example, a transitory current imbalance, $\Delta i$, at one of the current input node of the (inverting) buffer drivers that may be initiated by sink-source current in output FETs. In the presence of such transitory $\Delta i$, the closed loop containing the amplifier gain stage (FIG. 4A) in concert with $BUF_{400B}$, or $BUF_{400C}$, or $BUF_{400D}$ could aim to regulate out the $\Delta i$ until current balance is returned in steady state (e.g., by adjusting the voltages at node 414A and 415A via $ID_{M416A}\approx ID_{M418}$ and $ID_{M417A}\approx ID_{M419A}$). This aspect of the description of $AMP_{400}$ will be relevant to the disclosures in the next sections.

It would be possible that the buffer driver methodology described in this disclosure would operate with other alternative amplifiers gain stages, beside that of FIG. 4A. Alternative amplifier gain stages to that of FIG. 4A could be NMOS input FCTA, or PMOS input FCTA, FCTA with RGC, FCTA with input stage that contains double PMOS with an NMOS level shifter, FCTA with input stage that contains double PMOS with an NMOS level shifter, or other non-FCTA configurations, amongst others. In each of the next sections, the $AMP_{400B}$, or $AMP_{400C}$, or $AMP_{400D}$ are configured in unity gain, and $BUF_{400B}$, or $BUF_{400C}$, or $BUF_{400D}$ are described at steady state while sinking and sourcing current for an external load (i.e., sink and source mode). Also, for each of (inverting) buffer drivers, the steady state mode is described with no load.

Section (XIII): Detailed Description of Buffer Driver Comprised of Complementary Non-Inverting Current Mirrors (CNICM), Minimum Current Selector (MCS) and Inverting Current Mirror Amplifier (ICMA), Illustrated in FIG. 4B (4B)

FIG. 4B is a circuit schematic showing a buffer driver ($BUF_{400B}$) (e.g., inverting buffer driver) comprising of $CNICM_{400B}$ and $MCS_{400B}$ coupled with $ICMA_{400B}$. This section build on what was already described in prior section. Note that the difference between the $BUF_{400D}$ embodiment illustrated in FIG. 4D (which is described in its respective section), compared with the $BUF_{400B}$ embodiment illustrated here in FIG. 4B is the inclusion of $CNICM_{400B}$. As such, the detailed description, including benefits are equally applicable between to $BUF_{400D}$ of FIG. 4D and $BUF_{400B}$ of FIG. 4B.

A buffer driver may be required to sink or source large amounts of current when interfacing with an external load. It would be advantageous to reduce the current consumption, in a buffer driver, that is attributed to the function of monitoring and sensing of output FET driver sink-source currents (i.e. $M_{438B}$, $M_{435B}$) that varies depending on the size an external load. One of the benefits of $CNICM_{400B}$ here is to help reduce the buffer driver's load-dependent current consumption. Also, $CNICM_{400B}$ helps the buffer driver with having more consistent performance to specifications that are less dependent on the external load variations.

Throughout the description of FIG. 4B, MOSFET scale factors (e.g., 's', 'k', or W/L rations for $M_{421B}$-$M_{435B}$, $M_{428B}$-$M_{429B}$-$M_{431B}$-$M_{433B}$, $M_{434B}$-$M_{436B}$, etc.) and current source scale factors (e.g., for $I_{405B}$-$I_{406B}$-$I_{407B}$-$I_{408B}$) can be modified depending on cost-performance goals such as die size, current consumption, speed, and cross over distortion, and others. For the FIG. 4B disclosure, s=k=20 but 's', 'k' can have wide ranges $0.01 \leq s \leq 1000000$, $0.01 \leq k \leq 1000000$. The connections of the elements in FIG. 4B are described as follows. The body terminal of all NMOSFETs in FIG. 4B are connected to node 2 which is $V_{SS}$, and the body terminals of PMOSFETs are connected to node 1 which is $V_{DD}$. For clarification, note that having one current source (e.g., $I_{405B}$ and $I_{406B}$) with neither the upper nor the lower terminal connected to a power supply (i.e., $V_{DD}$, $V_{SS}$), is the equivalent of having two current sources where the first one has one of its terminals connected to $V_{DD}$ and the second one has one of its terminals connected to $V_{SS}$. Bias current sources $I_{407B}$, and $I_{408B}$ have their lower terminals connected to node 2, which is $V_{SS}$. The source terminal of NMOSFETs $M_{421B}$, $M_{423B}$, $M_{425B}$, $M_{427B}$, $M_{429B}$, $M_{431B}$, and $M_{435B}$ are connected to node 2 that is $V_{SS}$. The source terminal of PMOSFETs $M_{420B}$, $M_{422B}$, $M_{424B}$, $M_{426B}$, $M_{428B}$, $M_{430B}$, $M_{432B}$, $M_{434B}$, $M_{436B}$, and $M_{438B}$ are connected to node 1 that is $V_{DD}$. Node 414B is the $vin1_{400B}$ terminal of the buffer driver, and is connected to the gate terminal of $M_{420B}$ and the gate terminal of $M_{438B}$. Node 415B is the $vin2_{400B}$ terminal of the buffer driver, and is connected to the gate terminal of $M_{421B}$, the gate terminal of $M_{435B}$, the drain terminal of $M_{436B}$, and the upper terminal of current source $I_{408B}$. Node 416B is connected to the drain terminal of $M_{420B}$, the drain terminal of $M_{422B}$, the gate terminal of $M_{422B}$, the gate terminal of $M_{424B}$, and the upper terminal of current source $I_{405B}$. Node 417B is connected to the drain terminal of $M_{421B}$, the drain terminal of $M_{423B}$, the gate terminal of $M_{423B}$, the gate terminal of $M_{425B}$, and the lower terminal of current source $I_{405B}$. Node 418B is connected to the drain terminal of $M_{424B}$, the drain terminal of $M_{426B}$, the gate terminal of $M_{426B}$, the gate terminal of $M_{428B}$, and the upper terminal of current source $I_{406B}$. Node 419B is connected to the drain terminal of $M_{425B}$, the drain terminal of $M_{427B}$, the gate terminal of $M_{427B}$, the gate terminal of $M_{433B}$, and the lower terminal of current source $I_{406B}$. Node 420B is connected to the gate terminal of $M_{429B}$, the drain terminal of $M_{429B}$, the drain terminal of $M_{428B}$, and the gate terminal of $M_{431B}$. Node 421B is connected to the drain terminal of $M_{431B}$ and the source terminal of $M_{433B}$. Node 422B is connected to the drain terminal of $M_{433B}$, the gate terminal of $M_{430B}$, the drain terminal of $M_{430B}$, and the gate terminal of $M_{432B}$. Node 423B is connected to the drain terminal of $M_{432B}$, the gate terminal of $M_{434B}$, the drain terminal of $M_{434B}$, and the gate terminal of $M_{436B}$, and the upper terminal of current source $I_{407B}$. Node 424B is the $Vo_{400B}$ terminal of the (inverting) buffer driver, and is connected to the drain terminal of $M_{438B}$ and the drain terminal of $M_{435B}$.

The (inverting) buffer driver or $BUF_{400B}$ is comprised of $BLOCK_{400B}$ which is the output FETs, or $FET_{400B}$ (containing source PMOSFET $M_{438B}$ and sink NMOSFET $M_{435B}$), plus $BLOCK_{401B}$ which is the inverting current mirror amplifier or $ICMA_{400B}$ (containing PMOSFETs $M_{430B}$, $M_{432B}$, $M_{434B}$, $M_{436B}$, and current sources $I_{407B}$, $I_{408B}$), plus $BLOCK_{402B}$ which is the minimum current selector or $MCS_{400B}$ (containing PMOSFET $M_{M428B}$, and NMOSFETs $M_{429B}$, $M_{431B}$, and $M_{433B}$), plus $BLOCK_{403B}$ which is the complementary non-inverting current mirror or $CNICM_{400B}$ (containing on PMOSFETs side $M_{420B}$, $M_{422B}$, $M_{424B}$, $M_{426B}$, and on the NMOSFET side $M_{421B}$, $M_{423B}$, $M_{425B}$, $M_{427B}$, and current sources $I_{405B}$ and $I_{406B}$). As noted earlier $I_{405B}$ can be be the functional equivalent of 2 current sources, and is shown as one current source for demonstrative simplicity. There can be $I_{405B1}$ and $I_{405B2}$ where upper terminal of $I_{405B1}$ is connected to $V_{DD}$ and lower terminal of $I_{405B2}$ is connected to $V_{SS}$. As such, lower terminal of $I_{405B1}$ and upper terminal of $I_{405B2}$ can be the functional equivalence of the lower and upper terminals of $I_{405B}$. As stated earlier, $AMP_{400B}$ is comprised of the amplifier gain stage of FIG. 4A coupled with $BUF_{400B}$, where node 414A is connected to node 414B, node 415A is connected to node 415B. $AMP_{400B}$ is configured in unity gain with node 412A (the amplifier gain stage negative input terminal) connected to node 420B (or $Vo_{400B}$).

Note that it would be possible to utilize a ICMA that is a complementary version of $ICMA_{400B}$ (i.e., PMOSFET based or NMOSFET based). It would also be possible to utilize an MCS that is a complementary version of $MCS_{400B}$ (i.e., PMOSFET base or NMOSFETs based). It would also be possible that a plurality of MCS coupled with a plurality of MCSs can be utilized, which are complementary to one another (e.g., NMSOFET based ICMA coupled with primarily PMOSFET based MCS, utilized along with PMSOFET based ICMA coupled with primarily NMOSFET based MCS).

Moreover, it would be possible to design a buffer driver that utilize other equivalent functional implementations that are complementary non-inverting current mirrors (CNICM), minimum current selector (MCS) or inverting current mirror amplifier (ICMA). For example, a loser take all (LTA) can perform the equivalent function of MCS. Another example would be to utilize a current mirror amplifier (CMA) instead of an non-inverting current mirror amplifier (ICMA) by arranging the proper circuit signal signs. Another example would be to utilize a current amplifier to perform the equivalent function of a ICMA.

In describing the function of $CNICM_{400B}$, the non-idealities (e.g., offsets and mismatches) are set aside and the boundary conditions are discussed (when $M_{438B}$ is maximally on and $M_{435B}$ is off, and when $M_{438B}$ is off on and $M_{435B}$ is maximally on). After that, $CNICM_{400B}$'s steady state condition is described (when the quiescent currents in $M_{438B}$ and $M_{435B}$ is equal to i×s, where MOSFET scale factors s=k). The $M_{438B}$ current is scaled down (by a factor of 's') and mirrored by $M_{420B}$. For clarity of description here, the $ID_{M420B}$ is the input, and $ID_{M426B}$ is the output for PMOSFET side of $CNICM_{400B}$. If $ID_{M438B} \approx 0 \rightarrow ID_{M420B} \approx 0 \rightarrow$ all of $I_{405B} \approx 2i$ flows onto $ID_{M422B} \approx 2i \rightarrow ID_{M424B} \approx 2i$. Thus, all of $I_{406B} \approx 2i$ is taken by $M_{424B} \rightarrow ID_{M426B} \approx 0$, which in effect is the (zero scale) non-inverting current mirror of $ID_{M438B} \approx 0$. If $ID_{M438B} \approx i_{max} \rightarrow ID_{M420B} \approx i_{max} \times 1/s$. Assuming that $i_{max} \times 1/s > 2i$. Note here that the maximum current consumed in $ID_{M420B}$ is '2i' that substantially lowers $V_{DS}$ of $M_{420B}$, which substantially curbs the load-dependent source current consumption of $BUF_{400B}$. Thus, all of $I_{405B} \approx 2i$ is taken by $M_{420B} \rightarrow ID_{M422B} \approx 0 \rightarrow ID_{M424B} \approx 0$. Thus, all of $I_{406B} \approx 2i$ flows into $M_{426B} \rightarrow ID_{M426B} \approx 2i$, which in effect is the rectified non-inverting current mirror of $ID_{M438B} \approx i_{max}$. Note that the maximum (full scale) output current possible for $M_{426B}$ is 2i which corresponds to $i_{max}$ of $M_{438B}$ (and its scaled down and mirrored current $i_{max} \times 1/s$ of $M_{420B}$). Also note that $ID_{M426B}$ that is monitored by $MCS_{400B}$ (via $M_{428B}$, $M_{429B}$, $M_{431B}$) has its full scale current caped at 2i enabling it to respond more consistently to $i_{max}$ swings imposed on $FET_{400B}$ for sourcing current, for example, for heavy external loads (e.g., $i_{max} >> 2i \times s$).

For steady state, let's assume that there is no external load, and that $ID_{M438B} \approx s \times i$. Thus, $ID_{M420B} \approx i \rightarrow$ the $I_{405B} \approx 2i$ is split in half and $ID_{M420B} \approx ID_{M422B} \approx i \rightarrow ID_{M424B} \approx i$. Thus, $I_{406B} \approx 2i$ is also split in half$\rightarrow ID_{M424B} \approx ID_{M426B} \approx i \rightarrow ID_{M426B} \approx i$, which in effect is the scaled down (by 1/s) non-inverting current mirror of $ID_{M438B} \approx s \times i$. Similar signal flow applies to the NMOSFET side of $CNICM_{400B}$, where the $M_{435B}$ current is scaled down (by a factor of 'k') and mirrored onto $M_{421B}$. If $ID_{M435B} \approx 0 \rightarrow ID_{M421B} \approx 0 \rightarrow$ all of $I_{405B} \approx 2i$ flows onto $ID_{M423B} \approx 2i \rightarrow ID_{M425B} \approx 2i$. Thus, all of $I_{406B} \approx 2i$ is taken by $M_{425B} \rightarrow ID_{M427B} \approx 0$, which in effect is the (zero scale) non-inverting current mirror of $ID_{M435B} \approx 0$. If $ID_{M435B} \approx i_{max} \rightarrow ID_{M421B} \approx i_{max} \times 1/k$. Let's assume that $i_{max} \times 1/k > 2i$. Note here that the maximum current consumed in $ID_{M421B}$ is '2i' that substantially lowers $V_{DS}$ of $M_{421B}$, which substantially curbs the load-dependent sink current consumption of $BUF_{400B}$. Thus, all of $I_{405B} \approx 2i$ is taken by $M_{421B} \rightarrow ID_{M423B} \approx 0 \rightarrow ID_{M425B} \approx 0$. Thus, all of $I_{406B} \approx 2i$ flows into $M_{427B} \rightarrow ID_{M427B} \approx 2i$, which in effect is the rectified non-inverting current mirror of $ID_{M435B} \approx i_{max}$. Note that the maximum (full scale) output current possible for $M_{427B}$ is 2i which corresponds to $i_{max}$ of $M_{435B}$ (and its scaled down and mirrored current $i_{max} \times 1/k$ of $M_{421B}$). Also note that $ID_{M427B}$ that is monitored by $MCS_{400B}$ (via $M_{433B}$) has its full scale current caped at 2i enabling it to respond more consistently to $i_{max}$ swings imposed on $FET_{400B}$ for sinking current, for example, for heavy external loads (e.g., $i_{max}>>2i\times k$). For steady state, again it is assumed that there is no external load, and that $ID_{M435B}\approx k\times i$. Thus, $ID_{M421B}\approx i\rightarrow$the $I_{405B}\approx 2i$ is split in half and $ID_{M421B}\approx ID_{M423B}\approx i\rightarrow ID_{M425B}\approx i$. Thus, $I_{406B}\approx 2i$ is also split in half$\rightarrow ID_{M425B}\approx ID_{M427B}\approx i\rightarrow ID_{M427B}\approx i$, which in effect is the scaled down (by 1/k) non-inverting current mirror of $ID_{M435B}\approx k\times i$.

In summary, $BLOCK_{403B}$ is $CNICM_{400B}$ which is the complementary non-inverting current mirror. One of the functions of $CNICM_{400B}$ is to monitor and mirror the currents in $FET_{400B}$, and rectify the full scale (maximal) mirrored currents that feed the $MCS_{400B}$. Given that the sink-source currents of $FET_{400B}$ can vary significantly, depending on the external load, the scaled down but unrectified mirroring of $FET_{400B}$ raw currents can also vary a lot, and increase the current consumption of a (inverting) buffer driver. Mirroring and rectifying the sink-source currents of $FET_{400B}$ via $CNICM_{400B}$, caps the full scale and curbs the maximal mirrored currents (e.g., to '2i') before the sink-source current signals are fed to $MCS_{400B}$ for signal processing.

Therefore, arranging $BUF_{400B}$ comprising $CNICM_{400B}$ coupled with $MCS_{400B}$ coupled with $ICMA_{400B}$ provides the $BUF_{400B}$ with added benefit of lower (load-dependent) sink-source current consumption, as well as more consistent DC, AC, and transient performance, especially under varying external load conditions. As stated earlier, description of $BUF_{400B}$ is provided considering that it is part of $AMP_{400B}$ that is configured in unity gain.

Before describing the $BUF_{400B}$ operating in steady state and over drive (sink-source), the current equilibrium conditions are described at nodes 414A, 414B and 415A, 415B for steady state to persist. At nod 415B in FIG. 4B (which is connected to node 415A in FIG. 4A), KCL requires the sum of $ID_{M416A}$, $ID_{M417A}$, $I_{408B}$, and $ID_{M436B}$ to converge to zero in order for steady state to hold. Also, at node 414B in FIG. 4B (which is connected to node 414A in FIG. 4A), KCL requires the sum of $ID_{M418A}$, and $ID_{M419A}$ to converge to zero for steady state to hold. Moreover, for $AMP_{400}$ unity gain loop (containing amplifier gain stage of FIG. 4A and $BUF_{400B}$) to stay in steady state, $(ID_{M417A}\approx ID_{419A})\approx(ID_{M416A}\approx ID_{M418A})$ and $I_{408B}\approx ID_{M429B}$. This is called "the conditions of current equilibrium for nodes 414B and 415B" which will be referred to below.

During steady-state conditions, $ID_{M421B}\approx ID_{M427B}\approx i$ (with k≈s, and corresponding to $ID_{M435B}\approx k\times i$), and $ID_{M420B}\approx ID_{M426B}\approx i$ (with k≈s, and corresponding to $ID_{M438B}\approx s\times i$). Therefore, $ID_{M426B}\approx ID_{M428B}\approx ID_{M429B}\approx ID_{M431B}\approx i\rightarrow VGS_{M427B}\approx VGS_{M429B}\approx VGS_{M431B}$. As explained in the previous sections above, with $M_{429B}$ and $M_{427B}$ (both with W/L=1X) operating at current 'i' while providing equal gate voltages for $M_{431B}$ and $M_{433B}$ that are in series (both with W/L=2X), causes the operating current of $M_{431B}$ and $M_{433B}$ to also be 'i'. As such, the $MCS_{400B}$ selects current equality when $min(M_{426B}, M_{427B})\approx min(M_{428B}, M_{433B})\approx M_{433B}\approx M_{428B}\approx i$. The $ID_{M433B}\times i$ is the output of $MCS_{400B}$ that is fed onto $M_{430B}$ which is the input to $ICMA_{400B}$. Here, for the current mirror $ID_{M430B}\approx i\approx ID_{M432B}\rightarrow$the current source $I_{407B}\approx 2i$ is split equally between $ID_{M432B}\approx i\approx ID_{M434B}\rightarrow$the current mirror $ID_{M434B}\approx ID_{M436B}\approx i$. The $ID_{M436B}\approx i$ is in balance with the current source $I_{408B}\approx i$. This is how current equilibrium is held at node 415B, which sustains the controlled quiescent currents in the buffer driver output FETs, $ID_{M438B}\approx ID_{M435B}\approx s\times i$ (assume setting k≈s).

A brief summary is provided here for $BUF_{400B}$ (contained in $AMP_{400B}$) of FIG. 4B, utilizing $CNICM_{400B}$ coupled with $MCS_{400B}$ coupled with $ICMA_{400B}$, for the sink and source modes when there is large difference between $ID_{M438B}$ and $ID_{M435B}$. As a reminder, k=s and $ID_{M435B}$ is rectified by $CNICM_{400B}$ and presented to $MCS_{400B}$ via $ID_{M427B}$, and $ID_{M438B}$ is rectified by $CNICM_{400B}$ and presented to $MCS_{400B}$ via $ID_{M426B}$.

In the sink mode, node 414B and node 415B are pulled up towards $V_{DD}$, $MN_{435B}$ and $MN_{421B}$ are turned on$\rightarrow ID_{M421B}>>i\rightarrow$initially before current equilibrium $ID_{M427B}\approx 2i$. Also, $MN_{438B}$ and $MN_{420B}$ are turned off or are nearly off, initially$\rightarrow ID_{M426B}\approx ID_{M428B}\approx ID_{M429B}\approx ID_{M431B}\approx 0$ which would block current flow in $ID_{M433B}\rightarrow MCS_{400B}$ selects the $min(ID_{M427B}, ID_{M426B})=ID_{M426B}\approx 0<<i$, which starves $M_{433B}$, and initially$\rightarrow ID_{M432B}\approx ID_{M430B}<<i\rightarrow$all of $I_{407B}=2i$ flows into $M_{434B}\rightarrow ID_{M434B}\approx ID_{M436B}\approx 2i$ at node 415B with $I_{408B}=i$, which in a current imbalance at node 415B initially, and as such the $AMP_{400B}$ loop kicks to bring back the balance. In order for "conditions of current equilibrium for nodes 414B and 415B" to return, and to simplify the explanation for clarity of description, in FIG. 4A $(ID_{M417A}\approx ID_{M419A})$ can get very slightly increased above $(ID_{M416A}\approx ID_{M418A})$. Here, by $AMP_{400B}$ loop regulation, the voltages at both node 414B and node 415B are pulled down sufficiently enough until $M_{420B}$ (and its mirror $M_{438B}$) turn back on enough for $ID_{M420B}\approx ID_{M426B}\approx i\rightarrow ID_{M428B}\approx ID_{M429B}\approx ID_{M431B}\approx i\rightarrow$by moving towards current balance, $MCS_{400B}$ inputs are regulated and as such $min(ID_{M426B}, ID_{M427B})\approx ID_{M426B}\approx i$. Such is the case since $M_{435B}$ is still sinking current, $ID_{M435B}>ID_{M438B}\rightarrow ID_{M421B}>ID_{M420B}\rightarrow ID_{M427B}>ID_{M426B}$. As explained in the previous section, note that in FIG. 4A, despite the very slight increase in $(ID_{M417A}\approx ID_{M419A})$ above $(ID_{M416A}\approx ID_{M418A})$ to regulate down the voltages at node 414B and 415B, $ICMA_{400B}$ (coupled and being fed via $MCS_{400B}$ and $CNICM_{400B}$) have enough gain to regulate a slightly increased $ID_{M436B}$ (as compared to the fixed $I_{408B}\approx i$) to keep the voltage at node 415B high enough so that $M_{435B}$ can continue sinking high currents to the external load. Here, the "conditions of current equilibrium for nodes 414B and 415B" are held, and steady state conditions maintained, while $M_{426D}$ to continue sourcing current. Accordingly, $ID_{M420B}\approx i\rightarrow$the operating current in the inactive source-FET is thus controlled and regulated at $ID_{M431B}\approx s\times i$, while steady state condition is maintained and the sink FET, $M_{435B}$, continues sinking extra current to an external load.

Conversely, in the source mode, when node 414B and node 415B of FIG. 4B are pushed down towards $V_{SS}$, initially $M_{438B}$ and $M_{420B}$ turn on and $M_{435B}$ and $M_{421B}$ turn off$\rightarrow$then initially before equilibrium, $ID_{M426B}\approx ID_{M428B}\approx ID_{M429B}\approx ID_{M431B}\approx 2i$. Moreover, $ID_{M427B}\approx 0\rightarrow VG_{M427B}=0=VG_{M433B}\rightarrow M_{433B}$ blocks flow of $ID_{M431B}\rightarrow$thus, before equilibrium, $MCS_{400B}$ selects the min $(ID_{M427B}, ID_{M426B})\approx ID_{M426B}\approx 0\rightarrow$output of $MCS_{400B}$ is $ID_{M433B}\approx 0$ that is fed onto $M_{430B}$ which is the input of $ICMA_{400B}$. $ID_{M430B}\approx 0\approx ID_{M432B}\rightarrow$all of current in $I_{407B}\approx 2i$, before equilibrium, could flows in the current mirror $ID_{M434B}\approx ID_{M436B}\approx 2i>I_{408B}\approx 1i$, which creates a current imbalance at node 415B that is unsustainable and as such $ICMA_{400B}$ contained within the $AMP_{400D}$ loop kicks in to regulate back towards current equilibrium. In order for "conditions of current equilibrium for nodes 414B and 415D" to hold, and to simplify the explanation for clarity of description, $(ID_{M416A}\approx ID_{M418A})\approx(ID_{M417A}\approx ID_{M419A})$. Concurrently, voltage at node 415B gets regulated by being pulled up by $ID_{M436B}$ until $ID_{M436B} \approx i = I_{408B}$. In order to arrive at this current equilibrium, $ICMA_{400B}$ along with $AMP_{400B}$ loop regulate the voltage of node 415B down sufficiently enough until $ID_{M436B} \approx i = I_{408B} \rightarrow ID_{M421B} \approx ID_{M427B} \approx i$. By moving towards current balance, $MCS_{400B}$ inputs are regulated and as such min ($ID_{M426B}$, $ID_{M427B}) \approx ID_{M427B} \approx i$. Such is the case because $M_{438B}$ is still sourcing high currents to for an external load→$ID_{M435B} < ID_{M438B} \rightarrow ID_{M421B} < ID_{M420B} \rightarrow ID_{M427B} < ID_{M426B}$. As such, when the buffer driver sources current for an output load, then $M_{435B}$ which is the inactive sink FET, can operate at a controlled regulated current $ID_{M435B} \approx k \times i$. Again, note that 'i' is a constant current source set by the main bias network of the amplifier, and 'k' is FET aspect ratio that is tightly controllable, which helps with the control of the quiescent current in the inactive sink FET.

In summary, when there is an imbalance between sink-source FETs currents, $ID_{M438B}$ and $ID_{M435B}$, such imbalance is scaled down, mirrored, and rectified by the complementary non-inverting current mirror ($CNICM_{400B}$). The outputs of $CNICM_{400B}$, $ID_{M427B}$ and $ID_{M426B}$, which are the rectified version of sink-source currents, are then fed onto the $MCS_{400B}$. The $MCS_{400B}$ effectively selects the (scaled) minimum current between the output drive currents $ID_{M438B}$ and $ID_{M435B}$. The selected minimum current, at the output of $MCS_{400B}$, is then inputted onto $ICMA_{400B}$ which, together with the operations of amplifier's gain stage, regulates a minimum quiescent current in the inactive FET (e.g. for s=k, when $ID_{M435B}$ is sinking current for an external load→inactive source FET $ID_{M438B} = s \times i$, and when $ID_{M438B}$ is sourcing current for an external load→inactive sink FET $ID_{M435B} = k \times i$).

In conclusion, as noted in the previous section, the benefits of the FIG. 4D's $BUF_{400D}$ are equally applicable to that of FIG. 4B's $BUF_{400B}$ (comprising CNICM couple with MCS coupled with ICMA) which are briefly summarized here again. First, the function of 'monitoring', of sink-source currents, consume current itself. Sink-source currents can be high and have unpredictable patterns. The CNICM effectively curbs (e.g., rectify) the 'monitoring' current consumption. Also the rectifying of output FET currents, before they are fed to the MCS and ICMA, helps with consistency of DC, AC, and transient performance of the buffer driver, with more independence from external load variations. Second, the buffer driver is fast since the CNICM couple with MCS coupled with ICMA are all in principal operating in current mode, which is inherently fast. Third, it can operate with low power supply voltage since the minimum $V_{DD}$ is $V_{GS} + 2V_{DS}$ (low voltage) for CNICM, MCS, and ICMA. Fourth, it is made of a few transistor which makes it small and low cost. Fifth, buffer driver can operate with ultra low current and ultra low power, and utilization of CNICM helps curb the current consumption attributed with monitoring the sink-source currents when the amplifier drives different external loads. Sixth, it has wide input-output span of near rail-to-rail. Seventh, it can provide high sink-source drive capability and controlled quiescent current in the inactive output FET that benefits DC and dynamic performance. FIG. 4E is a simulation of a buffer amplifier containing buffer driver of FIG. 4B coupled with gain stage of FIG. 4A. This simulations indicates approximate and typical sink-source current capability for the buffer amplifier to drive external load resistors 900KΩ, 300KΩ, and 30KΩ. The simulation indicates current consumption for the buffer amplifier of roughly 120 nA for FIG. 4B coupled with gain stage of FIG. 4A. Eighth, buffer driver is minimally imposing on the amplifier's gain or the speed of the preceding amplifier's high-gain stage Ninth, it's based on standard CMOS process which is low cost, high quality, ready available). Tenth, the buffer driver arrangement utilizing CNICM coupled with MCS coupled with ICMA can be tailored to very high current and very high speed.

Section (XIV): Detailed Description of Buffer Driver Comprised of Complementary Non-Inverting Current Mirrors (CNICM), Loser Take All (LTA) and Current Mirror Amplifier (CMA), Illustrated in FIG. 4C (4C)

FIG. 4C is a circuit schematic showing a (inverting) buffer driver ($BUF_{400C}$) comprising of $CNICM_{400C}$ and $LTA_{400C}$ coupled with $CMA_{400C}$. This section builds on what was already described in previous section. A difference between the $BUF_{400C}$ embodiment illustrated in FIG. 4B in the previous section compared to the $BUF_{400C}$ embodiment illustrated in FIG. 4C is the utilization of $LTA_{400C}$ which is functionally equivalent to $MCS_{400B}$. As such, the detailed description (e.g., regarding $AMP_{400B}$, $CNICM_{400B}$, $CMA_{400B}$) that were provided in prior section pertaining to $BUF_{400B}$ of FIG. 4B are equally applicable to that of $BUF_{400C}$ of FIG. 4C.

Throughout the description of FIG. 4C, MOSFET scale factors (e.g., 's', 'k', or W/L rations for $M_{421C}$-$M_{439C}$, $M_{432C}$-$M_{420C}$, $M_{426C}$-$M_{428C}$, $M_{427C}$-$M_{429C}$, etc.) and current source scale factors (e.g., for $I_{405C}$-$I_{406C}$-$I_{407C}$) can be modified depending on cost-performance goals such as die size, current consumption, speed, and cross over distortion, and others. For example, the FIG. 4C disclosure, s=k=20 but 's', 'k' can have wide ranges 0.01≤s≤1000000, 0.01≤k≤1000000.

The connections of the elements in FIG. 4C are described as follows. The body terminal of all NMOSFETs in FIG. 4C are connected to node 2 which is $V_{SS}$, and the body terminals of PMOSFETs are connected to node 1 which is $V_{DD}$. Bias current sources $I_{407C}$ upper terminals connected to node 1, which is $V_{DD}$. The source terminal of NMOSFETs $M_{421C}$, $M_{423C}$, $M_{425C}$, $M_{427C}$, $M_{429C}$, $M_{431C}$, $M_{433C}$, $M_{435C}$, $M_{437C}$, and $M_{439C}$ are connected to node 2 that is $V_{SS}$. The source terminal of PMOSFETs $M_{420C}$, $M_{422C}$, $M_{424C}$, $M_{426C}$, $M_{428C}$, $M_{430C}$, and $M_{432C}$ are connected to node 1 that is $V_{DD}$. Node 414C is the $vin1_{400C}$ terminal of the buffer driver, and is connected to the gate terminal of $M_{420C}$ and the gate terminal of $M_{432C}$. Node 415C is the $vin2_{400C}$ terminal of the buffer driver, and is connected to the gate terminal of $M_{421C}$, the gate terminal of $M_{439C}$, the drain terminal of $M_{437C}$, and the lower terminal of current source $I_{407C}$. Node 416C is connected to the drain terminal of $M_{420C}$, the drain terminal of $M_{422C}$, the gate terminal of $M_{422C}$, the gate terminal of $M_{424C}$, and the upper terminal of current source $I_{405C}$. Node 417C is connected to the drain terminal of $M_{421C}$, the drain terminal of $M_{423C}$, the gate terminal of $M_{423C}$, the gate terminal of $M_{425C}$, and the lower terminal of current source $I_{405C}$. Node 418C is connected to the drain terminal of $M_{424C}$, the drain terminal of $M_{426C}$, the gate terminal of $M_{426C}$, the gate terminal of $M_{428C}$, the gate terminal of $M_{430C}$, and the upper terminal of current source $I_{406C}$. Node 419C is connected to the drain terminal of $M_{425C}$, the drain terminal of $M_{427C}$, the gate terminal of $M_{427C}$, the gate terminal of $M_{429C}$, and the lower terminal of current source $I_{406C}$. Node 420C is connected to the drain terminal of $M_{429C}$, the drain terminal of $M_{428C}$, the drain terminal of $M_{431C}$, the gate terminal of $M_{431C}$, and the gate terminal of $M_{433C}$. Node 421C is connected to the drain terminal of $M_{430C}$, the drain terminal of $M_{433C}$, the gate terminal of $M_{435C}$, the drain terminal of $M_{435C}$, and the gate terminal of $M_{437C}$. Node 422C is the $Vo_{400C}$ terminal of the (inverting) buffer driver, and is connected to the drain terminal of $M_{432C}$ and the drain terminal of $M_{439C}$.

The buffer driver (e.g., inverting buffer drive) or $BUF_{400C}$ is comprised of $BLOCK_{400C}$ which is the output FETs, or $FET_{400C}$ (containing source PMOSFET $M_{432C}$ and sink NMOSFET $M_{439C}$); plus $BLOCK_{401C}$ which is the inverting current mirror amplifier or $CMA_{400C}$ (containing NMOSFETs $M_{435C}$, and $M_{437C}$, and current sources $I_{407C}$); plus $BLOCK_{402C}$ which is the loser take all or $LTA_{400C}$ (containing PMOSFET $M_{428C}$, and $M_{430C}$, and NMOSFETs $M_{429C}$, $M_{431C}$, and $M_{433C}$); plus $BLOCK_{403C}$ which is the complementary non-inverting current mirror or $CNICM_{400C}$ (containing on PMOSFETs side $M_{420C}$, $M_{422C}$, $M_{424C}$, $M_{426C}$, and on the NMOSFET side $M_{421C}$, $M_{423C}$, $M_{425C}$, $M_{427C}$, and current sources $I_{405C}$ and $I_{406C}$). As stated earlier, $AMP_{400C}$ includes an amplifier gain stage of FIG. 4A coupled with $BUF_{400C}$, where node 414A is connected to node 414C, node 415A is connected to node 415C. $AMP_{400C}$ is configured in unity gain with node 412A (the amplifier gain stage negative input terminal) connected to node 422C (or $Vo_{400C}$). Note that it would be possible to utilize a CMA that is complementary version of $CMA_{400C}$ (i.e., PMOSFET based or NMOSFET based). Also, it would also be possible to utilize an LTA that is a complementary version of $LTA_{400C}$ (i.e., primarily PMOSFET base or NMOSFETs based). It would also be possible that plurality of CMAs coupled with plurality of LTAs can be utilized, which are complementary to one another (e.g., NMSOFET based CMA coupled with primarily NMOSFET based LTA, utilized along with PMSOFET based CMA coupled with primarily PMOSFET based LTA). Moreover, it would be possible to design a buffer driver that utilizes other equivalent functional implementations of CNICM, LTA or CMA. For example, LTA can perform the equivalent function of MCS. Another example would be to utilize, current mirror amplifier (CMA) instead of CMA by properly arranging the circuit signal signs. This can be done, for example, by arranging an inverting LTA feeding a CMA, instead of LTA feeding a CMA. Another example would be to utilize a current amplifier (CA) or an inverting CA to perform the equivalent function of a CMA or CMA, respectively.

The detailed description of the $CNICM_{400C}$, $LTA_{400C}$, $CMA_{400C}$ were provided in previous sections, and their inner working as part of $AMP_{400C}$ loop will be be briefly discussed in this section. For clarity of description, non-idealities (e.g., offsets or mismatches) are set aside in these discussions. Before describing the $BUF_{400C}$ operating in steady state conditions and over drive (sink-source), the current equilibrium conditions are described at nodes 414A, 414C and 415A, 415C in order for the steady state conditions to persist. At node 415C in FIG. 4C (which is connected to node 415A in FIG. 4A), KCL requires the sum of $ID_{M416A}$, $ID_{M417A}$, $I_{408C}$, and $ID_{M436C}$ to converge to zero. Also, at nod 414C in FIG. 4C (which is connected to node 414A in FIG. 4A), KCL requires the sum of $ID_{M418A}$, and $ID_{M419A}$ to converge to zero. Moreover, for $AMP_{400}$ unity gain loop (containing amplifier gain stage of FIG. 4A and $BUF_{400C}$) to stay in steady state, $(ID_{M417A} \approx ID_{M419A}) \approx (ID_{M416A} \approx ID_{M418A})$ and $I_{407C} \approx ID_{M437C}$. This is called "the conditions of current equilibrium for nodes 414C and 415C" in this section, which will be referred to herein this description.

As explained in the previous section, $BLOCK_{403C}$ is $CNICM_{400C}$ which is the complementary non-inverting current mirror, and one of its function is to monitor by mirroring the $FET_{400C}$ currents and rectify them before feeding the $LTA_{400C}$ for signal processing. Mirroring and rectifying the sink-source currents of $FET_{400C}$ via $CNICM_{400C}$, curbs the maximal mirrored currents (e.g., to '2i') before they are fed to $LTA_{400C}$. Setting k=s, for steady state conditions (with no external load), it is assumed that $ID_{M439C} \approx k \times i \approx ID_{M432C} \approx s \times i \rightarrow ID_{M421C} \approx i \approx ID_{M420C} \rightarrow $the $I_{405C} \approx 2i$ is split in half$\rightarrow ID_{M421C} \approx ID_{M423C} \approx i \approx ID_{M425C}$ and $ID_{M420C} \approx ID_{M422C} \approx i \approx ID_{M424C} \rightarrow$the $I_{406C} \approx 2i$ is split in half$\rightarrow ID_{M424C} \approx i \approx ID_{M426C} \approx ID_{M428C} \approx ID_{M430C}$, and $ID_{M425C} \approx i \approx ID_{M427C} \approx ID_{M429C}$. The $ID_{M426C}$ and $ID_{M427C}$ represent the inputs and $ID_{M435C}$ represents the output of $LTA_{400C}$. As indicated before, one of the tasks of minimum current selector (MCS) or its functional equivalent $LTA_{400C}$ (in the embodiment of $BUF_{400C}$) here is to monitor the sink-source signals, in this case through $CNICM_{400C}$ that provides $ID_{M426C}$ and $ID_{M427C}$ which are then fed onto $LTA_{400C}$ that outputs the current $ID_{M435C}$. In steady state, with $ID_{M428C} \approx i \approx ID_{M429C} \rightarrow$ at node 420C, $ID_{M428C} - ID_{M429C} \approx ID_{M431C} \approx 0 \approx ID_{M433C}$ there is no current left for $M_{431C} \rightarrow ID_{M431C} \approx 0 \approx ID_{M433C} \rightarrow$ at node 421C, with $ID_{M430C} \approx i$, and $ID_{430C} - ID_{M433C} \approx ID_{M435C} \approx i$. In summary, in steady state, $LTA_{400C}$ responds to current equality with LTA $(ID_{M426C}, ID_{M427C}) \approx ID_{M426C} \approx ID_{M427C} \approx i$, which is fed onto the input of $ICMA_{400C}$ via $M_{435C}$. The functions of the $CMA_{400C}$, as contained in the $AMP_{400C}$, is to help regulate the steady-state current in $FET_{400C}$. Accordingly, $ID_{M435C} \approx i \rightarrow ID_{M437C} \approx i \approx I_{407C}$. Here, $AMP_{400C}$ loop is in steady-state, and node 414C and 415C currents are balanced with $(ID_{M417A} \approx ID_{M419A}) \approx (ID_{M416A} \approx ID_{M418A})$ and $I_{407C} \approx ID_{M437C}$.

Next will be described the sink conditions. In the sink mode, node 414C and node 415C are pulled up towards $V_{DD}$, $MN_{439C}$ and $MN_{421C}$ are turned on$\rightarrow ID_{M421C} \gg i \rightarrow$initially before current equilibrium $ID_{M427C} \approx 2i$, which feeds one of $LTA_{400C}$ inputs. Also, $M_{432C}$ and $M_{420C}$ are turned off or are nearly off, initially $\rightarrow ID_{M426C} \approx 0$ which feeds the other input of $LTA_{400C} \rightarrow ID_{M426C} \approx ID_{M428C} \approx ID_{M430C} \approx 0$ and $ID_{M427C} \approx 2i \approx ID_{M429C}$, which pulls down on the voltage at node 420C towards $V_{SS} \rightarrow ID_{M431C} \approx 0 \approx ID_{M433C} \rightarrow$with $ID_{M430C} \approx 0 \approx ID_{M433C}$, then $ID_{M430C} - ID_{C433C} \approx 0$ is the net current output of the $LTA_{400C}$ that is fed onto $M_{435C}$, as the input of $CMA_{400C}$. In summary so far, before equilibrium, the LTA $(ID_{M426C}, ID_{M427C}) \approx ID_{M426C} \approx 0$ that is fed onto $CMA_{400C}$ via $M_{435C} \rightarrow ID_{M435C} \approx ID_{M437C} \approx 0 < I_{407C} \approx i$ at node 415C, which is a current imbalance, initially$\rightarrow AMP_{400C}$ loop kicks to bring back the balance. In order for "conditions of current equilibrium for nodes 414C and 415C" to return here, and to simplify the explanation for clarity of description, in FIG. 4A $(ID_{M417A} \approx ID_{M419A})$ can increase slightly over $(ID_{M416A} \approx ID_{M418A}) \rightarrow AMP_{400C}$ loop can regulate down $V_{414C}$ and $V_{415C}$ slightly enough until $M_{420C}$ (and its mirror $M_{432C}$) turn back on enough for $ID_{M420C} \approx ID_{M426C} \approx i \approx ID_{M428C} \approx ID_{M430C}$. Moving towards steady state while, $MN_{439C}$ is sinking current for an external load$\rightarrow ID_{M421C} \gg i \rightarrow ID_{M427C} \approx 2i \approx ID_{M429C} \rightarrow ID_{M429C} \approx 2i > ID_{M428C} \approx i \rightarrow M_{429C}$ pulls down on the voltage at node 420C towards $V_{SS} \rightarrow ID_{M431C} \approx 0 \approx ID_{M433C} \rightarrow$moving towards steady state, with $ID_{M430C} \approx i$, then $ID_{M430C} - ID_{M433C} \approx i$ is the net current output of the $LTA_{400C}$ that is fed onto $M_{435C}$, as the input of $CMA_{400C}$. Note that $LTA(ID_{M426C}, ID_{M427C}) \approx ID_{M426C} \approx i$. In summary, this is the case for $LTA_{400C}$ since $M_{439C}$ is still sinking current, $ID_{M439C} > ID_{M432C} \rightarrow ID_{M421C} > ID_{M420C} \rightarrow ID_{M427C} > ID_{M426C}$. As explained in the previous section, note that in FIG. 4A, despite the very slight increase in $(ID_{M417A} \approx ID_{M419A})$ over $(ID_{M416A} \approx ID_{M418A})$ that can regulate down $V_{414C}$ and $V_{415C}$, then $CMA_{400C}$ (coupled and being fed via $LTA_{400C}$ and $CNICM_{400C}$) have enough gain to regulate $ID_{M437C}$ low enough (below the fixed $I_{407C} \approx i$) in order $V_{415C}$ to be high enough so that $M_{439C}$ can continue sinking high currents to the external load. Here, the "conditions of current equilibrium for nodes 414C and 415C" are held, and steady state conditions maintained, while $M_{439C}$ to continue sourcing current for an external load. Accordingly, $ID_{M420C} \approx i \rightarrow$operating current in the inactive source-FET is thus controlled and regulated at $ID_{M431C} \approx s \times i$, while steady state condition is maintained and the sink FET, $M_{439C}$, continues sinking extra current to an external load.

Conversely, in the source mode, when node 414C and node 415C of FIG. 4C are pushed down towards $V_{SS}$, initially $M_{432C}$ and $M_{420C}$ turn on and $M_{439C}$ and $M_{421C}$ turn off→then initially before equilibrium, $ID_{M426C} \approx 2i$ and $ID_{M427C} \approx 0$. In the $LTA_{400C}$, $ID_{M426C} \approx 2i \approx ID_{M428C} \approx ID_{M430C}$ and $ID_{M427C} \approx 0 \approx ID_{M429C} \rightarrow ID_{M428C} - ID_{M429C} \approx 2i \approx ID_{M431C} \approx ID_{M433C} \rightarrow$before equilibrium, $ID_{M430C} - ID_{M433C} \approx 2i - 2i \approx 0$ is the net current output of the $LTA_{400C}$ that is fed onto $M_{435C}$ as the input of $CMA_{400C} \rightarrow ID_{M435C} \approx 0$. In summary so far, before equilibrium, the LTA ($ID_{M426C}$, $ID_{M427C}$)≈$ID_{M427C} \approx 0$ that is fed onto $CMA_{400C} \rightarrow ID_{M435C} \approx ID_{M437C} \approx 0$ at node 415C with $I_{407C}=i$, which in a current imbalance at node 415C initially, that is unsustainable→$CMA_{400C}$, contained within the $AMP_{400C}$ loop, lifts $V_{415C}$ enough until $ID_{M437C} \approx i = I_{407C} \rightarrow$'conditions of current equilibrium for nodes 414C and 415C' can be maintained when $(ID_{M416A} \approx ID_{M418A}) \approx (ID_{M417A} \approx ID_{M419A})$ and $ID_{M437C} \approx i = I_{407C}$, which occurs after $AMP_{400C}$ loop regulates $V_{415C}$ high enough→$ID_{M421C} \approx ID_{M427C} \approx i \approx ID_{M429C}$, while $MN_{432C}$ countinues to source current for an external load→$ID_{M420C} >> i \rightarrow ID_{M426C} \approx 2i \approx ID_{M428C} \approx ID_{430C} \rightarrow ID_{M428C} - ID_{M429C} \approx i$, which is fed onto $ID_{M431C} \approx i \approx ID_{M433C} \rightarrow$moving towards steady state, $ID_{M430C} - ID_{M433C} \approx i$, which is fed onto input of $CMA_{400C}$ that is $ID_{M435C} \approx i \approx ID_{M437C} \approx I_{407C} \approx i$ at node 415. In summary, note that since $M_{432C}$ is still sourcing current, while in equilibrium $ID_{M432C} > ID_{M439C} \rightarrow ID_{M420C} > ID_{M421C} \rightarrow ID_{M426C} > ID_{M427C} \rightarrow$at equilibrim LTA($ID_{M426C}$, $ID_{M427C}$)≈$ID_{M427C} \approx i$ which is fed onto $CMA_{400C}$ via $ID_{M435C} \approx i \approx ID_{M437C} \approx I_{407C} \approx i$. As such, when the buffer driver sources current for an output load, then $M_{439C}$ which is the inactive sink FET, can operate at a controlled regulated current $ID_{M439C} \approx k \times i$. Again, note that 'i' is a constant current source set by the main bias network of the amplifier, and 'k' is FET aspect ratio that is tightly controllable, which helps with the control of the quiescent current in the inactive sink FET.

In summary, when there is an imbalance between sink-source FETs currents, $ID_{M432C}$ and $ID_{M439C}$, such imbalance is scaled down, mirrored, and rectified by the complementary non-inverting current mirror ($CNICM_{400B}$). The outputs of $CNICM_{400C}$, $ID_{M427C}$ and $ID_{M426C}$, which are the rectified version of sink-source currents, are then fed onto the $LTA_{400C}$. The $LTA_{400C}$ effectively performs the equivalent function of selecting the (scaled) minimum current between the output drive currents $ID_{M432C}$ and $ID_{M439C}$. The selected minimum current, at the output of $LTA_{400C}$, is then inputted onto $CMA_{400C}$ which, together with the operations of amplifier's gain stage inside the $AMP_{400C}$ loop, regulates a minimum quiescent current in the inactive FET (e.g. for s=k, when $ID_{M439C}$ is sinking current for an external load→inactive source FET $ID_{M432C}=s \times i$, and when $ID_{M432C}$ is sourcing current for an external load→inactive sink FET $ID_{M439C}=k \times i$).

In conclusion, as noted in the previous section, the benefits of the FIG. 4B's $BUF_{400B}$ are equally applicable to that of FIG. 4C's $BUF_{400C}$ (comprising CNICM coupled with LTA coupled with CMA) which are briefly summarized here again. First, the function of 'monitoring', of sink-source currents, consumes current itself. Sink-source currents can be high and have unpredictable patterns. The CNICM effectively curbs (e.g., rectify) the 'monitoring' current consumption overhead. Also the rectifying of output FET currents, before they are fed to the LTA and CMA, helps with consistency of DC, AC, and transient performance of the buffer driver, with more independence from external load variations. Second, the buffer driver is fast since the CNICM couple with LTA coupled with CMA are all in principal operate in current mode, which is inherently fast. Third, it can operate with low power supply voltage since the minimum $V_{DD}$ is $V_{GS}+2V_{DS}$ (low voltage) for CNICM, LTA, and CMA. Fourth, it is made of a few transistor which makes it small and low cost. Fifth, buffer driver can operate with ultra low current and ult low power. The utilization of CNICM helps curb the current consumption attributed with monitoring the sink-source currents when the amplifier drives different external loads. Sixth, it has wide input-output span of near rail-to-rail. Seventh, it can provide high sink-source drive capability and controlled quiescent current in the inactive output FET that benefits DC and dynamic performance. FIG. 4F is a simulation of a buffer amplifier containing buffer driver of FIG. 4C coupled with gain stage of FIG. 4A. This simulations indicates approximate and typical sink-source current capability for the buffer amplifier to drive external load resistors 900KΩ, 300KΩ, and 30KΩ. The simulation indicates current consumption for the buffer amplifier of roughly 110 nA for FIG. 4C coupled with gain stage of FIG. 4A. Eighth, buffer driver is minimally imposing on the amplifier's gain or the speed of the preceding amplifier's high-gain stage. Ninth, it's based on standard CMOS process which is low cost, high quality, ready available). Tenth, the buffer driver arrangement utilizing CNICM coupled with LTA coupled with CMA can be tailored to very high current and very high speed.

Section (XV): Detailed Description of Buffer Driver (BUF) Comprised of Minimum Current Selector (MCS) and Inverting Current Mirror Amplifier (ICMA), Illustrated in FIG. 4D (4D)

FIG. 4D is a circuit schematic showing a buffer driver (e.g., inverting buffer diver), $BUF_{400D}$, comprising $MCS_{400D}$ coupled with $ICMA_{400D}$. This last section is started by summarizing the differentiation of the last 2 sections, that is equally applicable to this section's disclosure regarding buffer driver $MCS_{400D}$ coupled with $ICMA_{400D}$: (1) can operate at low power supply voltage, with $V_{DD}$ as low as $V_{GS}+2V_{DS}$, (2) principally operates in current mode which makes it fast and widens its dynamic range, (3) facilitates near rail-to-rail input-output operation, (4) it is simple and made of few transistors, making it inexpensive, (5) can sink and source large currents to heavy output loads, while keeping its internal current consumption ultra low (6) can control the inactive sink-source output FET current, and thus improve its DC and dynamic performance (7) can run at ultra-low currents, (8) impose minimal loading back into the preceding amplifier's high-impedance stage and as a result attain high-gain amplification, (9) impose minimal low frequency poles, that might otherwise burden the AC and transient response of the amplifier's gain stage, and as a result improve an amplifier's dynamic response (10) can be made using standard CMOS process which is inexpensive and high quality, and (11) the advantages of this teaching are not exclusive to ultra-low power, but this teaching can be tailored for buffer drivers that need very high-speed, very high drive current capability, and provide near rail-to-rail input-outputs, with low supply voltages as well.

While the buffer drivers sinks or source large currents for an external load, for continued proper performance including fast dynamic response, low cross over distortion, and low output impedance, buffer drivers generally run a minimum (well controlled) quiescent current in their inactive output FET drivers. In this embodiment, the $MCS_{400D}$ sense the $BUF_{400D}$'s output FET driver's ($M_{426D}$-$M_{431D}$) current signals and feed a proportional signal into $ICMA_{400D}$. While the output FET is sinking current, the $MCS_{400D}$ coupled with $ICMA_{400D}$, and in concert with $AMP_{400D}$ loop, regulate the minimum current in the (inactive) source output FET. Conversely, while the output FET is sourcing current, the $MCS_{400D}$ coupled with $ICMA_{400D}$, and in concert with $AMP_{400D}$ loop, regulate the minimum current in the (inactive) sink output FET.

Throughout the description of FIG. 4D, MOSFET scale factors (e.g., 's', 'k', or W/L ratios for $M_{421D}$-$M_{422D}$, $M_{424D}$, $M_{423D}$-$M_{425D}$, etc) and current source scale factors (e.g., for $I_{407D}$-$I_{408D}$) can be altered depending on cost-performance goals such as die size, current consumption, speed, and cross over distortion, and other goals. For the FIG. 4D disclosure, s=k=20 but 's', 'k' can have wide ranges $0.01 \leq s \leq 1000000$, $0.01 \leq k \leq 1000000$. The connections of the elements in FIG. 4D are described as follows. The body terminal of all NMOSFETs in FIG. 4D are connected to node 2 which is $V_{SS}$, and the body terminals of PMOSFETs are connected to node 1 which is $V_{DD}$. Bias current sources $I_{407D}$ and $I_{408D}$ have their upper terminals connected to node 1, which is $V_{DD}$. The source terminal of NMOSFETs $M_{421D}$, $M_{423D}$, $M_{425D}$, $M_{427D}$, $M_{429D}$, and $M_{431D}$, are connected to node 2 that is $V_{SS}$. The source terminal of PMOSFETs $M_{420D}$, $M_{422D}$, and $M_{426D}$ are connected to node 1 that is $V_{DD}$. Node 414D is the $vin1_{400D}$ terminal of the buffer driver, and is connected to the gate terminal of $M_{424D}$, the gate terminal of $M_{M426D}$, the drain terminal of $M_{429D}$, and the lower terminal of current source $I_{408D}$. Node 415D is the $vin2_{400D}$ terminal of the buffer driver, and is connected to the gate terminal of $M_{421D}$ and the gate terminal of $M_{431D}$. Node 416D is connected to the gate terminal of $M_{420D}$, the drain terminal of $M_{420D}$, the drain terminal of $M_{421D}$, and the gate terminal of $M_{422D}$. Node 417D is connected to the drain terminal of $M_{422D}$ and the source terminal of $M_{424D}$. Node 418D is connected to the drain terminal of $M_{424D}$, the gate terminal of $M_{423D}$, the drain terminal of $M_{423D}$, and the gate terminal of $M_{425D}$. Node 419D is connected to the drain terminal of $M_{425D}$, the gate terminal of $M_{427D}$, the drain terminal of $M_{427D}$, and the gate terminal of $M_{429D}$, and the lower terminal of current source $I_{407D}$. Node 420D is the $VO_{400D}$ terminal, which is the output of the buffer driver, and is connected to the drain terminal of $M_{426D}$ and the drain terminal of $M_{431D}$.

The buffer driver (e.g., inverting buffer driver) is comprised of $BLOCK_{400D}$ which is the output FETs, or $FET_{400D}$ (containing source PMOSFET $M_{426D}$ and sink NMOSFET $M_{431D}$), $BLOCK_{401D}$ which is the non-inverting current mirror amplifier or $ICMA_{400D}$ (containing NMOSFETs $M_{423D}$, $M_{425D}$, $M_{427D}$, $M_{429D}$, and current sources $I_{407D}$ and $I_{408D}$), and $BLOCK_{402D}$ which is the minimum current selector or $MCS_{400D}$ (containing NMOSFET $M_{421D}$, and PMOSFETs $M_{420D}$, $M_{422D}$, and $M_{424D}$). As stated earlier, $AMP_{400D}$ is comprised of amplifier gain stage of FIG. 4A coupled with $BUF_{400D}$, where node 414A is connected to node 414D, node 415A is connected to node 415D. $AMP_{400D}$ is configured in unity gain with node 412A (the amplifier gain stage negative input terminal) connected to node 420D (or $VO_{400D}$)

Note that it would be obvious for one skilled in the art to utilize a ICMA that is complementary version of $ICMA_{400D}$ (i.e., PMOSFET based or NMOSFET based). It would also be obvious for one skilled in the art to utilize an ICMA that is a complementary version of $MCS_{400D}$ (i.e., PMOSFET base or NMOSFETs based). Additionally, it would be obvious for one skilled in the art that plurality of ICMAs coupled with plurality of MCSs can be utilized, which are complementary to one another (e.g., NMSOFET based ICMA coupled with primarily PMOSFET based MCS, utilized along with PMSOFET based ICMA coupled with primarily NMOSFET based MCS). Moreover, it would be obvious for one skilled in the art to design a buffer driver that utilizes other equivalent functional implementations that are minimum current selector (MCS) or non-inverting current mirror amplifier (ICMA). For example, a loser take all (LTA) can perform the equivalent function of MCS. Another example would be to utilize, a current mirror amplifier (CMA) instead of an inverting current mirror amplifier (ICMA) by arranging the circuit signal signs. Another example would be to utilize a current amplifier to perform the equivalent function of a ICMA.

Describing the details of the circuit in FIG. 4D is as follows, setting aside the non-idealities (e.g., mismatches, offsets). Let's first briefly describe the operation of minimum current selector ($MCS_{400D}$), in the boundary conditions (with inputs near the rails), independent of the $ICMA_{400D}$ for now. The drain currents $ID_{M421D}$ and $ID_{M424D}$ track the currents in $FET_{400D}$, which are $M_{431D}$ (sink NMOSFET) and $M_{426D}$ (source PMOSFET), respectively. The output of $MCS_{400D}$ is $ID_{424D}$. The function of $MCS_{400D}$ is to select the $min(ID_{M421D}, ID_{M424D})$. When $vin1_{400D}$ and $vin2_{400D}$ are both up near $V_{DD}$, then $M_{421D}$ (tracking $M_{431D}$) is hard on and $M_{424D}$ (tracking $M_{426D}$) is off or nearly off. Here, $ID_{M421D} \gg i$ and $ID_{M424D} \ll i$. Excluding role of $ICMA_{400D}$ for now, if $vin1_{400D} \approx vin2_{400D}$ both voltages are near $V_{DD} \rightarrow MCS_{400D}$ operates and selects the $min(ID_{M421D}, ID_{M424D}) \approx ID_{M424D} \ll i$. Conversely, when $vin1_{400D} \approx vin2_{400D}$ both voltages are near $V_{SS}$, then $M_{421D}$ (tracking $M_{431D}$) is off or near off and gate terminal of $M_{424D}$ (tracking $M_{426D}$) tends to turn it hard on, but $M_{424D}$ is deprived of current since $M_{422D}$ is off and blocking any current flow. Here, $ID_{M421D} \approx ID_{M420D} \approx ID_{M422D} \ll i$. Again, excluding role of $ICMA_{400D}$ for now, if $vin1_{400D} \approx vin2_{400D}$ both voltages are near $V_{SS} \rightarrow MCS_{400D}$ operates and selects the $min(ID_{M421D}, ID_{M424D}) \approx ID_{M421D} \ll i$.

Before describing the $BUF_{400D}$ operating in over drive (sink-source modes) and steady state conditions, there is described the current equilibrium conditions at nodes 414 and 415 for steady state to hold. At node 414D in FIG. 4D (which is connected to node 414A in FIG. 4A), KCL requires the sum of $ID_{M418A}$, $ID_{M419A}$, $ID_{408D}$, and $ID_{M429D}$ to converge to zero for steady state. At node 415D in FIG. 4D (which is connected to node 415A in FIG. 4A), KCL requires the sum of $ID_{M416A}$, and $ID_{M417A}$ to converge to zero for steady state. For $AMP_{400}$ unity gain loop (containing the amplifier gain stage of FIG. 4A and $BUF_{400D}$ of FIG. 4D) to hold in steady state, $(ID_{M417A} \approx ID_{M419A}) \approx (ID_{M416A} \approx ID_{M418A})$ and $I_{408D} \approx ID_{M429D}$. This condition will be called "the conditions of current equilibrium for nodes 414D and 415D" in this section, which will be referred to later.

In the sink mode, when node 414D and node 415D are pulled up towards $V_{DD}$, $MN_{431D}$ (i.e., sinking current for the external load) and $MN_{421D}$ are turned on hard that cause $ID_{M421D} \approx ID_{M420D} \approx ID_{M422D} >> i$. Here, $M_{426D}$ and $M_{424D}$ turn off (initially) and $ID_{M424D} << i$, which would block $ID_{M422D}$. Thus, the output current of $MCS_{400D}$ selects the $min(ID_{M421D}, ID_{M424D})=ID_{M424D} << i$, which flows onto $M_{423D}$, and initially$\rightarrow ID_{M423D}=ID_{M425D} << i \rightarrow$ all of $I_{407D}=2i$ flows into $M_{427D} \rightarrow ID_{M427D} \approx ID_{M429D}=2i$. For "conditions of current equilibrium for nodes 414D and 415D" to hold, node 414D gets regulated by being pulled down in part by $ID_{M429D}$, that is initially before equilibrium runs at '2i', until $I_{408D}=i \approx ID_{M429D}$. In summary, in order for this current equilibrium to persist, $ICMA_{400D}$ contained within $AMP_{400D}$ loop regulate node 414D by lowering node 414D voltage sufficiently enough, which is when $I_{408D}=i \approx ID_{M429D} \rightarrow ID_{M424D} \approx ID_{M423D} \approx ID_{M425D} \approx ID_{M427D} \approx ID_{M429D} \approx i \approx (1/s) \times ID_{M426D}$. As such, for $BUF_{400D}$ in current 'sink mode' when $ID_{M431D} >> ID_{M426D}$, the inactive source FET, $M_{426D}$, is regulated to run at a controlled current $ID_{426D} \approx s \times i$. Note that 'i' is a constant current source set by the main bias network of the amplifier, and 's' is FET aspect ratio that is tightly controllable.

Conversely, in the source mode, when node 414D and 415D of FIG. 4D are pulled down towards $V_{SS}$, and $M_{426D}$ is turned on hard, where initially $M_{431D}$, $M_{421D}$, $M_{420D}$, and $M_{422D}$ are turned off or are near off. Although, gate terminal voltage of $M_{424D}$ is pushed down towards $V_{SS}$, but $M_{422D}$ being initially off or near off, starves $M_{424D}$. As such, $MCS_{400D}$ initially selects the $min(ID_{M421D}, ID_{M424D})=ID_{M421D} << i$, that flows through $M_{424D}$ and onto $M_{M423D}$, which is the input $ICMA_{400D}$. As such, before equilibrium, $ID_{M421D} \approx ID_{M420D} \approx ID_{M422D} \approx ID_{M424D} \approx M_{M423D} \approx ID_{M425D} << i \rightarrow$ all of $I_{407D}=2i$ would initially flow through $M_{427D} \rightarrow ID_{M427D} \approx ID_{M429D} \approx 2i > I_{408D} \rightarrow$ creates a current imbalance at node 414B that is unsustainable$\rightarrow AMP_{400D}$ loop kicks in to regulate back towards current equilibrium. In order for "conditions of current equilibrium for nodes 414D and 415D" to return and hold, and to simplify the explanation for clarity of description, in FIG. 4A ($ID_{M416A} \approx ID_{M418A}$) can get very slightly increased initially above ($ID_{M417A} \approx ID_{M419A}$) in FIG. 4A. Here, by $AMP_{400D}$ loop regulation, the voltages at both node 414D and node 415D are both initially pulled up until $M_{421D}$ (and its mirrors $M_{431D}$) turn back on sufficiently enough for $ID_{M421D} \approx i$, which brings current equilibrium. Note in FIG. 4A that despite the very slight increase in ($ID_{M416A} \approx ID_{M418A}$) over ($ID_{M417A} \approx ID_{M419A}$) at node 414D, $ICMA_{400D}$ (coupled and fed via $MCS_{400D}$) have enough gain to regulate a slightly increased $ID_{M429A}$ (compared to the fixed $I_{408D} \approx i$) to keep the voltage at node 414D low enough so that $M_{426D}$ can continue sourcing current to the external load. The only draw-back here shows up in $AMP_{400}$ DC (steady state) gain reduction as the sink-source currents for an external load is increased (i.e., the smaller the resistive load, the smaller the $AMP_{400}$ gain, which is not uncommon in inverting buffer drivers). Here, the "conditions of current equilibrium for nodes 414D and 415D" are held, and steady state conditions maintained, while $M_{426D}$ to continues sourcing current. Just to capture the current balance and steady state conditions here, note that with $ID_{M426D} >> ID_{M431D} \rightarrow ID_{M424D} >> ID_{M421D} \rightarrow min(ID_{M421D}, ID_{M424D})=ID_{M421D} \approx i \rightarrow$ operating current in the inactive sink-FET, that is mirrored with $M_{421D}$, is controlled and regulated at $ID_{M431D} \approx k \times i$, while steady state condition hold and the source FET, $M_{426D}$, continues sourcing extra current to an external load.

Again, ignoring non-idealities, here the mechanism for the $BUF_{400D}$ operating in steady state is described, when there is no output load. At steady state conditions, $I_{408D} \approx ID_{M429D}$ at node 414D in FIG. 4D, as well as in FIG. 4A where $ID_{M418A} \approx ID_{M419A}$ at node 414A and $ID_{M416A} \approx ID_{M417A}$ at node 415A, and $ID_{M418A} \approx ID_{M416A} \approx ID_{M419A} \approx ID_{M417A}$. In steady state, the current output of the $MCS_{400D}$ selects the min ($ID_{M421D}, ID_{M424D})=ID_{M421A} \approx ID_{M424A} \approx i \rightarrow I_{408D} \approx ID_{M429D} \approx ID_{M427D} \approx ID_{M425D} \approx ID_{M423D} \approx i \approx ID_{M424D}$. For clarification, note that the $MCS_{400D}$ is arranged as a trans-linear circuit. Here, the $VG_{M420D} \approx VG_{M424D}$ (relative to $V_{DD}$). When $M_{420D}$ that has a W/L=1× and is in parallel with the series association of $M_{424D}$-$M_{422D}$, each with W/L=2x$\rightarrow ID_{M424D} \approx ID_{M422D} \approx i \approx ID_{M420} \approx ID_{M421}$. Note that $VGS_{M420D} \approx VGS_{M426D}$ and $VGS_{M421D} \approx VGS_{M431D}$. As such, by setting $FET_{400D}$ scale factors k=s, the (inverting) output FETs currents, in the buffers driver, operate with a controlled quiescent current of $ID_{M431D} \approx ID_{M426D} \approx s \times i$ while in steady state.

In summary, a near rail-to-rail input-output (i.e., inverting) buffer driver is proposed utilizing a novel current mode output stage comprising of minimum current selectors (MCS) and non-inverting current mirror amplifiers (ICMA) which are fast and operate at low $V_{DD}$. The preceding gain amplifier stage high-impedance high-gain node, dominates in setting the AC and transient response, with minimal speed degradation caused by the fast buffer driver. Such is the case in part because of the (inverting) buffer driver wide bandwidth since it operates chiefly in current mode makes its fast inherently. The (inverting) buffer driver is based on the main-stream, standard, low cost, and rugged standard digital CMOS manufacturing platform.

In conclusion, the benefits of the FIG. 4D's $BUF_{400D}$ comprising $MCS_{400D}$ and $ICMA_{400D}$ include the following. First, the (inverting) buffer driver can work with minimum $V_{DD}$ of $V_{GS}+2V_{DS}$ (low voltage). Second, it principally operates in current mode which makes it inherently fast. Third, it is simple and made of a few transistor which makes it small, low cost, and higher quality. Fourth, it can run at ultra low currents, which makes its power consumption ultra-low when combined with its ability to perform to specifications with low power supply voltage. Fifth, it can sink and source significantly higher currents (compared with its own steady-state operating current) for an external load, and have regulated and controlled quiescent current in its inactive output FET which helps with the (inverting) buffer drivers performance, including more consistent DC and dynamic response, amongst other. FIG. 4G is a simulation of a buffer amplifier containing buffer driver of FIG. 4D coupled with gain stage of FIG. 4A. This simulations indicates approximate and typical sink-source current capability for the buffer amplifier to drive external load resistors 900KΩ, 300KΩ, and 30KΩ. The simulation indicates current consumption for the buffer amplifier of roughly 120 nA for FIG. 4D coupled with gain stage of FIG. 4A. Sixth, the MCS that monitors the output FET's (BLOCK-400D) operates in current mode. Also, the ICMA, while running chiefly in current mode, regulates the operating currents in the output (inactive) FETs. Running MCS and ICMA chiefly in current mode enables them to be inherently fast, but additionally, processing signals in current mode reduces internal voltage swings that helps with operating at lower voltages, which widens the input-output voltage span closer to the rails. This is beneficial to low power supply environments where there little signal to noise cushion available to waste for overhead at input or output terminals. Seventh, while utilization of current mirror inverter lowers the input impedance at the internal inputs of ICMA that help with faster signal processing speeds within ICMA. Moreover, the ICMA has a high output impedance that, when connected to an amplifier's gain stage, it neither substantially loads the amplifier's high impedance node nor does it dynamically slow the amplifier. Eighth, (inverting) buffer driver needs no special process and can be manufactured on rugged and time tested main-stream CMOS process that is inexpensive, readily available at many foundries, and with high quality. Ninth, this teaching can be tailored for (inverting) buffer drivers that need very high-speed, very high current drive capability, and near rail-to-rail input-outputs with low supply voltages s as well (i.e., can be very high current and very high speed).

The definitions of the words or elements of the claims shall include not only the combination of elements which are literally set forth, but all equivalent structure, material or acts for performing substantially the same function in substantially the same way to obtain substantially the same result.

All references, including publications, patent applications, patents and website content cited herein are hereby incorporated by reference to the same extent as if each reference were individually and specifically indicated to be incorporated by reference and was set forth in its entirety herein.

The words used in this specification to describe the invention and its various embodiments are to be understood not only in the sense of their commonly defined meanings, but to include by special definition in this specification any structure, material or acts beyond the scope of the commonly defined meanings. Thus if an element can be understood in the context of this specification as including more than one meaning, then its use in a claim must be understood as being generic to all possible meanings supported by the specification and by the word itself.

Recitation of ranges of values herein are merely intended to serve as a shorthand method of referring individually to each separate value falling within the range, unless otherwise indicated herein, and each separate value is incorporated into the specification as if it were individually recited herein. Therefore, any given numerical range shall include whole and fractions of numbers within the range. For example, the range "1 to 10" shall be interpreted to specifically include whole numbers between 1 and 10 (e.g., 1, 2, 3, . . . 9) and non-whole numbers (e.g., 1.1, 1.2, . . . 1.9).

Neither the Title (set forth at the beginning of the first page of the present application) nor the Abstract (set forth at the end of the present application) is to be taken as limiting in any way as the scope of the disclosed invention(s). The title of the present application and headings of sections provided in the present application are for convenience only, and are not to be taken as limiting the disclosure in any way.

The invention claimed is:

1. A method of arranging an ultra low power Buffer Amplifier (BA), containing an Amplifier (A) coupled with a Buffer Driver (BD), comprising:

increasing gain and widening the input-output voltage span of the Amplifier (A) utilizing a plurality of regulated cascode (RGC) current mirrors (RGC-CM) where each RGC-CM is made of at least one of the following three circuits: 1) a diode connected self cascode (DCSC) coupled with a common source amplifier (CSA); 2) a current mirror amplifier (CMA) that contains a common source amplifier (CSA); and 3) a CSA coupled with one common gate amplifier (CGA) wherein the common gate terminal of the CGA is connected to the common source terminal of the CSA;

lowering the minimum operating power supply and reducing offset of the Amplifier (A) by utilizing a current equalizer circuit that emulates the function of a floating current source (FCS) having at least two complementary cascode current sources made of field effect transistors (FETs), wherein the middle cascoded FET's gate to source voltages (VGS) are held constant by regulating the VGS of the upper and lower FETs wherein the source terminals of the said upper and lower FETs are connected to the power supplies, and the upper and lower FET currents are equalized and mirrored into the Amplifier's (A) bias network;

lowering output noise of the Amplifier(A), by narrow banding the Amplifier(A)'s high gain node, while concurrently rejuvenating the narrow banded Amplifier(A)'s speed by utilizing one of the following circuits: 1) minimum current select (MCS); and 2) loser take all (LTA) circuits to generate dynamically boosted operating current when the Amplifier(A)'s inputs are intermittently imbalanced; and lowering the minimum operating power supply, having near rail-to-rail input output voltage span, having high-speed, providing large sink-source current for output load, while regulating the operating current in the inactive sink-source transistor of the Buffer Amplifier (BA) by utilizing a buffer driver (BD) that contains at least one of the following circuits: 1) MCS; 2) LTA; 3) current mirror amplification (CMA); and 4) complementary current mirror that enable the Buffer Driver (BD) to chiefly operate and process signals in current mode.

* * * * *